(12) United States Patent
Yallamaraju et al.

(10) Patent No.: US 11,881,862 B2
(45) Date of Patent: Jan. 23, 2024

(54) MITIGATION OF DUTY-CYCLE DISTORTION

(71) Applicant: QUALCOMM Incorporated, San Diego, CA (US)

(72) Inventors: Udayakiran Kumar Yallamaraju, Bangalore (IN); Xia Li, San Diego, CA (US); Pankaj Deshmukh, San Diego, CA (US); Vajram Ghantasala, San Jose, CA (US); Bin Yang, San Diego, CA (US); Vishal Mishra, Bangalore (IN); Bharatheesha Sudarshan Jagirdar, San Diego, CA (US); Arun Sundaresan Iyer, Bangalore (IN); Amod Phadke, Bangalore (IN); Vanamali Bhat, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 145 days.

(21) Appl. No.: 17/404,919

(22) Filed: Aug. 17, 2021

(65) Prior Publication Data
US 2023/0058318 A1    Feb. 23, 2023

(51) Int. Cl.
| | |
|---|---|
| H03K 5/156 | (2006.01) |
| H03K 5/134 | (2014.01) |
| H03K 19/20 | (2006.01) |
| H03K 5/00 | (2006.01) |

(52) U.S. Cl.
CPC .......... *H03K 5/1565* (2013.01); *H03K 5/134* (2014.07); *H03K 19/20* (2013.01); *H03K 2005/00195* (2013.01)

(58) Field of Classification Search
None
See application file for complete search history.

(56) References Cited

U.S. PATENT DOCUMENTS

| | | | |
|---|---|---|---|
| 9,589,627 B1 * | 3/2017 | Wilson | G11C 11/4074 |
| 10,110,229 B1 | 10/2018 | Lau | |
| 11,689,203 B1 * | 6/2023 | Oruganti | H03K 5/1506 326/93 |
| 2013/0002297 A1 | 1/2013 | Jain et al. | |
| 2023/0038670 A1 * | 2/2023 | Narasimhan | G06F 1/10 |

OTHER PUBLICATIONS

International Search Report and Written Opinion—PCT/US2022/039303—ISA/EPO—dated Nov. 24, 2022.

* cited by examiner

*Primary Examiner* — Cassandra F Cox
(74) *Attorney, Agent, or Firm* — Loza & Loza, LLP

(57) ABSTRACT

A system includes a first park circuit having a signal input, an output, and a control input. The system also includes a first signal path having an input and an output, wherein the input of the first signal path is coupled to the output of the first park circuit. The system also includes a second park circuit having a signal input, an output, and a control input, wherein the signal input of the second park circuit is coupled to the output of the first signal path. The system further includes a second signal path having an input and an output, wherein the input of the second signal path is coupled to the output of the second park circuit.

39 Claims, 33 Drawing Sheets

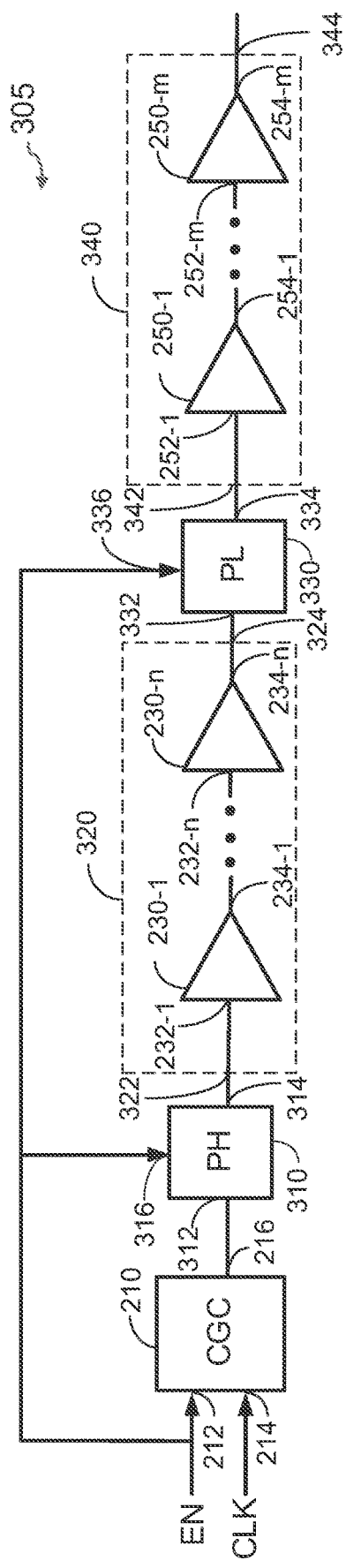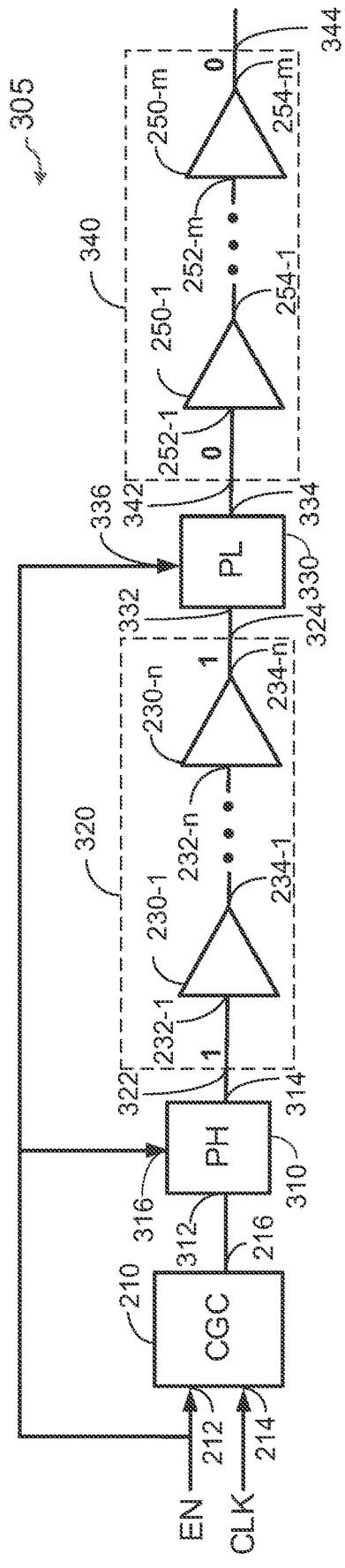

MITIGATION OF DUTY-CYCLE DISTORTION

BACKGROUND

Field

Aspects of the present disclosure relate generally to duty-cycle distortion, and, more particularly, to mitigation of duty-cycle distortion.

Background

A circuit may suffer from aging effects such as bias temperature instability (BTI), which can degrade the performance of the circuit over time. For example, BTI stress in a signal path (e.g., clock path) of the circuit during idle mode can cause duty-cycle distortion in the signal path over time, which can lead to timing issues (e.g., timing violations) in the circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a first park circuit having a signal input, an output, and a control input. The system also includes a first signal path having an input and an output, wherein the input of the first signal path is coupled to the output of the first park circuit. The system also includes a second park circuit having a signal input, an output, and a control input, wherein the signal input of the second park circuit is coupled to the output of the first signal path. The system further includes a second signal path having an input and an output, wherein the input of the second signal path is coupled to the output of the second park circuit.

A second aspect relates to a method for mitigating duty-cycle distortion in a system. The system includes a first signal path and a second signal path. The method includes, in an active mode, sending a clock signal from a clock source to a circuit via the first signal path and the second signal path. The method also includes in an idle mode, parking an input of the first signal path at a first logic state, and parking an input of the second signal path at a second logic state.

BRIEF DESCRIPTION OF THE DRAWINGS

FIG. 3A shows an example of signal paths with duty-cycle distortion mitigation according to certain aspects of the present disclosure.

FIG. 3B shows an example of logic states at the signal paths in an idle mode according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Aging effects such as bias temperature instability (BTI) can degrade the performance of a circuit over time. For example, BTI stress in a signal path (e.g., clock path) of the circuit during idle mode can cause duty-cycle distortion in the signal path over time, which can lead to timing issues (e.g., timing violations) in the circuit. In one example, the signal path may include a fast clock path with tight timing margin(s) (e.g., setup time and/or hold time) and may be more susceptible to timing violations due to the duty-cycle distortion. In this example, the fast clock path may carry a fast clock signal running at a higher frequency than other clock signals in the system.

Figure 1A:
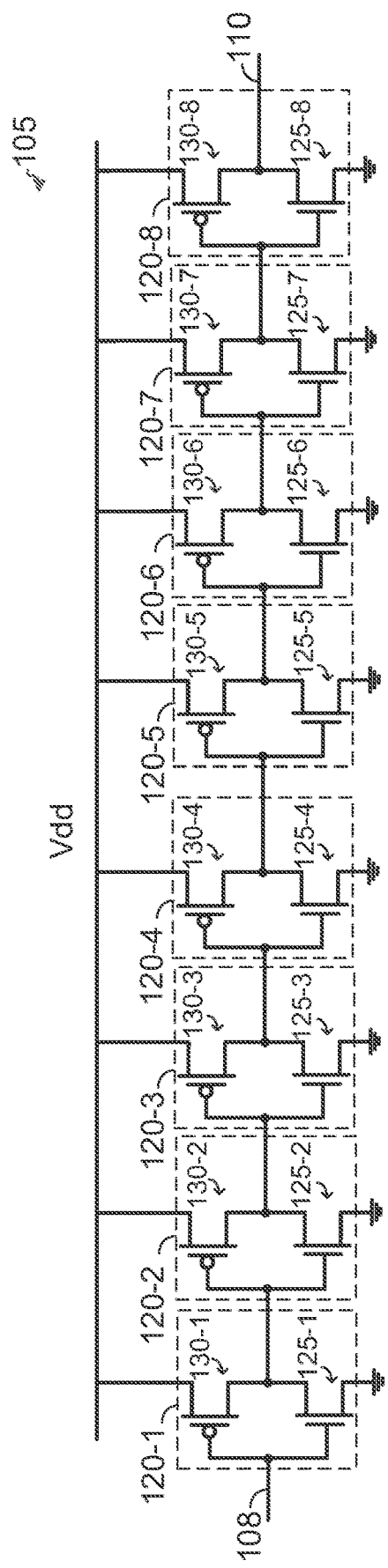
FIG. 1A shows an example of a signal path including delay buffers according to certain aspects of the present disclosure.

An example of BTI stress induced duty-cycle distortion will now be discussed with reference to FIGS. 1A to 1E. FIG. 1A shows an example of a signal path 105 including multiple delay buffers 120-1 to 120-8 coupled in series. For example, the signal path 105 may be a clock path configured to distribute a timing signal, such as a clock signal, from a clock source to one or more circuits.

In the example shown in FIG. 1A, each of the delay buffers 120-1 to 120-8 is implemented with a respective complementary inverter including a first respective transistor 125-1 to 125-8 (e.g., n-type field effect transistor (NFET)) and a second respective transistor 130-1 to 130-8 (e.g., p-type field effect transistor (PFET)). However, it is to be appreciated that each of the delay buffers 120-1 to 120-8 may be implemented with another type of circuit or logic gate.

For the example where the signal path 105 is a clock path, a clock gating circuit (not shown) may be coupled between the clock source and the input 108 of the signal path 105. In this example, the clock gating circuit may be configured to pass (i.e., un-gate) the clock signal in an active mode and to gate the clock signal (i.e., block the clock signal) in an idle mode.

Figure 1B:
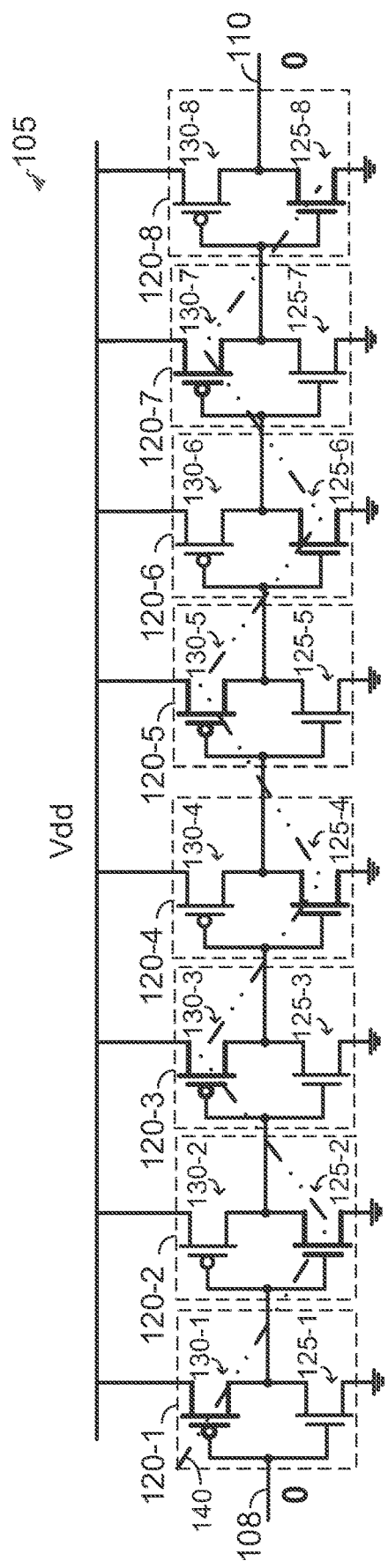
FIG. 1B shows an example in which an input of the signal path is parked low in an idle mode according to certain aspects of the present disclosure.

FIG. 1B shows an example in which the input 108 of the signal path is parked low (i.e., logic zero) in the idle mode. FIG. 1B also shows the logic state at the output 110 of the signal path 105, which is low (i.e., logic zero) in this example. In this example, transistors 130-1, 125-2, 130-3, 125-4, 130-5, 125-6, 130-7, and 125-8 are turned on in the idle mode and transistors 125-1, 130-2, 125-3, 130-4, 125-5, 130-6, 125-7, and 130-8 are turned off in the idle mode. FIG. 1B shows an aging path 140 passing through the transistors 130-1, 125-2, 130-3, 125-4, 130-5, 125-6, 130-7, and 125-8 that are turned on in the idle mode. As used here, an "aging path" is a path passing through transistors that are turned on in an idle mode. The transistors 130-1, 125-2, 130-3, 125-4, 130-5, 125-6, 130-7, and 125-8 that are turned on in the idle mode are stressed in the idle, which causes the transistors 130-1, 125-2, 130-3, 125-4, 130-5, 125-6, 130-7, and 125-8 to age more than the transistors 125-1, 130-2, 125-3, 130-4, 125-5, 130-6, 125-7, and 130-8 that are turned off in the idle mode. Thus, the aging is different between the transistors 130-1, 125-2, 130-3, 125-4, 130-5, 125-6, 130-7, and 125-8 that are stressed in the idle mode and the transistors 125-1, 130-2, 125-3, 130-4, 125-5, 130-6, 125-7, and 130-8, which results in asymmetric BTI aging in the signal path 105.

In this example, the asymmetric aging shifts the threshold voltages of the transistors 130-1, 125-2, 130-3, 125-4, 130-5, 125-6, 130-7, and 125-8, which causes the falling edge delay at the output 110 of the signal path 105 to increase relative to the rising edge delay at the output 110 of the signal path 105. This is because a falling edge propagates to the output 110 of the signal path 105 via the aging path 140 (i.e., the transistors 130-1, 125-2, 130-3, 125-4, 130-5, 125-6, 130-7, and 125-8 in the aging path 140 turn on to propagate the falling edge to the output 110), while a rising edge does not propagate to the output 110 of the signal path 105 via the aging path 140. The increase in the falling edge delay relative to the rising edge delay causes a duty-cycle distortion in the signal path 105.

Figure 1C:
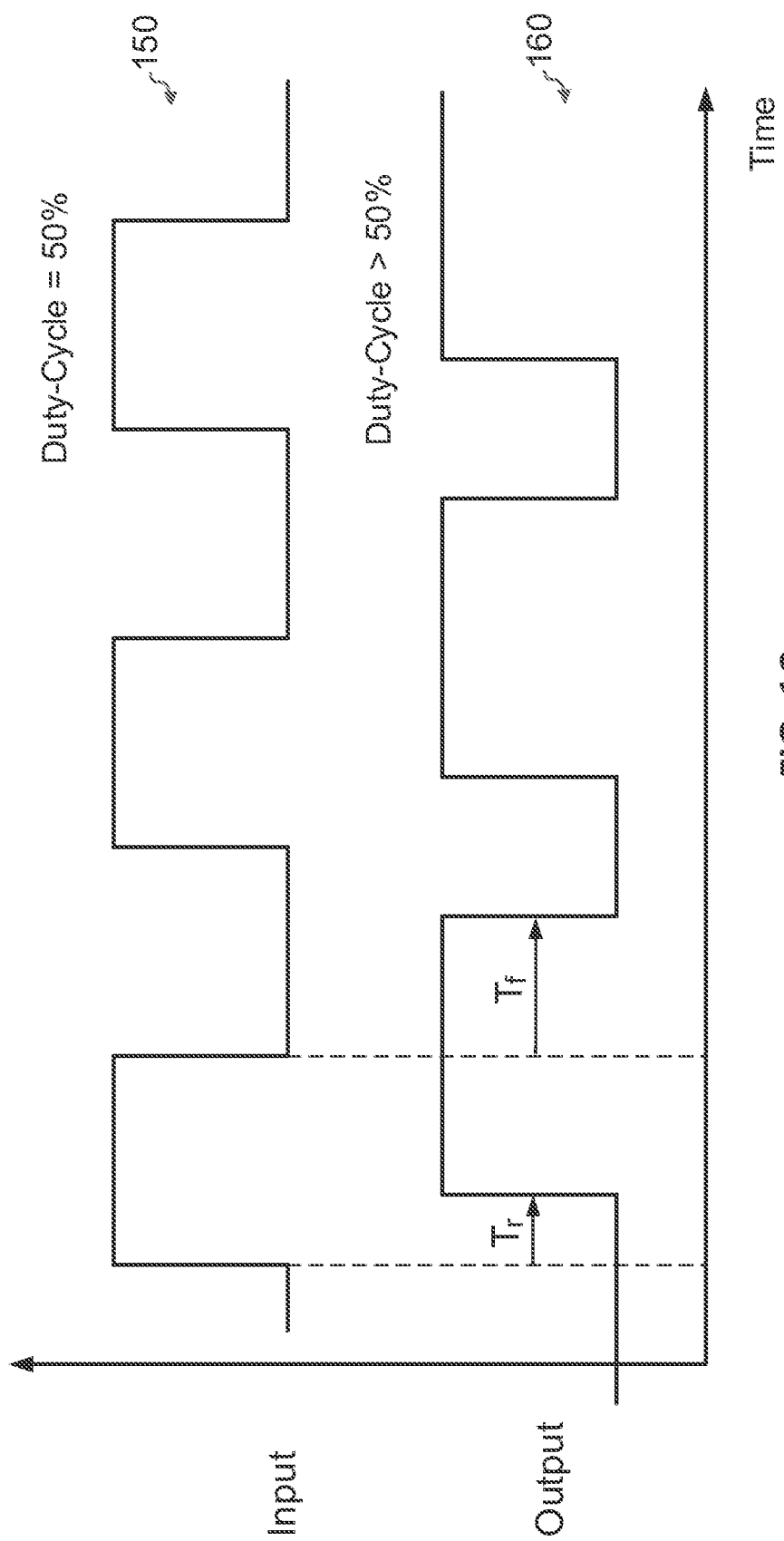
FIG. 1C illustrates an example of duty-cycle distortion in the signal path due to asymmetric aging according to certain aspects of the present disclosure.

An example of the duty-cycle distortion is illustrated in the timing diagram shown in FIG. 1C. In the example shown in FIG. 1C, a clock signal 150 is input to the input 108 of the signal path 105 (e.g., clock path) in the active mode. In this example, the clock signal 150 at the input 108 of the signal path has a 50% duty cycle. FIG. 1C also shows the clock signal 160 at the output 110 of the signal path 105 after the clock signal 150 has propagated through the signal path 105. The signal path 105 delays a rising edge of the clock signal 160 by delay $T_r$ at the output 110 and delays a falling edge of the clock signal 160 by delay Tf at the output 110. As shown in FIG. 1C, the delay Tf of the falling edge is longer than the delay $T_r$ of the rising edge due to the asymmetric aging of the transistors in the signal path 105 discussed above. This is because the falling edge propagates to the output 110 via the aging path 140 while the rising edge does not propagate to the output 110 via the aging path 140. The longer delay of the falling edge causes the duty cycle of the clock signal 160 at the output 110 to increase (i.e., results in a duty cycle greater than 50% at the output 110). Thus, in this example, the duty-cycle distortion due to asymmetric aging increases the duty cycle of the clock signal.

Figure 1D:
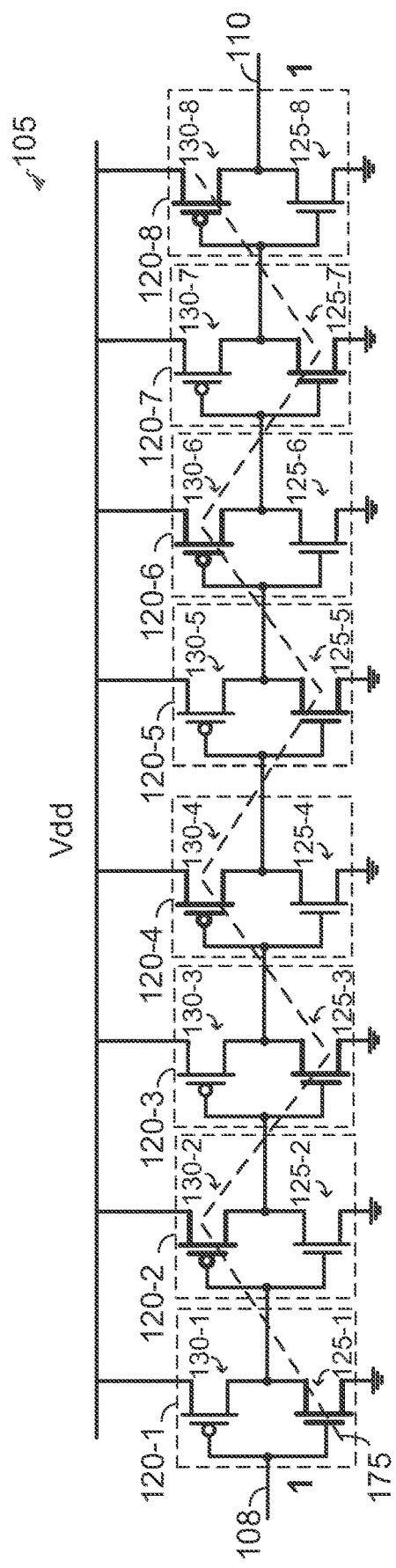
FIG. 1D shows an example in which the input of the signal path is parked high in the idle mode according to certain aspects of the present disclosure.

Asymmetric aging also occurs for the case where the input 108 of the signal path 105 is parked high in the idle mode. In this regard, FIG. 1D shows an example in which the input 108 is parked high (i.e., logic one) in the idle mode. FIG. 1D also shows the logic state at the output 110 of the signal path 105, which is high (i.e., logic one) in this example. In this example, transistors 125-1, 130-2, 125-3, 130-4, 125-5, 130-6, 125-7, and 130-8 are turned on in the idle mode and transistors 130-1, 125-2, 130-3, 125-4, 130-5, 125-6, 130-7, and 125-8 are turned off in the idle mode. FIG. 1D shows an aging path 175 passing through the transistors 125-1, 130-2, 125-3, 130-4, 125-5, 130-6, 125-7, and 130-8 that are turned on in the idle mode. The aging path 175 is the inverse of the aging path 140 shown in FIG. 1B (i.e., the aging path 175 is obtained by flipping the aging path 140). The transistors 125-1, 130-2, 125-3, 130-4, 125-5, 130-6, 125-7, and 130-8 that are turned on in the idle mode are stressed, which causes the transistors 125-1, 130-2, 125-3, 130-4, 125-5, 130-6, 125-7, and 130-8 to age more than the transistors 130-1, 125-2, 130-3, 125-4, 130-5, 125-6, 130-7, and 125-8 that are turned off in the idle mode. Thus, the aging is different between the transistors 125-1, 130-2, 125-3, 130-4, 125-5, 130-6, 125-7, and 130-8 that are stressed in the idle mode and the transistors 130-1, 125-2, 130-3, 125-4, 130-5, 125-6, 130-7, and 125-8, which results in asymmetric BTI aging in the signal path 105.

In this example, the asymmetric aging shifts the threshold voltages of the transistors 125-1, 130-2, 125-3, 130-4, 125-5, 130-6, 125-7, and 130-8, which causes the rising edge delay at the output 110 of the signal path 105 to increase relative to the falling edge delay at the output 110 of the signal path 105. This is because a rising edge propagates to the output 110 of the signal path 105 via the aging path 175 (i.e., the transistors 125-1, 130-2, 125-3, 130-4, 125-5, 130-6, 125-7, and 130-8 in the aging path 175 turn on to propagate the rising edge to the output 110), while a falling edge does not propagate to the output 110 of the signal path 105 via the aging path 175. The increase in the rising edge delay relative to the falling edge delay causes duty-cycle distortion in the signal path 105.

Figure 1E:
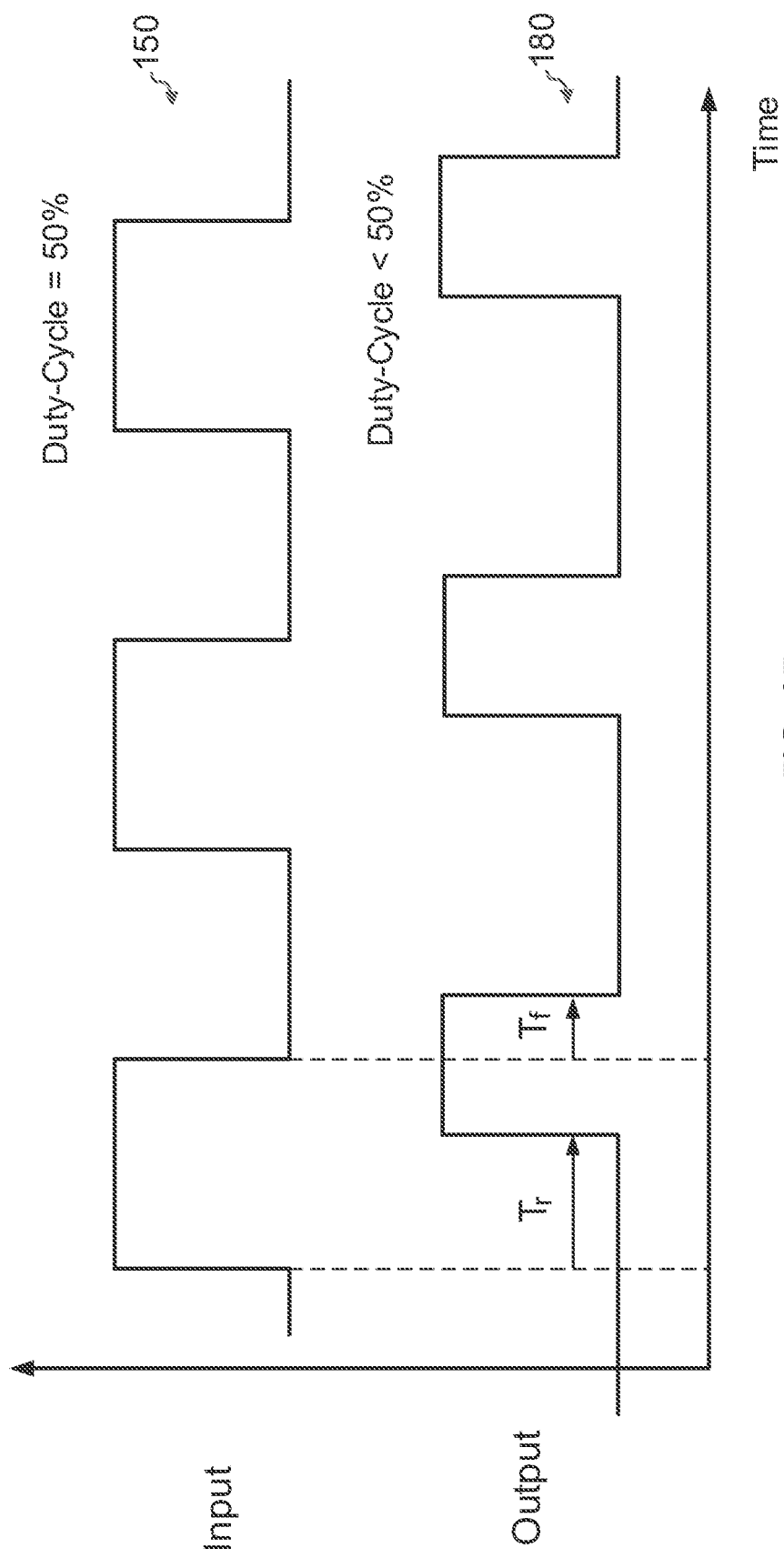
FIG. 1E illustrates another example of duty cycle distortion in the signal path due to asymmetric aging according to certain aspects of the present disclosure.

An example of the duty-cycle distortion is illustrated in the timing diagram shown in FIG. 1E. In the example shown in FIG. 1E, the clock signal 150 is input to the input 108 of the signal path 105 in the active mode. In this example, the clock signal 150 at the input 108 has a 50% duty cycle. FIG. 1E also shows the clock signal 180 at the output 110 of the signal path 105 after the clock signal 150 has propagated through the signal path 105. The signal path 105 delays a rising edge of the clock signal 180 by delay $T_r$ and delays a falling edge of the clock signal 180 by delay Tf at the output 110. As shown in FIG. 1E, the delay $T_r$ of the rising edge is longer than the delay Tf of the falling edge due to the asymmetric aging of the transistors in the signal path 105 discussed above. This is because the rising edge propagates to the output 110 via the aging path 175 while the falling edge does not propagate to the output 110 via the aging path 175. The longer delay of the rising edge causes the duty cycle of the clock signal 180 at the output 110 to decrease (i.e., results in a duty cycle less than 50% at the output 110). Thus, in this example, the duty-cycle distortion due to asymmetric aging decreases the duty cycle of the clock signal.

Therefore, asymmetric aging in the idle mode causes duty-cycle distortion over time. The duty-cycle distortion either increases or decreases the duty cycle depending on whether the input 108 of the signal path 105 is parked low or high in the idle mode. In the example illustrated in FIGS. 1B to 1E, parking the input 108 low increases the duty cycle and parking the input 108 high decreases the duty cycle. This is because the aging path 140 for the park low case and the aging path 175 for the park high case are the inverse of each other (i.e., the transistors 130-1, 125-2, 130-3, 125-4, 130-5, 125-6, 130-7, and 125-8 that are turned on in the park low case are turned off in the park high case, and the transistors 125-1, 130-2, 125-3, 130-4, 125-5, 130-6, 125-7, and 130-8 that are turned on in the park high case are turned off in the park low case). As a result, the aging path 140 for the park low case and the aging path 175 for the park high case move the duty cycle in opposite directions.

Figure 2A:
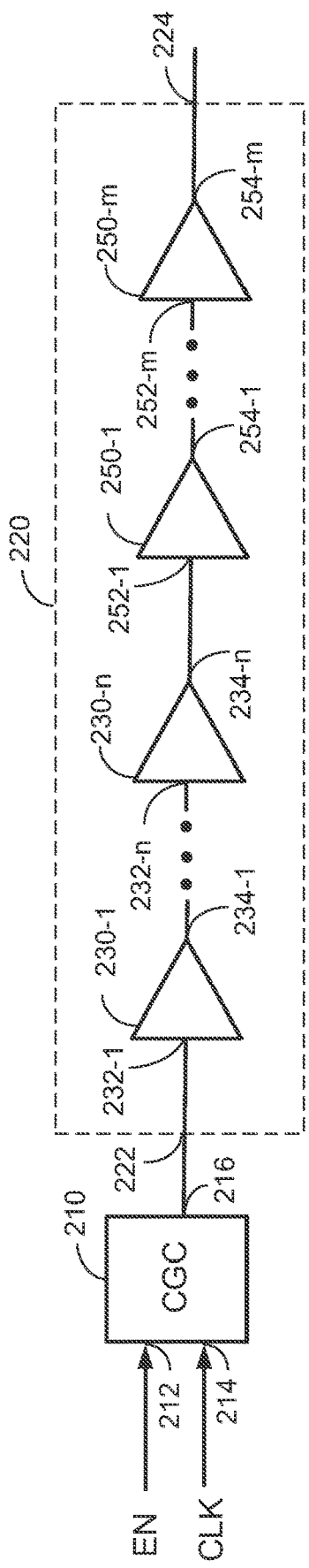
FIG. 2A shows an example of a signal path and a clock gating circuit according to certain aspects of the present disclosure.

FIG. 2A shows an example of a signal path 220 (e.g., clock path) and a clock gating circuit 210 (also referred to as a clock gating cell) according to certain aspects. The clock gating circuit 210 has a clock input 214 configured to receive a clock signal (labeled "CLK"), a control input 212 configured to receive an enable signal (labeled "EN"), and an output 216 coupled to the input 222 of the signal path 220. The output 224 of the signal path 220 may be coupled to one or more circuits (not shown). In this example, the signal path 220 may be configured to distribute the clock signal to the one or more circuits, in which each of the one or more circuits may use the clock signal to time operations in the circuit (e.g., clock latches in the circuit). The signal path 220 includes multiple delay buffers 230-1 to 230-n and 250-1 to 250-m coupled in series. A delay buffer may also be referred to as a delay stage, a delay element, a delay unit, or another term. The enable signal may also be referred to as a clock enable signal, a control signal, or another term.

Figure 2B:
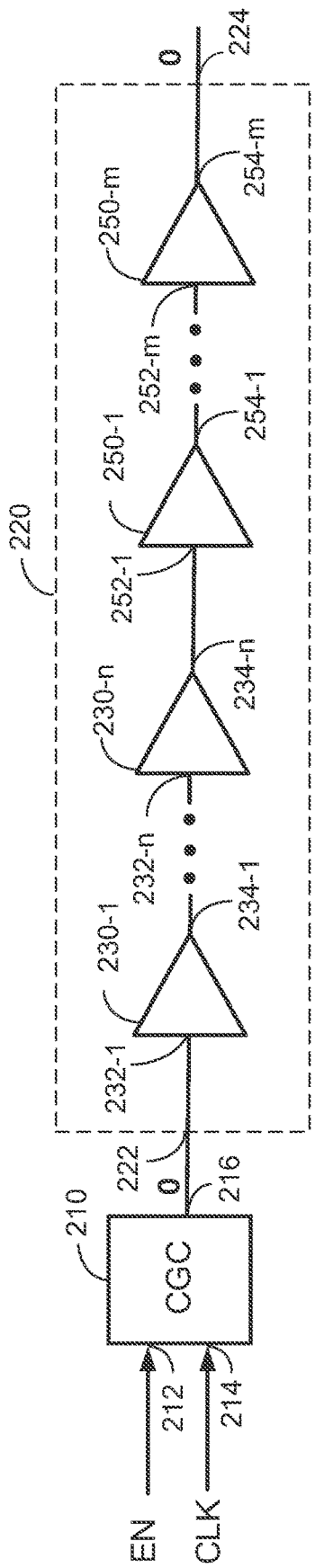
FIG. 2B shows an example of logic states at the signal path and the clock gating circuit in an idle mode according to certain aspects of the present disclosure.
Figure 2C:
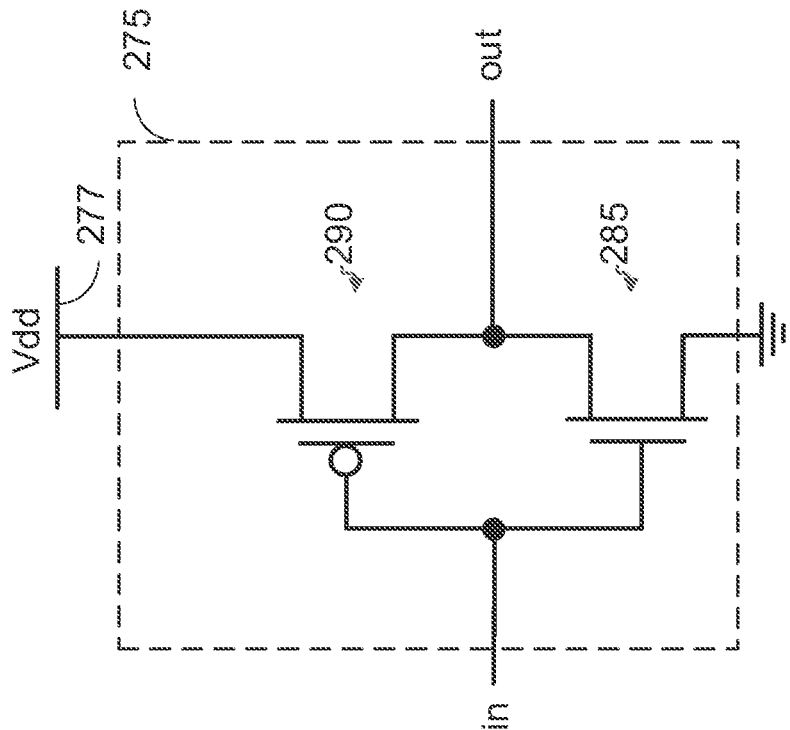
FIG. 2C shows an exemplary implementation of a delay buffer according to certain aspects of the present disclosure.

Each delay buffer 230-1 to 230-n and 250-1 to 250-m may be implemented with an inverter or another type of delay buffer (e.g., a NOR gate, a NAND gate, an OR gate, an AND gate, etc.). For example, each of the delay buffers 230-1 to 230-n and 250-1 to 250-m may be implemented with a respective complementary inverter. In this regard, FIG. 2C shows an example of a delay buffer 275 implemented with a complementary inverter including an NFET 285 and a PFET 290, in which the source of the NFET 285 is coupled to ground, the gates of the NFET 285 and the PFET 290 are coupled to the input (labeled "in") of the delay buffer 275, the drains of the NFET 285 and the PFET 290 are coupled to the output (labeled "out") of the delay buffer 275, and the source of the PFET 290 is coupled to the supply rail Vdd 277. Each of the delay buffers 230-1 to 230-*n* and 250-1 to 250-*m* may be implemented with an instance of the exemplary delay buffer 275 shown in FIG. 2C. However, it is to be appreciated that the delay buffers 230-1 to 230-*n* and 250-1 to 250-*m* are not limited to this example.

In this example, the clock gating circuit 210 is configured to gate or un-gate the clock signal based on the enable signal. For example, the clock gating circuit 210 may be configured to un-gate (i.e., pass) the clock signal when the enable signal is logic one and gate (i.e., block) the clock signal when the enable signal is logic zero, or vice versa. The enable signal may be generated by a controller (not shown) configured to manage power for the one or more circuits coupled to the output 224 of the signal path 220. In this example, the enable signal may cause the clock gating circuit 210 to pass the clock signal in the active mode and to gate the clock signal in the idle mode. In other words, for the example where the clock gating circuit 210 is configured to un-gate the clock signal when the enable signal is one, the enable signal may be one in the active mode and zero in the idle mode. The clock gating circuit 210 may be implemented with one or more logic gates (e.g., an AND gate, a NAND gate, an OR gate, a NOR gate, etc.), one or more clocked latches, a tri-state buffer, or any combination thereof.

When the clock gating circuit 210 is un-gated in the active mode, the clock signal propagates through the signal path 220 to the one or more circuits coupled to the output 224 of the signal path 220. When the clock gating circuit 210 is gated in the idle mode, the output 216 of the clock gating circuit 210 parks (i.e., hold) the input 222 of the signal path 220 low or high. FIG. 2B shows an example in which the clock gating circuit 210 parks the input 222 low in the idle mode. FIG. 2B also shows the logic state at the output 224 in the idle mode, which is logic zero in this example. In this example, parking the input 222 low in the idle mode causes duty-cycle distortion over time due to asymmetric aging. In the example in FIG. 2B, the duty-cycle distortion increases the duty cycle of the clock signal, as discussed above with reference to FIG. 1C. The duty-cycle distortion may lead to timing issues in the one or more circuits receiving the clock signal via the signal path 220.

In a duty-cycle sensitive system (e.g., a long clock path), the duty-cycle distortion can lead to minimum pulse width violations and/or timing violations in the system. An example of such as system is a double-data rate (DDR) system in which data is captured from a data signal on both rising edges and falling edges of the clock signal. In this example, duty-cycle distortion due to asymmetric aging can cause the system to fail to capture data from the data signal.

To address this, various aspects of the present disclosure reduce duty-cycle distortion due to aging. In one example, a signal path is divided into segments in which asymmetric aging in the segments cause duty-cycle distortions in opposite directions. As a result, the duty-cycle distortions in the segments cancel each other, which reduces duty-cycle distortion across the segments. The above exemplary features and other exemplary features of the present disclosure are discussed further below.

FIG. 3A shows an example of a system 305 with duty-cycle distortion mitigation according to certain aspects of the present disclosure. In this example, the exemplary signal path 220 shown in FIG. 2A is divided into a first signal path 320 and a second signal path 340, in which the first signal path 320 includes delay buffers 230-1 to 230-*n* coupled in series and the second signal path 340 includes delay buffers 250-1 to 250-*m* coupled in series. In this regard, the first signal path 320 may be considered a first segment of the signal path 220 and the second signal path 340 may be considered a second segment of the signal path 220.

As shown in FIG. 3A, the input 232-1 of delay buffer 230-1 is coupled to the input 322 of the first signal path 320 and the output 234-*n* of delay buffer 230-*n* is coupled to the output 324 of the first signal path 320. The input 252-1 of delay buffer 250-1 is coupled to the input 342 of the second signal path 340 and the output 254-*m* of delay buffer 250-*m* is coupled to the output 344 of the second signal path 340. The first signal path 320 and the second signal path 340 may have equal numbers of delay buffers (i.e., n=m) or different numbers of delay buffers (i.e., n≠m).

The system 305 also includes the clock gating circuit 210, a park high circuit 310, and a park low circuit 330. The park high circuit 310 has a signal input 312 coupled to the output 216 of the clock gating circuit 210, a control input 316 configured to receive the enable signal, and an output 314 coupled to the input 322 of the first signal path 320. In the example in FIG. 3A, the control input 316 of the park high circuit 310 is coupled to the control input 212 of the clock gating circuit 210. For the example where the signal propagating through the signal paths 320 and 340 is a clock signal, the signal input 312 may also be referred to as a clock input.

The park low circuit 330 has a signal input 332 coupled to the output 324 of the first signal path 320, a control input 336 configured to receive the enable signal, and an output 334 coupled to the input 342 of the second signal path 340. In the example in FIG. 3A, the control input 336 of the park low circuit 330 is coupled to the control input 212 of the clock gating circuit 210. For the example where the signal propagating through the signal paths 320 and 340 is a clock signal, the signal input 332 may also be referred to as a clock input. The output 344 of the second signal path 340 may be coupled to the one or more circuits discussed above with reference to FIG. 2A.

In one example, the clock gating circuit 210 is configured to un-gate (i.e., pass) the clock signal when the enable signal has a first logic value and gate (i.e., block) the clock signal when the enable signal has a second logic value. The first logic value may be one and the second logic value may be zero, or vice versa.

In one example, the park high circuit 310 is configured to couple the signal input 312 to the output 314 (i.e., un-gate) when the enable signal has the first logic value, and park the output 314 high (i.e., logic one) when the enable signal has the second logic value. For example, the park high circuit 310 may be implemented with a clock gating circuit configured to un-gate when the enable signal has the first logic value and configured to gate and park its output high when the enable signal has the second logic value.

In one example, the park low circuit 330 is configured to couple the signal input 332 to the output 334 (i.e., un-gate) when the enable signal has the first logic value, and park the output 334 low (i.e., logic zero) when the enable signal has the second logic value. For example, the park low circuit 330 may be implemented with a clock gating circuit configured to un-gate when the enable signal has the first logic value and configured to gate and park its output low when the enable signal has the second logic value.

In this example, the enable signal has the first logic value in the active mode. Thus, in the active mode, the clock gating circuit 210 passes the clock signal to the signal input 312 of the park high circuit 310. The park high circuit 310 passes the clock signal to the input 322 of the first signal path 320. The clock signal then propagates through the first signal path 320 to the signal input 332 of the park low circuit 330. The park low circuit 330 passes the clock signal to the input 342 of the second signal path 340. The clock signal then propagates though the second signal path 340 to the one or more circuits coupled to the output 344 of the second signal path 340.

In this example, the enable signal has the second logic value in the idle mode. Thus, in the idle mode, the clock gating circuit 210 gates the clock signal. The park high circuit 310 parks the input 322 of the first signal path 320 high (i.e., logic one) and the park low circuit 330 parks the input 342 of the second signal path 340 low (i.e., zero).

The park high circuit 310 and the park low circuit 330 mitigate asymmetric aging in the signal paths 320 and 340. An example of this is illustrated in FIG. 3B. In this example, each of the signal paths 320 and 340 is assumed to have an even number of delay buffers (i.e., n and m are both even), where each of the delay buffers is implemented with an inverter. However, it is to be appreciated that the present disclosure is not limited to this example, as discussed further before.

FIG. 3B shows the logic state at the output 216 of the clock gating circuit 210 in the idle mode, which is zero in this example. FIG. 3B also shows the logic state at the input 322 of the first signal path 320 and the logic state at the output 324 of the first signal path 320 in the idle mode, in which both logic states are one in this example FIG. 3B also shows the logic state at the input 342 of the second signal path 340 and the logic state at the output 344 of the second signal path 340 in the idle mode, in which both logic states are zero in this example.

In this example, parking the input 322 of the first signal path 320 high in the idle mode causes duty-cycle distortion in the first signal path 320 due to asymmetric aging. In this case, the duty-cycle distortion decreases the duty cycle of the clock signal, as discussed above with reference to FIG. 1E.

Parking the input 342 of the second signal path 340 low in the idle mode causes duty-cycle distortion in the second signal path 340 due to asymmetric aging. In this case, the duty-cycle distortion increases the duty cycle of the clock signal, as discussed above with reference to FIG. 1C.

Thus, in this example, the duty-cycle distortion in the first signal path 320 and the duty-cycle distortion in the second signal path 340 move in opposite directions, in which the duty-cycle distortion in the first signal path 320 decreases the duty cycle of the clock signal and the duty-cycle distortion in the second signal path 340 increases the duty cycle of the clock signal. As a result, the duty-cycle distortion in the second signal path 340 cancels at least a portion of the duty-cycle distortion in the first signal path 320, which reduces the overall duty-cycle distortion across the signal paths 320 and 340.

Figure 3C:
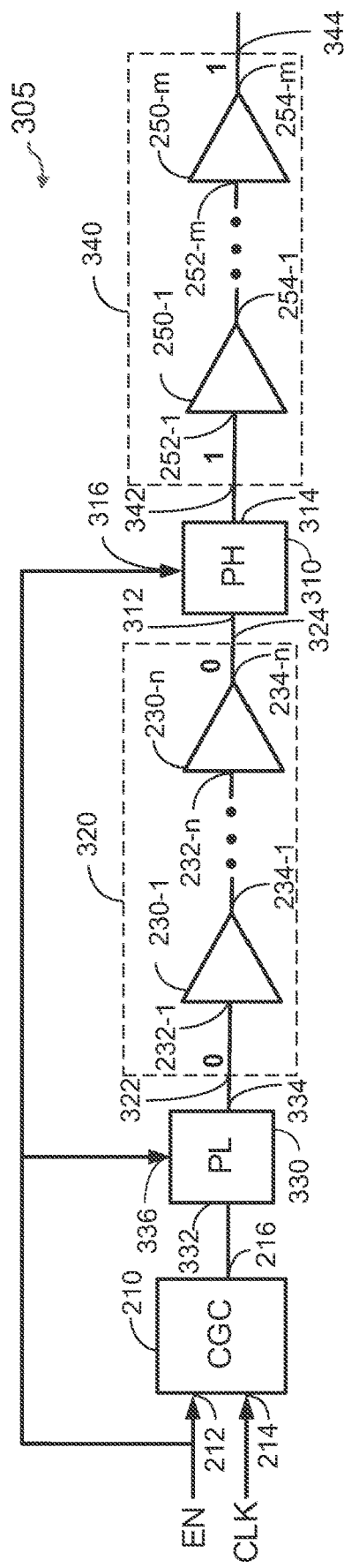
FIG. 3C shows another example of signal paths with duty-cycle distortion mitigation according to certain aspects of the present disclosure.

It is to be appreciated that the present disclosure is not limited to the example shown in FIGS. 3A and 3B. For example, it is to be appreciated that the locations of the park low circuit 330 and the park high circuit 310 may be switched while still achieving a similar asymmetric aging cancellation effect. In this regard, FIG. 3C shows an example in which the locations of the park low circuit 330 and the park high circuit 310 are switched. In this example, the signal input 332 of the park low circuit 330 is coupled to the output 216 of the clock gating circuit 210, the output 334 of the park low circuit 330 is coupled to the input 322 of the first signal path 320, the signal input 312 of the park high circuit 310 is coupled to the output 324 of the first signal path 320, and the output 314 of the park high circuit 310 is coupled to the input 342 of the second signal path 340. In the example shown in FIG. 3C, the duty-cycle distortion in the first signal path 320 increases the duty cycle of the clock signal and the duty-cycle distortion in the second signal path 340 decreases the duty cycle of the clock signal. As a result, the duty-cycle distortion in the second signal path 340 cancels at least a portion of the duty-cycle distortion in the first signal path 320.

Figure 3D:
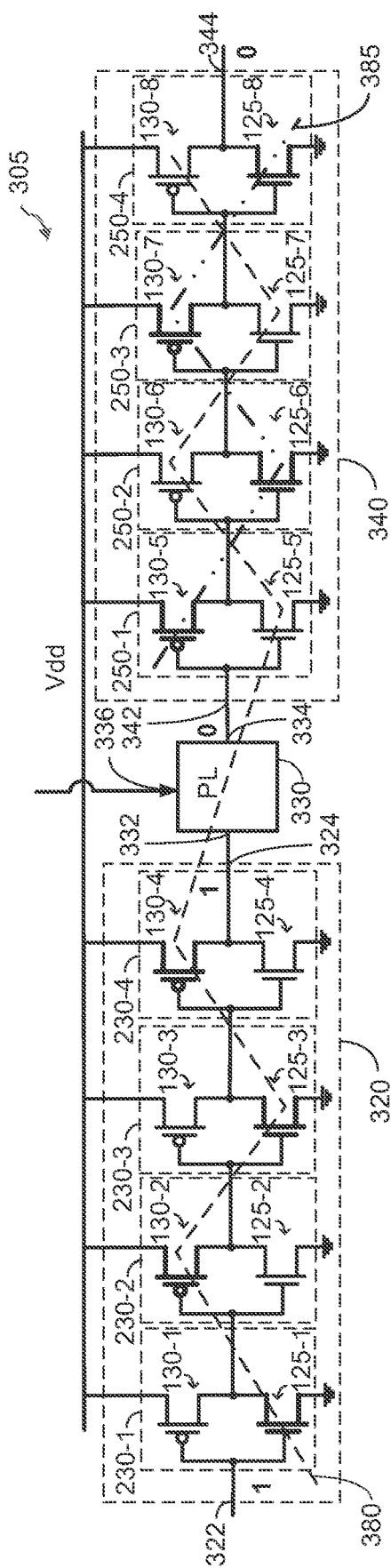
FIG. 3D shows an example of aging paths in the signal paths of FIG. 3A according to certain aspects of the present disclosure.

In the example shown in FIG. 3B, the output 334 of the park low circuit 330 (which is coupled to the input 342 of the second signal path 340) has a different logic state (i.e., logic value) than the output 324 of the first signal path 320 in the idle mode. More particularly, in the idle mode, the output 324 of the first signal path 320 has a logic state of one and the output 334 of the park low circuit 330 has a logic state of zero, which inverts the aging path in the second signal path 340 with respect to the aging path in the first signal path 320. An example of this is illustrated in FIG. 3D, which shows an example of the aging path 380 in the first signal path 320 and an example of the aging path 385 in the second signal path 340. In the example shown in FIG. 3D, the delay buffers 230-1 to 230-n and 250-1 to 250-m are implemented with the exemplary delay buffers 120-1 to 120-8 shown in FIG. 1A. However, it is to be appreciated that the present disclosure is not limited to this example. As shown in FIG. 3D, the aging path 385 in the second signal path 340 is the inverse of the aging path 380 in the first signal path 320. Note that FIG. 3D also shows the aging path 380 in the first signal path 320 extending into the second signal path 340 to show that the aging path 385 in the second signal path 340 is the inverse of the aging path 380 in the first signal path 320. By inverting the aging path, the park low circuit 330 causes the duty-cycle distortion in the second signal path 340 to move in the opposite direction as the duty-cycle distortion in the first signal path 320, thereby canceling at least a portion of the duty-cycle distortion in the first signal path 320.

Figure 3E:
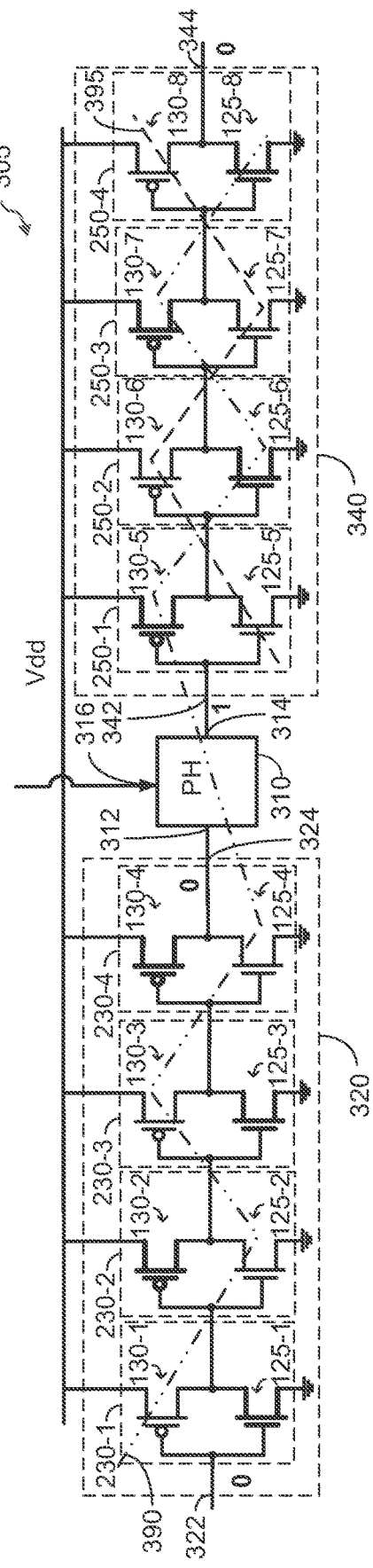
FIG. 3E shows an example of aging paths in the signal paths of FIG. 3C according to certain aspects of the present disclosure.

A similar asymmetric aging cancellation effect is achieved for the example in FIG. 3C. In the example in FIG. 3C, the output 334 of the park high circuit 310 (which is coupled to the input 342 of the second signal path 340) has a different logic state (i.e., logic value) than the output 324 of the first signal path 320 in the idle mode. More particularly, in the idle mode, the output 324 of the first signal path 320 has a logic state of zero and the output 314 of the park high circuit 310 has a logic state of one, which inverts the aging path in the second signal path 340 with respect to the aging path in the first signal path 320. An example of this is illustrated in FIG. 3E, which shows an example of the aging path 390 in the first signal path 320 and an example of the aging path 395 in the second signal path 340. In the example shown in FIG. 3E, the delay buffers 230-1 to 230-n and 250-1 to 250-m are implemented with the exemplary delay buffers 120-1 to 120-8 shown in FIG. 1A. However, it is to be appreciated that the present disclosure is not limited to this example. As shown in FIG. 3E, the aging path 395 in the second signal path 340 is the inverse of the aging path 390 in the first signal path 320. Note that FIG. 3E also shows the aging path 390 in the first signal path 320 extending into the second signal path 340 to show that the aging path 395 in the second signal path 340 is the inverse of the aging path 390 in the first signal path 320. By inverting the aging path, the park high circuit 310 causes the duty-cycle distortion in the second signal path 340 to move in the opposite direction as the duty-cycle distortion in the first signal path 320, thereby canceling at least a portion of the duty-cycle distortion in the first signal path 320.

It is to be appreciated that the system 305 may include additional signal paths in addition to the first signal path 320 and the second signal path 340 shown in FIGS. 3A to 3E. In general, aspects of the present disclosure may be extended to a system including any number of signal paths and to a system with multiple branches. For example, aspects of the present disclosure may be extended to a clock distribution system including multiple clock branches (e.g., a clock tree or clock network), as discussed further below.

Figure 4A:
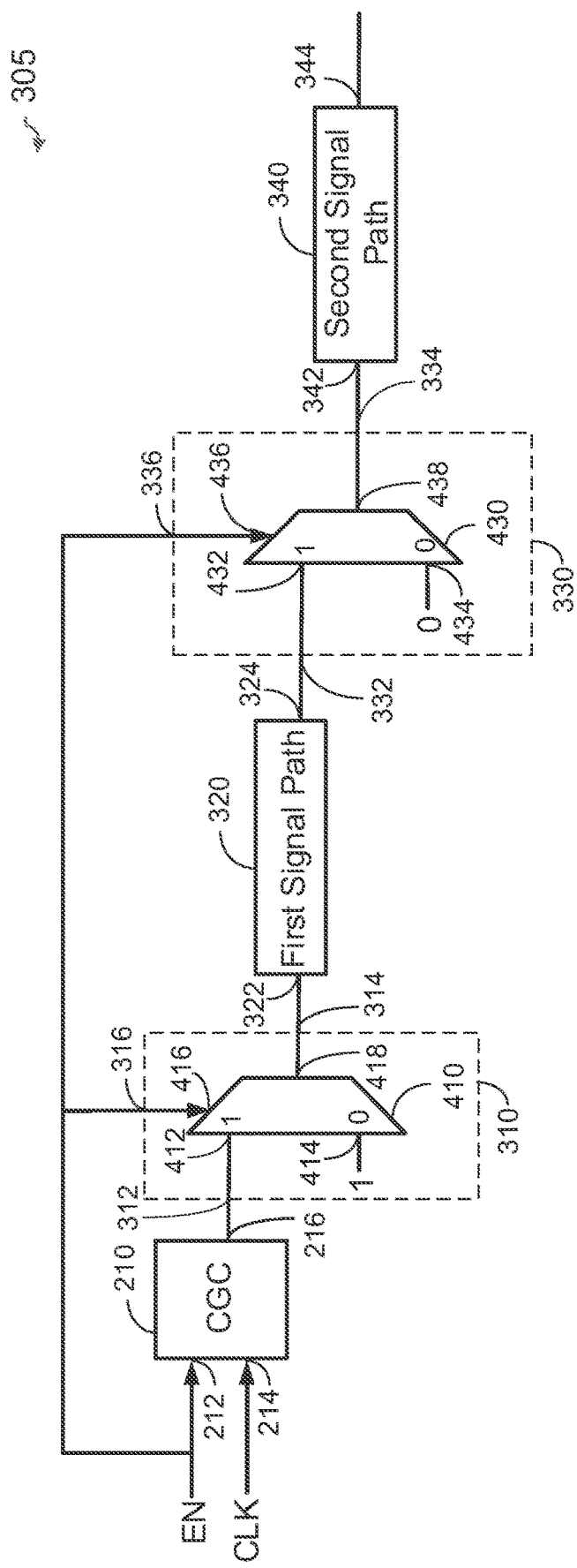
FIG. 4A shows an exemplary implementation of a park high circuit and a park low circuit according to certain aspects of the present disclosure.

FIG. 4A shows an exemplary implementation of the park high circuit 310 and the park low circuit 330 according to certain aspects. In this example, the park high circuit 310 includes a first multiplexer 410 and the park low circuit 330 includes a second multiplexer 430. Note that the delay buffers 230-1 to 230-*n* in the first signal path 320 and the delay buffers 250-1 to 250-*m* in the second signal path 340 are not explicitly shown in FIG. 4A for ease of illustration.

Figure 4B:
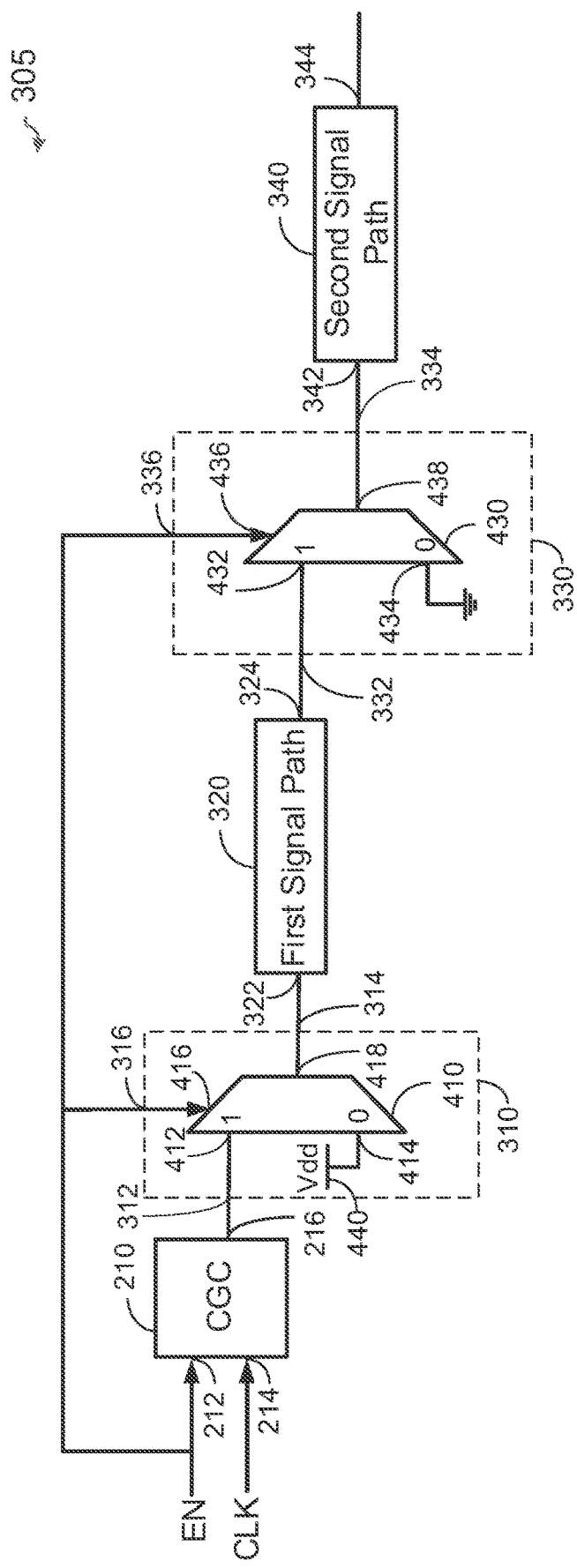
FIG. 4B shows another exemplary implementation of a park high circuit and a park low circuit according to certain aspects of the present disclosure.

The first multiplexer 410 has a first input 412, a second input 414, a select input 416, and an output 418. The first input 412 is coupled to the signal input 312 of the park high circuit 310, the second input 414 is configured to receive a logic one, and the output 418 is coupled to the output 314 of the park high circuit 310. The select input 416 is coupled to the control input 316 of the park high circuit 310. In one example, the second input 414 may receive the logic one by coupling the second input 414 to a supply rail Vdd 440, as shown in the example in FIG. 4B.

In one example, the first multiplexer 410 is configured to couple the first input 412 to the output 418 (i.e., select the first input 412) when the enable signal at the select input 416 has the first logic value (e.g., one). Thus, when the enable signal has the first logic value in the active mode, the first multiplexer 410 passes the clock signal from the first input 412 to the output 418. The first multiplexer 410 is configured to couple the logic one at the second input 414 to the output 418 (i.e., select the second input 414) when the enable signal at the select input 416 has the second logic value (e.g., zero). Thus, when the enable signal has the second logic value in the idle mode, the first multiplexer 410 parks the output 418 high (i.e., logic one). Since the output 418 of the first multiplexer 410 is coupled to the input 322 of the first signal path 320 in this example, the first multiplexer 410 parks the input 322 of the first signal path 320 high in the idle mode.

The second multiplexer 420 has a first input 432, a second input 434, a select input 436, and an output 438. The first input 432 is coupled to the signal input 332 of the park low circuit 330, the second input 434 is configured to receive a logic zero, and the output 438 is coupled to the output 334 of the park low circuit 330. The select input 436 is coupled to the control input 336 of the park low circuit 330. In one example, the second input 434 may receive the logic zero by coupling the second input 434 to ground, as shown in the example in FIG. 4B.

In one example, the second multiplexer 430 is configured to couple the first input 432 to the output 438 (i.e., select the first input 432) when the enable signal at the select input 436 has the first logic value (e.g., one). Thus, when the enable signal has the first logic value in the active mode, the second multiplexer 430 passes the clock signal from the first input 432 to the output 438. The second multiplexer 430 is configured to couple the logic zero at the second input 434 to the output 438 (i.e., select the second input 434) when the enable signal at the select input 436 has the second logic value (e.g., zero). Thus, when the enable signal has the second logic value in the idle mode, the second multiplexer 430 parks the output 438 low (i.e., logic zero). Since the output 438 of the second multiplexer 430 is coupled to the input 342 of the second signal path 340 in this example, the second multiplexer 430 parks the input 342 of the second signal path 340 low in the idle mode.

The first multiplexer 410 and the second multiplexer 430 may each be implemented with one or more switches, one or more logic gates, or any combination thereof.

Figure 4C:
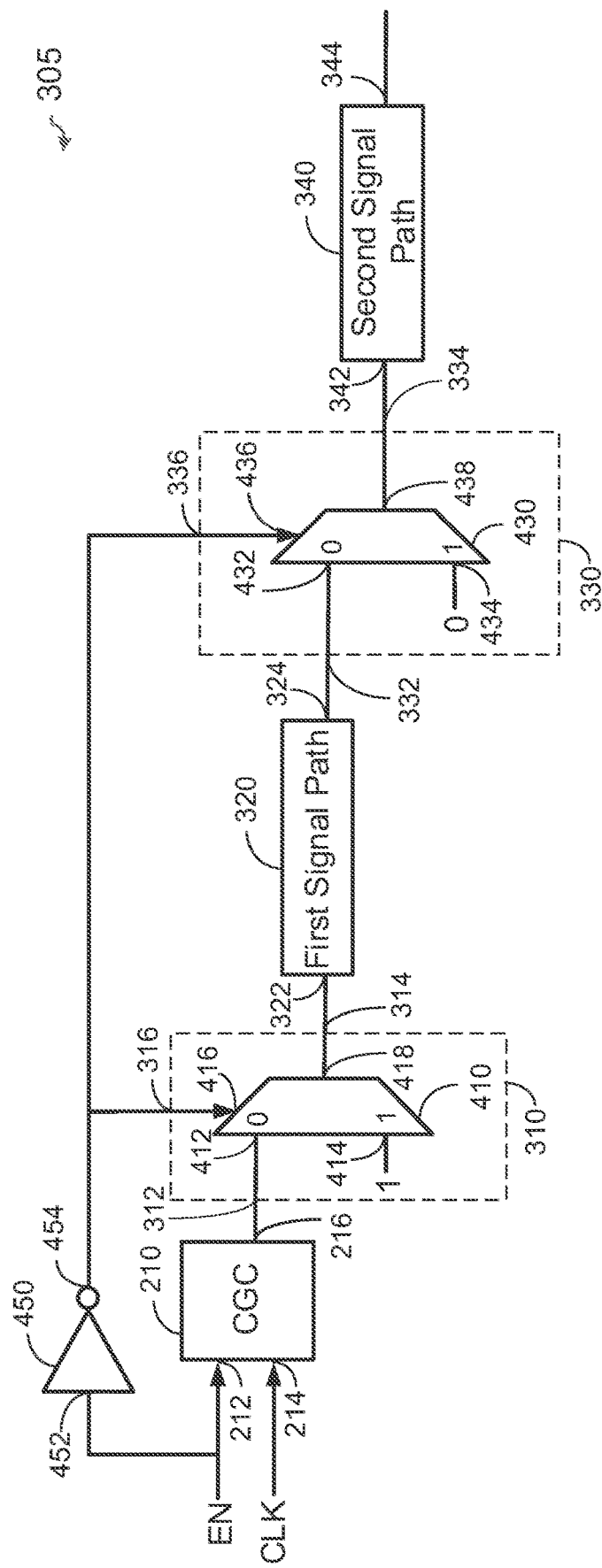
FIG. 4C shows still another exemplary implementation of a park high circuit and a park low circuit according to certain aspects of the present disclosure.

It is to be appreciated that, in some implementations, the control input 316 of the park high circuit 310 and the control input 336 of the park low circuit 330 may be coupled to the control input 212 of the clock gating circuit 210 via an inverter 450, an example of which is shown in FIG. 4C. In this example, the input 452 of the inverter 450 is coupled to the control input 212 of the clock gating circuit 210, and the output 454 of the inverter 450 is coupled to the control input 316 of the park high circuit 310 and the control input 336 of the park low circuit 330. The inverter 450 inverts the enable signal and outputs the inverted enable signal to the control input 316 of the park high circuit 310 and the control input 336 of the park low circuit 330.

In this example, the first multiplexer 410 may be configured to select the first input 412 when the second logic value (e.g., zero) is input to the select input 416 and select the second input 414 when the first logic value (e.g., one) is input to the select input 416. Since the inverted enable signal is input to the select input 416 in this example, the first multiplexer 410 passes the clock signal when the enable signal has the first logic value (e.g., one) and parks the input 322 of the first signal path 320 high when the enable signal has the second logic value (e.g., zero).

In this example, the second multiplexer 430 may be configured to select the first input 432 when the second logic value (e.g., zero) is input to the select input 436 and select the second input 434 when the first logic value (e.g., one) is input to the select input 436. Since the inverted enable signal is input to the select input 436 in this example, the second multiplexer 430 passes the clock signal when the enable signal has the first logic value (e.g., one) and parks the input 342 of the second signal path 340 low when the enable signal has the second logic value (e.g., zero).

Figure 5A:
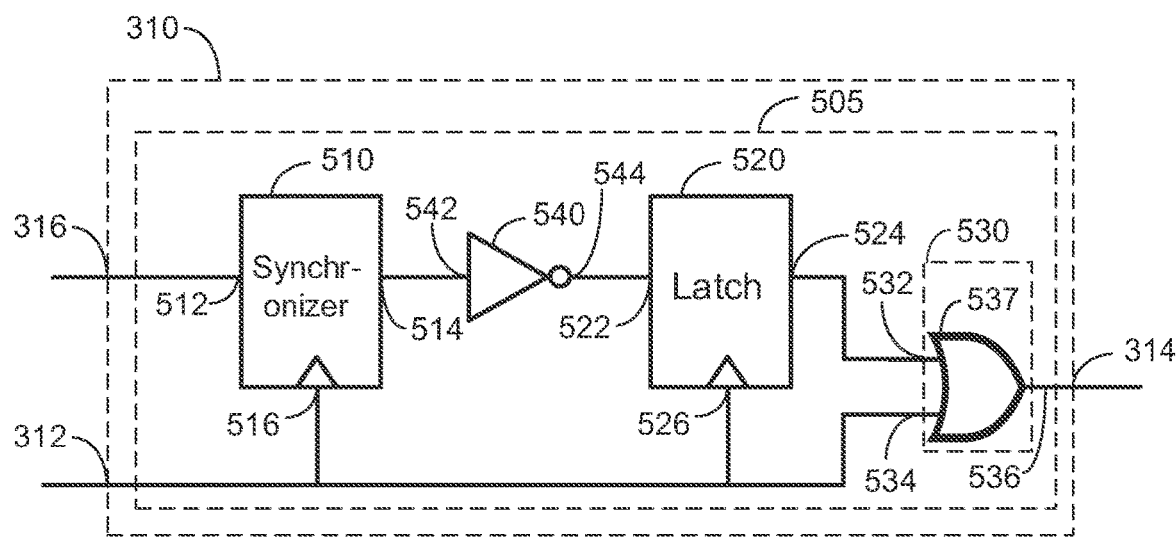
FIG. 5A shows an exemplary implementation of a park high circuit according to certain aspects of the present disclosure.

FIG. 5A shows another exemplary implementation of the park high circuit 310 according to certain aspects. In this example, the park high circuit 310 includes a park-high gating circuit 505 including a synchronizer 510, a latch 520, and a logic gate 530.

The synchronizer 510 has a control input 512, an output 514, and a timing input 516. The control input 512 is coupled to the control input 316 of the park high circuit 310, and the timing input 516 is coupled to the signal input 312 (e.g., clock input) of the park high circuit 310. The synchronizer 510 is configured to receive a control signal (e.g., enable signal) at the control input 512 and receive the clock signal at the timing input 516. The synchronizer 510 is configured to synchronize the control signal with the clock signal and output the synchronized control signal at the output 514. For example, the synchronizer 510 may synchronize the control signal with the clock signal by aligning an edge (i.e., transition) of the control signal with an edge of the clock signal.

The latch 520 has a control input 522, an output 524, and a timing input 526. The control input 522 is coupled to the output 514 of the synchronizer 510, and the timing input 526 is coupled to the signal input 312 (e.g., clock input) of the park high circuit 310. In the example in FIG. 5A, the control input 522 of the latch 520 is coupled to the output 514 of the synchronizer 510 via an inverter 540, in which the input 542 of the inverter 540 is coupled to the output 514 of the synchronizer 510 and the output 544 of the inverter 540 is coupled to the control input 522 of the latch 520. Thus, in this example, the inverter 540 inverts the synchronized control signal before inputting the synchronized control signal to the latch 520. However, it is to be appreciated that the inverter 540 may be omitted to some implementations.

The latch 520 is configured to receive the synchronized control signal (which may be inverted by the inverter 540) at the control input 522 and receive the clock signal at the timing input 526. The latch 520 is configured to latch the synchronized control signal on a rising edge of the clock signal and output the resulting latched control signal at the output 524. The latch 520 may be implemented with a flip-flop (e.g., positive-edge triggered flip-flop) or another type of clocked latch.

The logic gate 530 has a first input 532, a second input 534, and an output 536. The first input 532 is coupled to the output 524 of the latch 520, the second input 534 is coupled to the signal input 312 of the park high circuit 310, and the output 536 is coupled to the output 314 of the park high circuit 310. The logic gate 530 is configured to couple the signal input 312 of the park high circuit 310 to the output 314 of the park high circuit 310 (i.e., un-gate the park high circuit 310) or park the output 314 of the park high circuit 310 high based on the latched control signal from the latch 520. In the example shown in FIG. 5A, the logic gate 530 includes an OR gate 537. However, it is to be appreciated that the logic gate 530 is not limited to this example, and that the logic gate 530 may include another type of logic gate capable of parking the output 536 high.

In this example, the park high circuit 310 couples the signal input 312 to the output 314 (i.e., un-gates) when the control signal at the control input 316 is one and parks the output 314 high when the control signal at the control input 316 is zero. When the control signal at the control input 316 transitions from zero to one, the synchronizer 510 synchronizes the control signal with the clock signal such that the transition from zero to one (i.e., rising edge) is aligned with an edge of the clock signal. The inverter 540 then inverts the one of the synchronized control signal into a zero, and the latch 520 latches the zero on a rising edge of the clock signal. The latched zero is input to the first input 532 of the logic gate 530, which causes the logic gate 530 (e.g., OR gate 537) to pass the clock signal at the second input 534 to the output 536. In this example, the latch 520 helps ensure that the logic gate 530 un-gates the park high circuit 310 when the clock signal is high to help prevent a glitch at the output 314.

When the control signal at the control input 316 transitions from one to zero, the synchronizer 510 synchronizes the control signal with the clock signal such that the transition from one to zero (i.e., falling edge) is aligned with an edge of the clock signal. The inverter 540 then inverts the zero of the synchronized control signal into a one, and the latch 520 latches the one on a rising edge of the clock signal. The latched one is input to the first input 532 of the logic gate 530, which causes the output 536 of the logic gate 530 (e.g., OR gate 537) to park high. This is because the one at the first input 532 of the logic gate 530 (e.g., OR gate 537) causes the logic gate 530 to output a one regardless of the logic value at the second input 534 of the logic gate 530, which effectively gates (i.e., blocks) the clock signal. In this example, the latch 520 helps ensure that the logic gate 530 parks the output 314 of the park high circuit 310 high when the clock signal is high to help prevent a glitch at the output 314.

It is to be appreciated that the latch 520 and/or synchronizer 510 may be omitted for cases where glitching is not an issue. Also, it is to be appreciated that the synchronizer 510 may be omitted for cases where the control signal is already synchronized with the clock signal. In these cases, the control input 522 of the latch 520 may be coupled to the control input 316 without the synchronizer 510. An advantage of the synchronizer 510 is that it allows the incoming control signal to be asynchronous with the clock signal which simplifies the timing of the control signal.

Figure 5B:
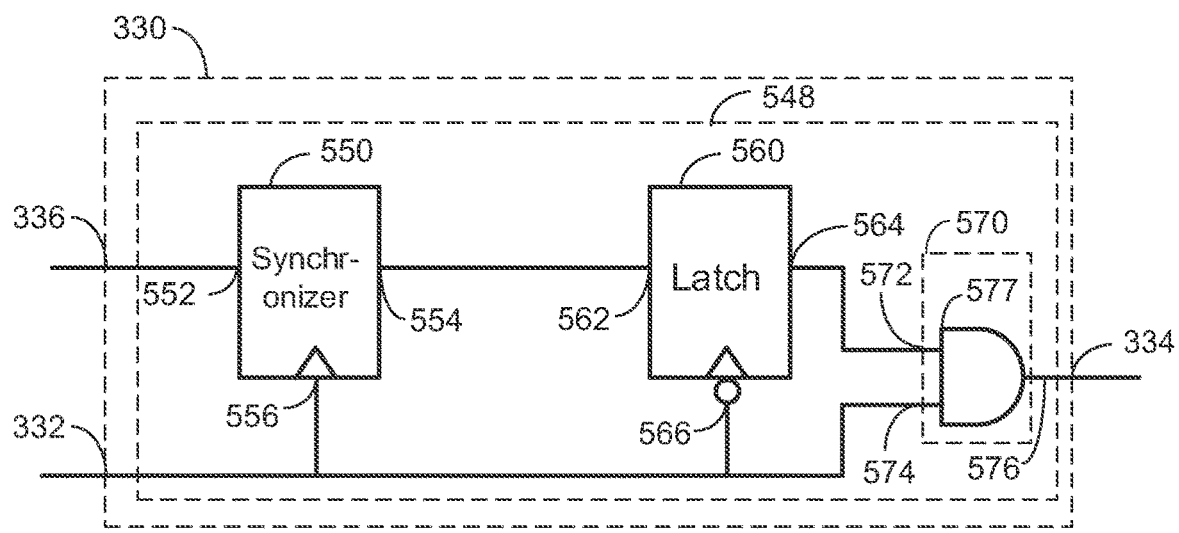
FIG. 5B shows an exemplary implementation of a park low circuit according to certain aspects of the present disclosure.

FIG. 5B shows another exemplary implementation of the park low circuit 330 according to certain aspects. In this example, the park low circuit 330 is implemented with a park-low gating circuit 548 including a synchronizer 550, a latch 560, and a logic gate 570.

The synchronizer 550 has a control input 552, an output 554, and a timing input 556. The control input 552 is coupled to the control input 336 of the park low circuit 330, and the timing input 556 is coupled to the signal input 332 (e.g., clock input) of the park low circuit 330. The synchronizer 550 is configured to receive a control signal (e.g., enable signal) at the control input 552 and receive the clock signal at the timing input 556. The synchronizer 550 is configured to synchronize the control signal with the clock signal and output the synchronized control signal at the output 554. For example, the synchronizer 550 may synchronize the control signal with the clock signal by aligning an edge (i.e., transition) of the control signal with an edge of the clock signal.

The latch 560 has a control input 562, an output 564, and a timing input 566. The control input 562 is coupled to the output 554 of the synchronizer 550, and the timing input 566 is coupled to the signal input 332 (e.g., clock input) of the park low circuit 330. The latch 560 is configured to receive the synchronized control signal at the control input 562 and receive the clock signal at the timing input 566. The latch 560 is configured to latch the synchronized control signal on a falling edge of the clock signal and output the resulting latched control signal at the output 564. The latch 560 may be implemented with a flip-flop (e.g., negative-edge triggered flip-flop) or another type of clocked latch.

The logic gate 570 has a first input 572, a second input 574, and an output 576. The first input 572 is coupled to the output 564 of the latch 560, the second input 574 is coupled to the signal input 332 of the park low circuit 330, and the output 576 is coupled to the output 334 of the park low circuit 330. The logic gate 570 is configured to couple the signal input 332 of the park low circuit 330 to the output 334 of the park low circuit 330 (i.e., un-gate the park low circuit 330) or park the output 334 of the park low circuit 330 low based on the latched control signal from the latch 560. In the example shown in FIG. 5B, the logic gate 570 includes an AND gate 577. However, it is to be appreciated that the logic gate 570 is not limited to this example, and that the logic gate 570 may include another type of logic gate capable of parking the output 576 low.

In this example, the park low circuit 330 couples the signal input 332 to the output 334 (i.e., un-gates) when the control signal at the control input 336 is one and parks the output 334 low when the control signal at the control input 336 is zero. When the control signal at the control input 336 transitions from zero to one, the synchronizer 550 synchronizes the control signal with the clock signal such that the transition form zero to one is aligned with an edge of the clock signal. The latch 560 latches the one of the synchronized control signal on a falling edge of the clock signal. The latched one is input to the first input 572 of the logic gate 570, which causes the logic gate 570 (e.g., AND gate 577) to pass the clock signal at the second input 574 to the output 576. In this example, the latch 560 helps ensure that the logic gate 570 un-gates the park low circuit 330 when the clock signal is low to help prevent a glitch at the output 334.

When the control signal at the control input 336 transitions from one to zero, the synchronizer 550 synchronizes the control signal with the clock signal such that the transition from one to zero is aligned with an edge of the clock signal. The latch 560 latches the zero of the synchronized control signal on a falling edge of the clock signal. The latched zero is input to the first input 572 of the logic gate 570, which causes the output 576 of the logic gate 570 (e.g., AND gate 577) to park low. This is because the zero at the first input 572 of the logic gate 570 (e.g., AND gate 577) causes the logic gate 570 to output a zero regardless of the logic value at the second input 574 of the logic gate 570, which effectively gates (i.e., blocks) the clock signal. In this example, the latch 560 helps ensure that the logic gate 570 parks the output 334 of the park low circuit 330 low when the clock signal is low, which helps prevent a glitch at the output 576.

It is to be appreciated that the latch 560 and/or synchronizer 550 may be omitted for cases where glitching is not an issue. Also, it is to be appreciated that the synchronizer 550 may be omitted for cases where the control signal is already synchronized with the clock signal. In these cases, the control input 562 of the latch 560 may be coupled to the control input 336 without the synchronizer 550. An advantage of the synchronizer 550 is that it allows the incoming control signal to be asynchronous with the clock signal which simplifies the timing of the control signal.

Figure 6:
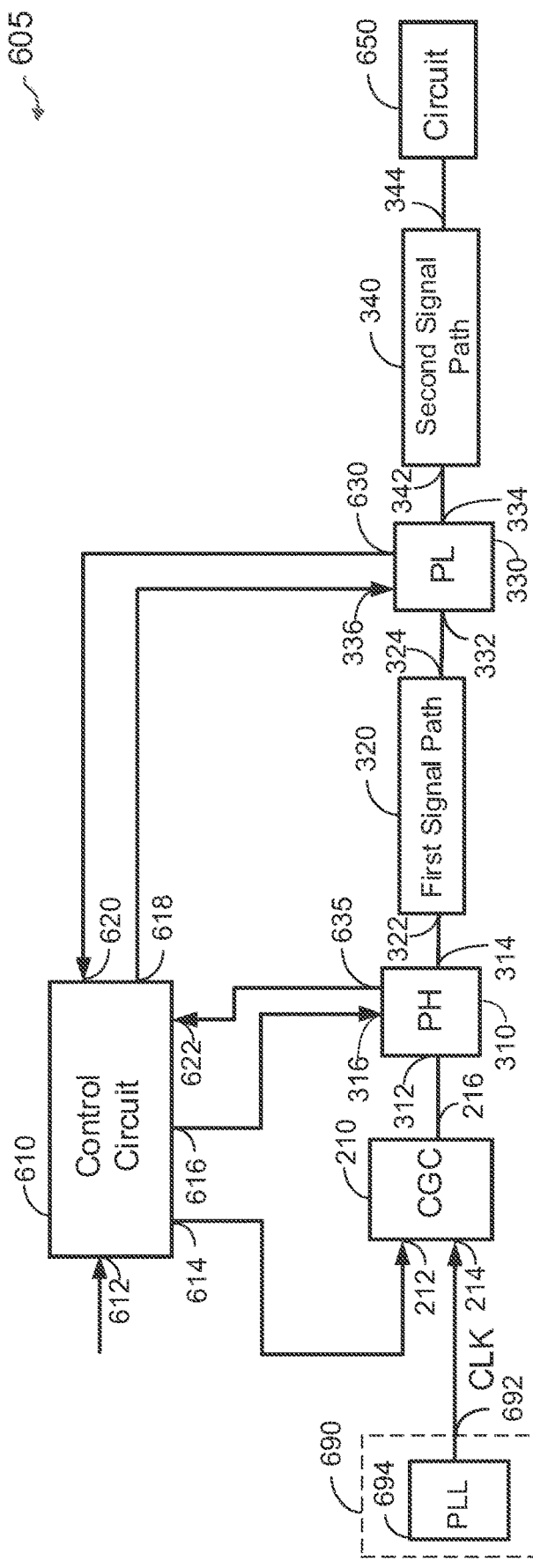
FIG. 6 shows an example of a system including a control circuit configured to sequence a park high circuit and a park low circuit according to certain aspects of the present disclosure.

In certain aspects, operations of the clock gating circuit 210, the park high circuit 310, and the park low circuit 330 may be sequenced when the system transitions to the idle mode and/or transitions to the active mode. This may be done, for example, to prevent a glitch at the output 344 of the second signal path 340. In this regard, FIG. 6 shows an example of a system 605 with sequencing according to certain aspects. In this example, the system 605 includes the clock gating circuit 210, the park high circuit 310, the first signal path 320, the park low circuit 330, and the second signal path 340 discussed above with reference to FIG. 3A. Note that the delay buffers 230-1 to 230-$n$ in the first signal path 320 and the delay buffers 250-1 to 250-$m$ in the second signal path 340 are not explicitly shown in FIG. 6 for ease of illustration.

FIG. 6 shows an example of a circuit 650 coupled to the output 344 of the second signal path 340. The circuit 650 may include a processor, logic gates, registers, retention flops, a memory, sequential logic, or any combination thereof. FIG. 6 also shows an example of a clock source 690 having an output 692 coupled to the clock input 214 of the clock gating circuit 210. The clock source 690 is configured to generate the clock signal (labeled "CLK") and output the clock signal at the output 692.

In one example, the clock source 690 may include a phase locked loop (PLL) 694. However, it is to be appreciated that the present disclosure is not limited to this example, and that the clock source 690 may be implemented with another type of clock source (also referred to as a clock generator). It is to be appreciated that the clock source 690 may be coupled to the clock gating circuit 210 via delay buffers (not shown), one or more other clock gating circuits (not shown), and/or one or more multiplexers (not shown). The one or more other clock gating circuits (not shown) may be used, for example, to gate the clock signal upstream of the clock gating circuit 210. The one or more multiplexers (not shown) may be used, for example, to selectively couple the clock input 214 of the clock gating circuit 210 to one or more other clock sources.

The system 605 also includes a control circuit 610 configured to control sequencing of the clock gating circuit 210, the park high circuit 310, and the park low circuit 330 during a transition to the idle mode and/or a transition to the active mode. As used herein, "idle mode" is a mode in which the clock signal to the circuit 650 is gated to reduce dynamic power. The idle mode may be triggered, for example, when the circuit 650 is not being used. In the idle mode, logic gates and/or flops in the circuit 650 that receive the clock signal in the active mode may be held at static states in the idle mode. The idle mode may also be referred to as an idle state, a static state, an inactive state, or another term. As used herein, "active mode" is a mode in which the clock signal is sent to the circuit 650 via the signal paths 320 and 340 to time (i.e., clock) operations in the circuit 650. The active mode may also be referred to as an active state, a functional mode, or another term.

The control circuit 610 has a first output 614, a second output 616, a third output 618, a first input 612, a second input 620, and a third input 622. The first input 612 is configured to receive a clock gating signal or a clock enable signal, which are discussed further below. The first output 614 is coupled to the control input 212 of the clock gating circuit 210 (also referred to as a clock gating cell), the second output 616 is coupled to the control input 316 of the park high circuit 310, and the third output 618 is coupled to the control input 336 of the park low circuit 330.

In the example in FIG. 6, the park low circuit 330 also has a status output 630 coupled to the second input 620 of the control circuit 610. In this example, the park low circuit 330 may be configured to output a status signal to the control circuit 610 via the status output 630, in which the status signal reports a status of the park low circuit 330, as discussed further below. It is to be appreciated that the status output 630 may be omitted in some implementations. As used here, a "status output" is an output of a circuit configured to output a status signal indicating a status of the circuit.

In the example in FIG. 6, the park high circuit 310 also has a status output 635 coupled to the third input 622 of the control circuit 610. In this example, the park high circuit 310 may be configured to output a status signal to the control circuit 610 via the status output 635, in which the status signal reports a status of the park high circuit 310, as discussed further below. It is to be appreciated that the status output 635 may be omitted in some implementations.

Figure 7:
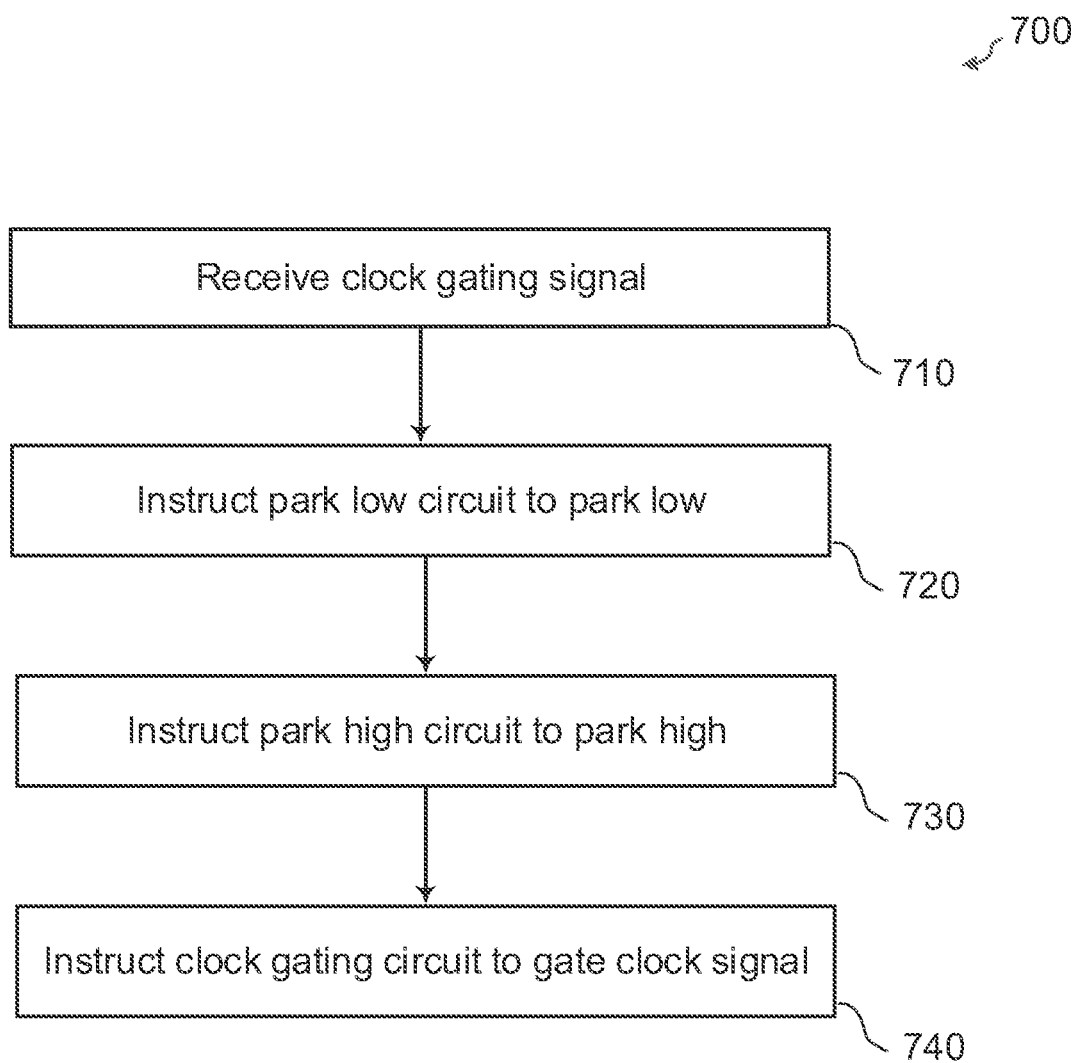
FIG. 7 is a flowchart illustrating an exemplary sequence for transitioning the system to an idle mode according to certain aspects of the present disclosure.

FIG. 7 illustrates an exemplary sequence 700 that may be performed by the system 605 for transitioning to the idle mode according to certain aspects. Initially, the clock gating circuit 210 may be un-gated, and the park high circuit 310 and the park low circuit 330 may pass the clock signal. In other words, the system 605 may initially operate in the active mode.

At block 710, the control circuit 610 receives a clock gating signal at the first input 612 requesting that the clock signal be gated. For example, the clock gating signal may come from a controller (not shown) configured to manage a power state of the circuit 650.

At block 720, in response to the clock gating signal, the control circuit 610 instructs (i.e., causes) the park low circuit 330 to park the output 334 low via the third output 618. For example, the control circuit 610 may output a logic value to the control input 336 of the park low circuit 330 via the third output 618 that causes the park low circuit 330 to park the output 334 low. In this example, the park low circuit 330 may be implemented with the exemplary park-low gating circuit 548 shown in FIG. 5B.

At block 730, the control circuit 610 instructs (i.e., causes) the park high circuit 310 to park the output 314 high via the second output 616. For example, the control circuit 610 may output a logic value to the control input 316 of the park high circuit 310 via the second output 616 that causes the park high circuit 310 to park the output 314 high. In this example, the park high circuit 310 may be implemented with the exemplary park-high gating circuit 505 shown in FIG. 5A.

At block 740, the control circuit 610 instructs (i.e., causes) the clock gating circuit 210 to gate the clock signal via the first output 614. For example, the control circuit 610 may output a logic value (e.g., the second logic value) to the control input 212 of the clock gating circuit 210 via the first output 614 that causes the clock gating circuit 210 to gate the clock signal. In certain aspects, the output 216 of the clock gating circuit 210 may be parked low when the clock signal is gated.

In one example, the control circuit 610 may instruct the park high circuit 310 to park the output 314 high at block 730 after the park low circuit 330 has parked the output 334 low. This helps prevent a park high at the output 314 of the park high circuit 310 from propagating to the circuit 650 through the second signal path 340. This is because having the park low circuit 330 park low before the park high circuit 310 parks high causes the park low circuit 330 to block the park high at the output 314 of the park high circuit 310 from propagating to the second signal path 340.

In one example, the control circuit 610 may use a status signal from the park low circuit 330 to help ensure that that park high circuit 310 parks high after the park low circuit 330 has parked low. For example, when the park low circuit 330 parks the output 334 low, the park low circuit 330 may be configured to output a park-low status signal to the control circuit 610 via the status output 630 indicating that the output 334 has been parked low. In this example, the control circuit 610 may be configured to instruct the park high circuit 310 to park high after the control circuit 610 receives the park-low status signal at the second input 620.

Figure 8A:
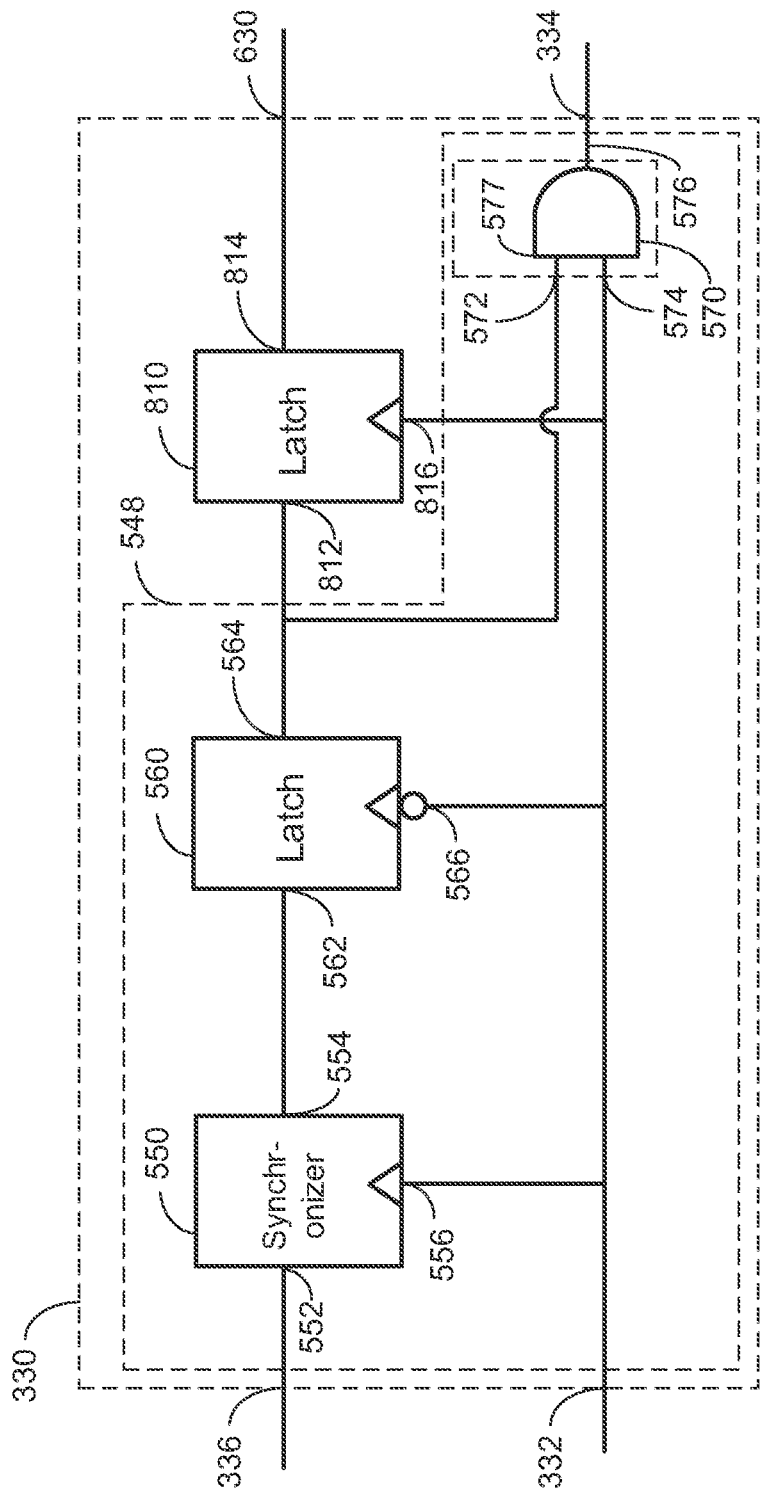
FIG. 8A shows an exemplary implementation of a park low circuit having a status output according to certain aspects of the present disclosure.

FIG. 8A shows an exemplary implementation in which the park low circuit 330 is configured to output a status signal at the status output 630 according to certain aspects. In this example, the park low circuit 330 includes the exemplary park-low gating circuit 548 shown in FIG. 5B. In the example in FIG. 8A, the park low circuit 330 also includes a second latch 810. The second latch 810 has a status input 812 coupled to the output 564 of the first latch 560, a timing input 816 coupled to the signal input 332, and an output 814 coupled to the status output 630. The second latch 810 may include a flip-flop or another type of latch.

In this example, the second latch 810 is configured to provide the status signal at the status output 630 by latching the logic value at the output 564 of the first latch 560 on a rising edge of the clock signal and outputting the latched logic value to the status output 630. In this example, the first latch 560 outputs a zero to the first input 572 of the logic gate 570 (e.g., AND gate 577) to park the output 334 low. Thus, in this example, the second latch 810 outputs a zero at the status output 630 to report that the output 334 has been parked low (i.e., the park-low status signal discussed above is zero in this example). Also, in this example, the second latch 810 outputs a one at the status output 630 when the park low circuit 330 is un-gated since the first latch 560 outputs a one to the first input 572 of the logic gate 570 to un-gate the park low circuit 330.

Figure 8B:
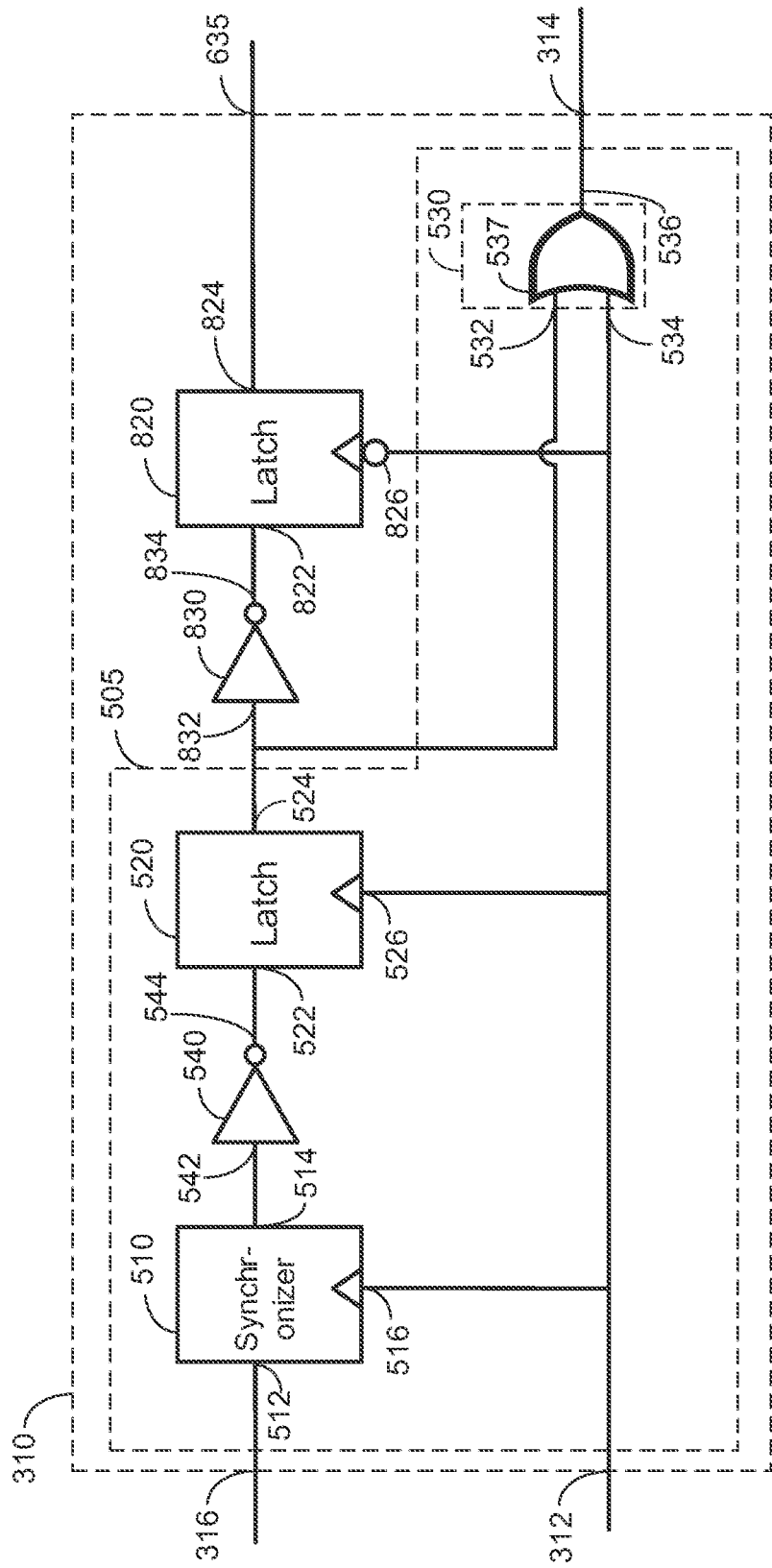
FIG. 8B shows an exemplary implementation of a park high circuit having a status output according to certain aspects of the present disclosure.

FIG. 8B shows an exemplary implementation in which the park high circuit 310 is configured to output a status signal at the status output 635 according to certain aspects. In this example, the park high circuit 310 includes the exemplary park-high gating circuit 505 shown in FIG. 5A. In the example in FIG. 8B, the park high circuit 310 also includes a second latch 820 and a second inverter 830. The second latch 820 has a status input 822 coupled to the output 524 of the first latch 520 via the second inverter 830, in which the input 832 of the second inverter 830 is coupled to the output 524 of the first latch 520 and the output 834 of the second inverter 830 is coupled to the status input 822 of the second latch 820. The second latch 820 also has a timing input 826 coupled to the signal input 312, and an output 824 coupled to the status output 635. The second latch 820 may include a flip-flop or another type of latch.

In this example, the second latch 820 is configured to provide the status signal at the status output 635 by latching the inverse of the logic value at the output 524 of the first latch 520 on a falling edge of the clock signal and outputting the latched inverse of the logic value to the status output 635. In this example, the first latch 520 outputs a one to the first input 532 of the logic gate 530 (e.g., OR gate 537) to park the output 314 high. Thus, in this example, the second latch 820 outputs a zero (i.e., the inverse of the one output by the first latch 520) at the status output 635 to report that the output 314 has been parked high (i.e., the park-high status signal discussed above is zero in this example). Also, in this example, the second latch 810 outputs a one at the status output 635 when the park high circuit 310 is un-gated.

Figure 9:
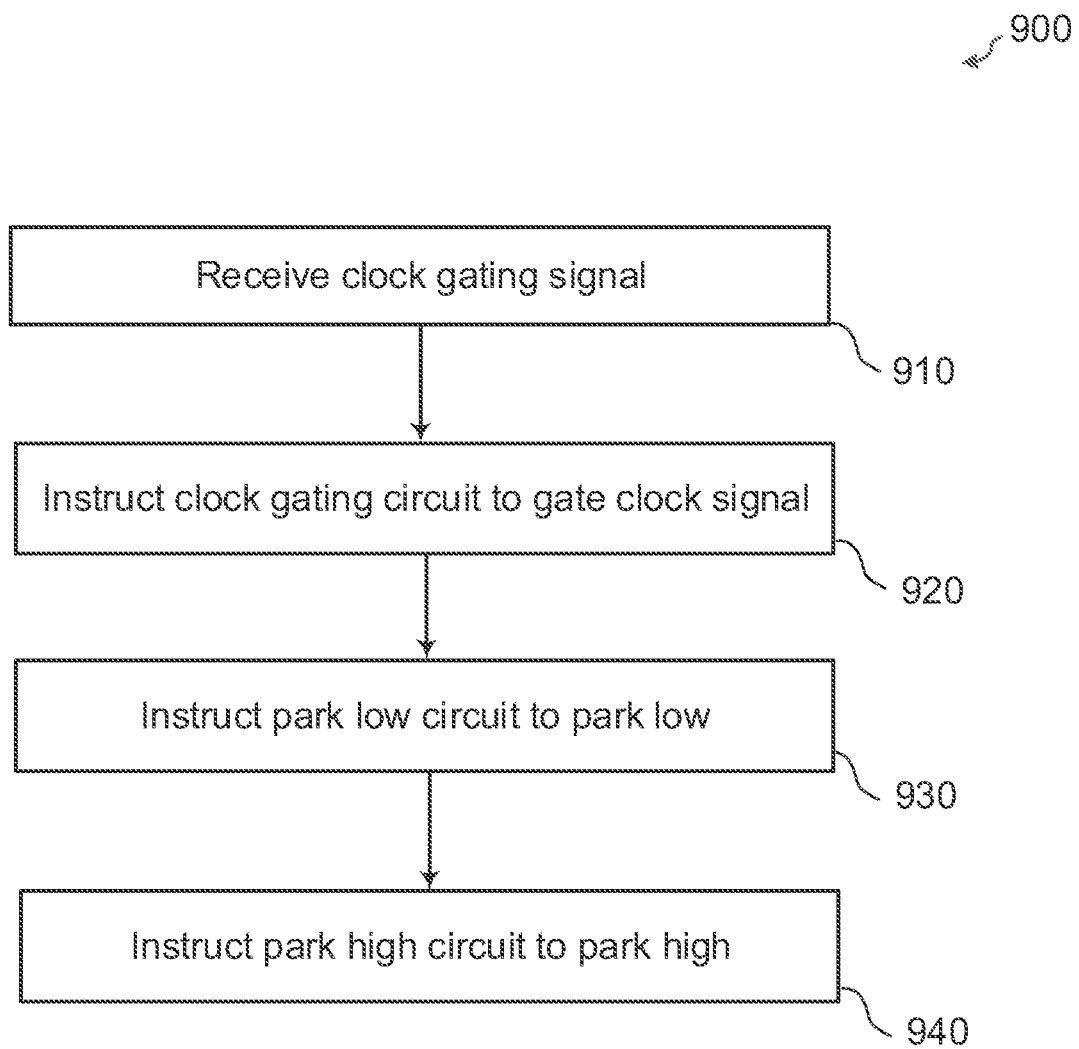
FIG. 9 is a flowchart illustrating another exemplary sequence for transitioning the system to an idle mode according to certain aspects of the present disclosure.

FIG. 9 illustrates another exemplary sequence 900 that may be performed by the system 605 for transitioning to the idle mode according to certain aspects. Initially, the clock gating circuit 210 may be un-gated, and the park high circuit 310 and the park low circuit 330 may pass the clock signal. In other words, the system 605 may initially operate in the active mode.

At block 910, the control circuit 610 receives a clock gating signal at the first input 612 requesting that the clock signal be gated. For example, the clock gating signal may come from a controller (not shown) configured to manage a power state of the circuit 650.

At block 920, in response to the clock gating signal, the control circuit 610 instructs (i.e., causes) the clock gating circuit 210 to gate the clock signal via the first output 614. For example, the control circuit 610 may output a logic value (e.g., the second logic value) to the control input 212 of the clock gating circuit 210 via the first output 614 that causes the clock gating circuit 210 to gate the clock signal. In this example, the output 216 of the clock gating circuit 210 may be parked low when the clock signal is gated.

At block 930, the control circuit 610 instructs (i.e., causes) the park low circuit 330 to park the output 334 low via the third output 618. For example, the control circuit 610 may output a logic value to the control input 336 of the park low circuit 330 via the third output 618 that causes the park low circuit 330 to park the output 334 low. In this example, the park low circuit 330 may include the second multiplexer 430 shown in FIG. 4A. In this example, the control circuit 610 may wait until the park low at the output 216 of the clock gating circuit 210 propagates to the park low circuit 330 before instructing the park low circuit 330 to park low such that the park low circuit 330 parks low when the signal input 332 of the park low circuit 330 is low, which helps prevent a glitch at the output 334. In this example, the control circuit 610 may delay instructing the park low circuit 330 to park low by a time delay that provides sufficient time for the park low at the output 216 of the clock gating circuit 210 to propagate to the park low circuit 330.

At block 940, the control circuit 610 instructs (i.e., causes) the park high circuit 310 to park the output 314 high via the second output 616. For example, the control circuit 610 may output a logic value to the control input 316 of the park high circuit 310 via the second output 616 that causes the park high circuit 310 to park the output 314 high. In this example, the park high circuit 310 may include the first multiplexer 410 shown in FIG. 4A.

The exemplary sequence 900 shown in FIG. 9 may be used, for example, to help prevent a glitch for the case where the park low circuit 330 does not include an internal mechanism (e.g., synchronizer and/or latch) for preventing a glitch. In this example, a glitch is prevented by gating the clock signal before parking the park low circuit 330 low. In this example, the park low circuit 330 may be implemented with a multiplexer (e.g., the second multiplexer 430).

Figure 10:
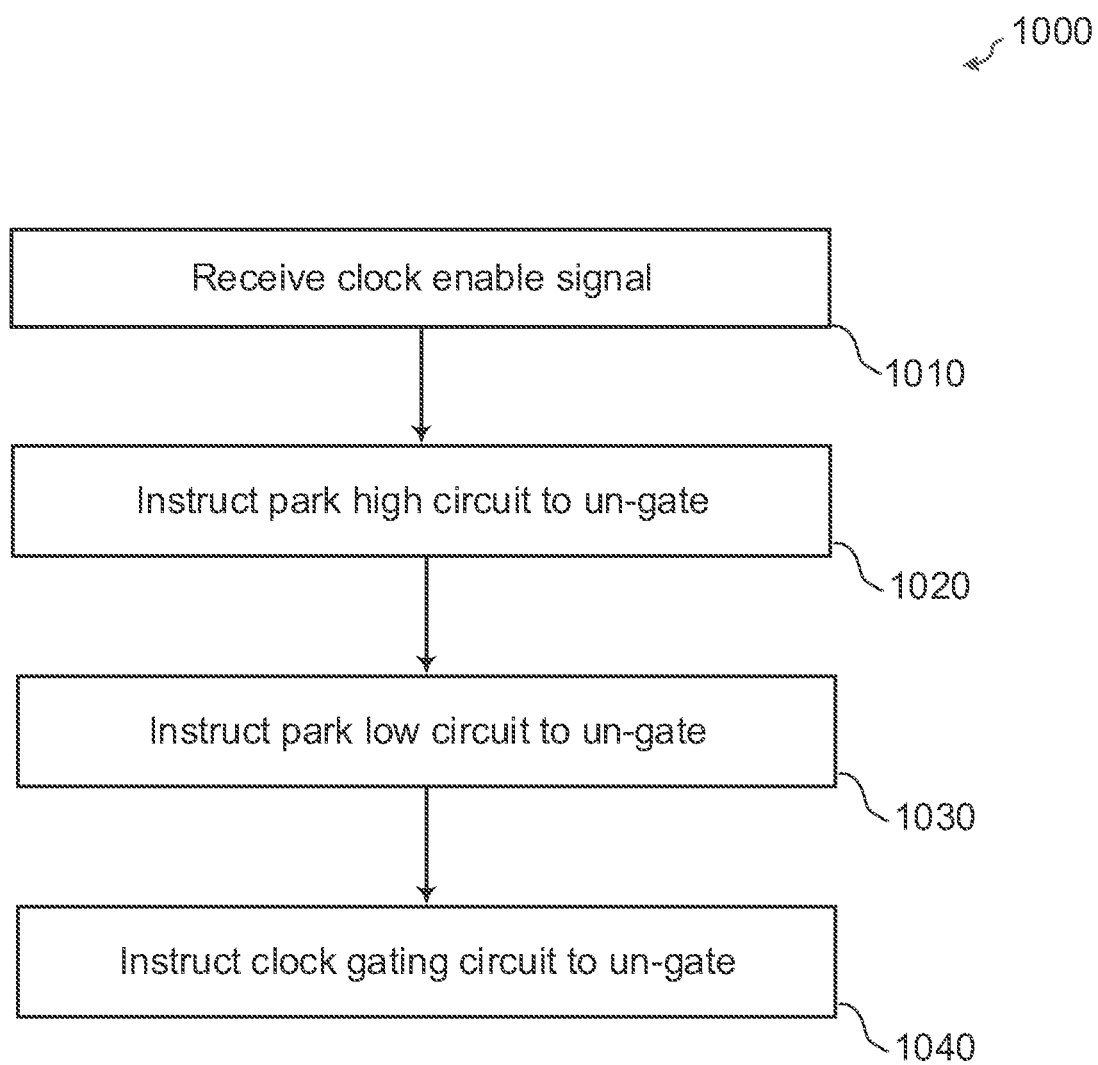
FIG. 10 is a flowchart illustrating an exemplary sequence for transitioning the system to an active mode according to certain aspects of the present disclosure.

FIG. 10 illustrates an exemplary sequence 1000 that may be performed by the system 605 for transitioning to the active mode according to certain aspects. Initially, the clock gating circuit 210 may be gated, the park high circuit 310 may be parked high, and the park low circuit 330 may be parked low. In other words, the system 605 may initially be in the idle mode.

At block 1010, the control circuit 610 receives a clock enable signal at the first input 612 requesting that the clock signal be un-gated (i.e., enabled).

At block 1020, in response to the clock enable signal, the control circuit 610 instructs (i.e., causes) the park high circuit 310 to un-gate (i.e., couple the signal input 312 to the output 314). As a result, the park high circuit 310 becomes transparent in the sense that the park high circuit 310 passes the logic value at the signal input 312 to the output 314. For the example where the output 216 of the clock gating circuit 210 is parked low when the clock signal is gated, the park high circuit 310 passes the park low at the output 216 of the clock gating circuit 210 to the output 314. In certain aspects, the control circuit 610 may instruct the park high circuit 310 to un-gate (i.e., couple the signal input 312 to the output 314) by outputting a logic value to the control input 316 of the park high circuit 310 via the second output 616 that causes the park high circuit 310 to un-gate.

At block 1030, the control circuit 610 instructs (i.e., causes) the park low circuit 330 to un-gate (e.g., couple the signal input 332 to the output 334). In one example, the control circuit 610 may wait until the park low at the output 216 of the clock gating circuit 210 propagates to the park low circuit 330 through the park high circuit 310 before instructing the park low circuit 330 to un-gate such that the park low circuit 330 un-gates when the signal input 332 of the park low circuit 330 is low, which helps prevent a glitch at the output 334. In this example, the control circuit 610 may delay instructing the park low circuit 330 to un-gate by a time delay that provides sufficient time for the park low to propagate to the park low circuit 330. In certain aspects, the control circuit 610 may instruct the park low circuit 330 to un-gate (i.e., couple the signal input 332 to the output 334) by outputting a logic value to the control input 336 of the park low circuit 330 via the third output 618 that causes the park low circuit 330 to un-gate. In this example, the park low circuit 330 may be implemented with a multiplexer (e.g., the second multiplexer 430).

At block 1040, the control circuit 610 instructs (i.e., causes) the clock gating circuit 210 to un-gate via the first output 614. For example, the control circuit 610 may output a logic value to the control input 212 of the clock gating circuit 210 via the first output 614 that causes the un-gate the clock signal.

Figure 11:
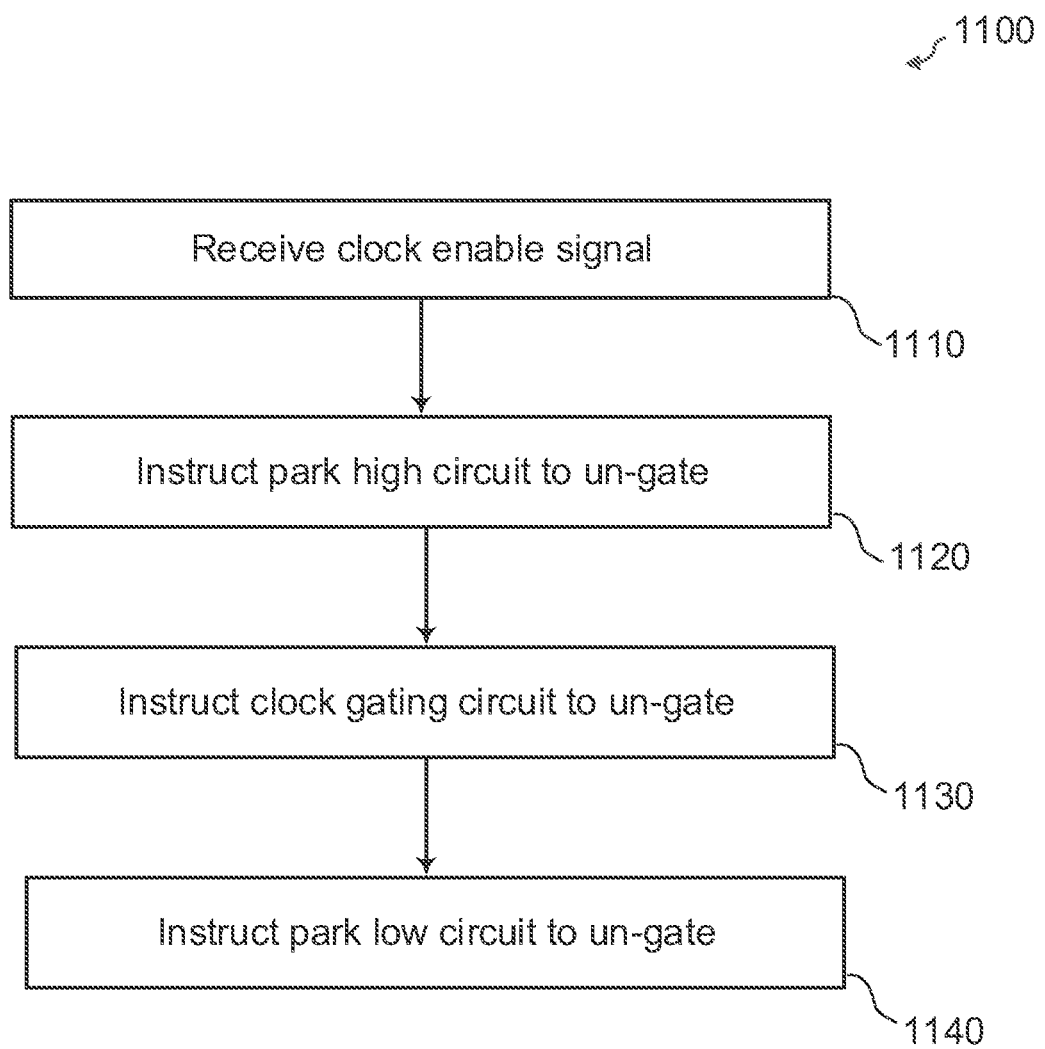
FIG. 11 is a flowchart illustrating another exemplary sequence for transitioning the system to an active mode according to certain aspects of the present disclosure.

It is to be appreciated that aspects of the present disclosure are not limited to the exemplary sequence 1000 shown in FIG. 10. In this regard, FIG. 11 illustrates another exemplary sequence 1100 that may be performed by the system 605 for transitioning to the active mode according to certain aspects. Initially, the clock gating circuit 210 may be gated, the park high circuit 310 may be parked high, and the park low circuit 330 may be parked low. In other words, the system 605 may initially be in the idle mode.

At block 1110, the control circuit 610 receives a clock enable signal at the first input 612 requesting that the clock signal be un-gated (i.e., enabled).

At block 1120, in response to the clock enable signal, the control circuit 610 instructs (i.e., causes) the park high circuit 310 to un-gate (i.e., couple the signal input 312 to the output 314). For example, the control circuit 610 may instruct the park high circuit 310 to un-gate (i.e., couple the signal input 312 to the output 314) by outputting a logic value to the control input 316 of the park high circuit 310 via the second output 616 that causes the park high circuit 310 to un-gate.

At block 1130, the control circuit 610 instructs (i.e., causes) the clock gating circuit 210 to un-gate via the first output 614. For example, the control circuit 610 may output a logic value to the control input 212 of the clock gating circuit 210 via the first output 614 that causes the clock gating circuit 210 to un-gate the clock signal.

At block 1140, the control circuit 610 instructs (i.e., causes) the park low circuit 330 to un-gate (e.g., couple the signal input 332 to the output 334). For example, the control circuit 610 may instruct the park low circuit 330 to un-gate (i.e., couple the signal input 332 to the output 334) by outputting a logic value to the control input 336 of the park low circuit 330 via the third output 618 that causes the park low circuit 330 to un-gate. In this example, the park low circuit 330 may include the park-low gating circuit 548 shown in FIG. 5B to prevent a glitch at the output 334. In this case, the synchronizer 510 and the latch 520 in the park-low gating circuit 548 help ensure that the park low circuit 330 un-gates when the clock signal is low to prevent a glitch, as discussed above. Un-gating the clock gating circuit 210 before un-gating the park low circuit 330 may reduce the latency of providing the clock signal to the circuit 650 when the system 605 transitions to the active mode.

Figure 12:
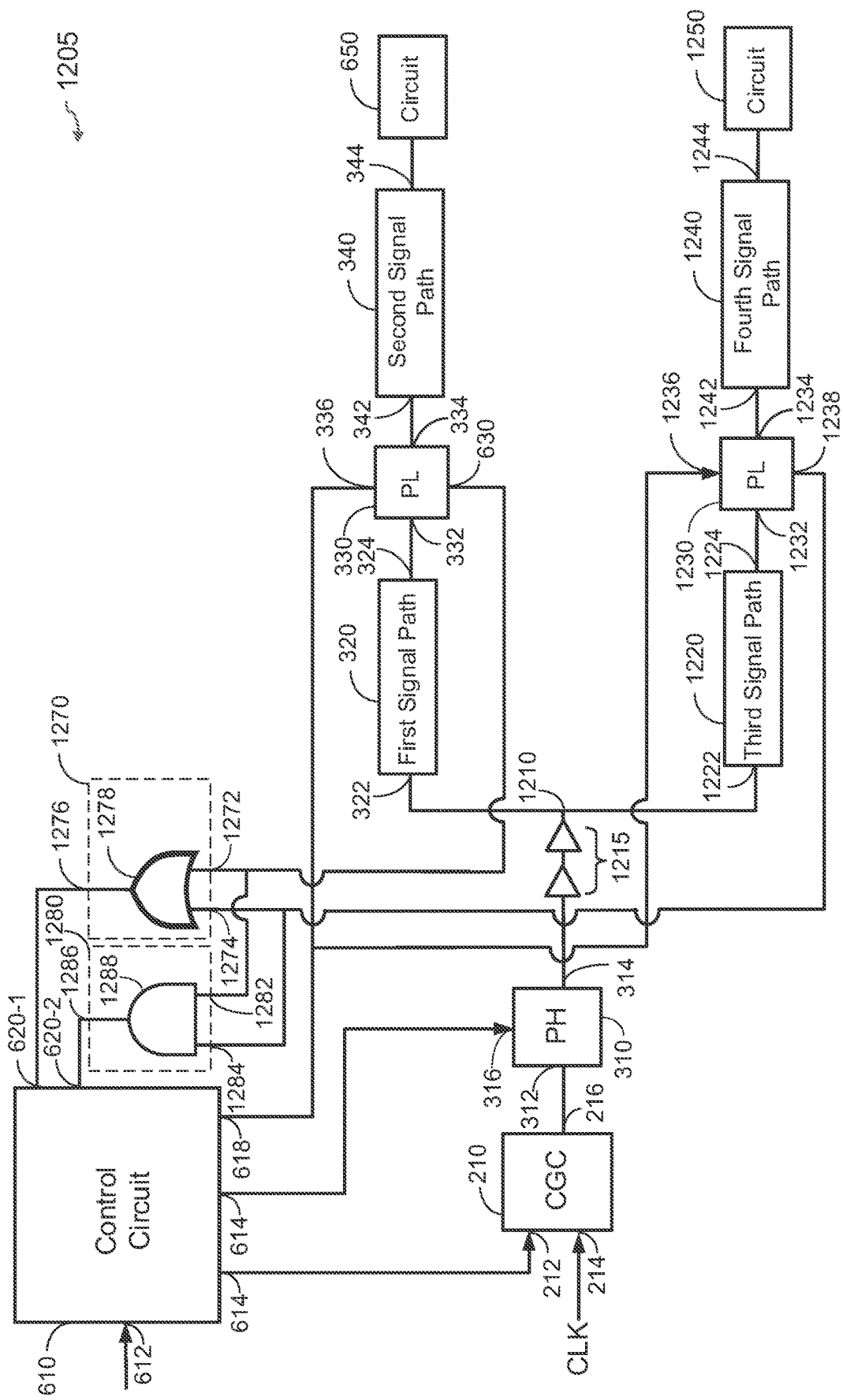
FIG. 12 shows an example of a system including multiple clock branches according to certain aspects of the present disclosure.

As discussed above, aspects of the present disclosure may be extended to a clock distribution system including multiple clock branches (e.g., a clock tree or clock network). In this regard, FIG. 12 shows an example of a system 1205 including multiple branches. For example, the branches may be part of a clock tree used for distributing a clock signal from the clock source 690 (shown in FIG. 6) to multiple circuits. The circuits may include one or more processors, logic gates, registers, retention flops, one or more memories, sequential logic, or any combination thereof.

In this example, the system 1205 includes the clock gating circuit 210, the park high circuit 310, the first signal path 320, the park low circuit 330, the second signal path 340, and the control circuit 610 discussed above with reference to FIG. 6. As discussed above, the control circuit 610 is configured to instruct the clock gating circuit 210 to un-gate (i.e., pass the clock signal) in the active mode, and instruct the clock gating circuit 210 to gate the clock signal in the idle mode. The control circuit 610 is also configured to instruct the park high circuit 310 to un-gate in the active mode, and instruct the park high circuit 310 to park the output 314 high in the idle mode. The control circuit 610 is also configured to instruct the park low circuit 330 to un-gate in the active mode, and instruct the park low circuit 330 to park the output 334 low in the idle mode. In this example, the first signal path 320, the park low circuit 330, and the second signal path 340 may be part of a first clock branch configured to distribute the clock signal to the circuit 650. In the discussion below, the park low circuit 330 is referred to as the first park low circuit and the circuit 650 is referred to as the first circuit.

The system 1205 also include a third signal path 1220, a second park low circuit 1230, and a fourth signal path 1240. The second park low circuit 1230 may be implemented with a park-low gating circuit (e.g., the park-low gating circuit 548), a multiplexer (e.g., the second multiplexer 430), or another circuit. The third signal path 1220 has an input 1222 coupled to the output 314 of the park high circuit 310, and an output 1224. The second park low circuit 1230 has a signal input 1232, an output 1234, a control input 1236, and a status output 1238. The signal input 1232 is coupled to the output 1224 of the third signal path 1220, and the control input 1236 is coupled to the third output 618 of the control circuit 610. The fourth signal path 1240 has an input 1242 coupled to the output 1234 of the second park low circuit 1230, and an output 1244 coupled to a second circuit 1250. The third signal path 1220 and the fourth signal path 1240 may each include delay buffers coupled in series. In this example, the third signal path 1220, the second park low circuit 1230, and the fourth signal path 1240 may be part of a second clock branch configured to distribute the clock signal to the second circuit 1250.

In operation, the control circuit 610 is configured to instruct the second park low circuit 1230 to un-gate (i.e., couple the signal input 1232 and the output 1234) in the active mode, and instruct the second park low circuit 1230 to park the output 1234 low in the idle mode. In one example, the second park low circuit 1230 may be configured to un-gate when the first logic value is input to the control input 1236, and park low when the second logic value is input to the control input 1236. In this example, the control circuit 610 may instruct the second park low circuit 1230 to un-gate by inputting the first logic value to the control input 1236 via the third output 618, and instruct the second park low circuit 1230 to park the output 1234 low by inputting the second logic value to the control input 1236 via the third output 618.

In this example, the input 322 of the first signal path 320 and the input 1222 of the third signal path 1220 may be coupled to the output 314 of the park high circuit 310 via a node 1210. The path between the output 314 of the park high circuit 310 and the node 1210 may include one or more delay buffers 1215 coupled in series.

Although two clock branches are shown in the example in FIG. 12, it is to be appreciated that the system 1205 may include one or more additional clock branches not shown in FIG. 12. In other words, aspects the present disclosure may be extended to a system having more than two clock branches.

In the example shown in FIG. 12, the system 1205 further includes a first combiner 1270 having a first input 1272, a second input 1274, and an output 1276. The first input 1272 is coupled to the status output 630 of the first park low circuit 330, the second input 1274 is coupled to a status output 1238 of the second park low circuit 1230, and the output 1276 is coupled to input 620-1 of the control circuit 610. As discussed further below, the first combiner 1270 is configured to combine (i.e., aggregate) status signals from the status outputs 630 and 1238 of the park low circuits 330 and 1230 into a first combined status signal and input the first combined status signal to the input 620-1 of the control circuit 610. In the example shown in FIG. 12, the first combiner 1270 includes an OR gate 1278. However, it is to be appreciated that the first combiner 1270 is not limited to this example, and that the first combiner 1270 may be implemented with another type of logic gate.

In this example, the first combined status signal is zero when all of the status signals from the park low circuits 330 and 1230 are zero. Thus, for the example where a status signal having a logic value of zero indicates that the respective park low circuit is parked low, the first combined status signal is zero when all of the park low circuits 330 and 1230 are parked low. This allows the control circuit 610 to determine that all of the park low circuits 330 and 1230 are parked low when the first combined status signal is zero. In an alternative implementation, a status signal having a logic value of zero may indicate that the respective park low circuit is un-gated. In this example, the control circuit 610 may determine that all of the park low circuits 330 and 1230 are un-gated when the first combined status signal is zero.

In this example, the system 1205 further includes a second combiner 1280 having a first input 1282, a second input 1284, and an output 1286. The first input 1282 is coupled to the status output 630 of the first park low circuit 330, the second input 1284 is coupled to the status output 1238 of the second park low circuit 1230, and the output 1286 is coupled to input 620-2 of the control circuit 610. As discussed further below, the second combiner 1280 is configured to combine (i.e., aggregate) status signals from the status outputs 630 and 1238 of the park low circuits 330 and 1230 into a second combined status signal and input the second combined status signal to the input 620-2 of the control circuit 610. In the example shown in FIG. 12, the second combiner 1280 includes an AND gate 1288. However, it is to be appreciated that the second combiner 1280 is not limited to this example, and that the second combiner 1280 may be implemented with another type of logic gate.

In this example, the second combined status signal is one when all of the status signals from the park low circuits 330 and 1230 are one. Thus, for the example where a status signal having a logic value of one indicates that the respective park low circuit is un-gated, the second combined status signal is one when all of the park low circuits 330 and 1230 are un-gated. This allows the control circuit 610 to determine that all of the park low circuits 330 and 1230 are un-gated when the second combined status signal is one. In an alternative implementation, a status signal having a logic value of one may indicate that the respective park low circuit is parked low. In this example, the control circuit 610 to determine that all of the park low circuits 330 and 1230 are parked low when the second combined status signal is one.

Thus, the control circuit 610 may use the first combined status signal and the second combined status signal to determined when all of the park low circuits 330 and 1230 are parked low or when all of the park low circuits 330 and 1230 are un-gated. Although two park low circuits (i.e., park low circuits 330 and 1230) are shown in the example in FIG. 12, it is to be appreciated that the first combiner 1270 and the second combiner 1280 may be extended to a system with more than two park low circuits to determine the status of more than two park low circuits.

In certain aspects, the control circuit 610 may be configured to control sequencing of the clock gating circuit 210, the park high circuit 310, the first park low circuit 330, and the second park low circuit 1230 during a transition to the idle mode and/or a transition to the active mode. In one example, the control circuit 610 may transition to the idle mode based on the exemplary sequence 700 shown in FIG. 7. In this example, at block 720, the control circuit 610 may instruct the first park low circuit 330 to park the output 334 low and instruct the second park low circuit 1230 to park the output 1234 low. Since the control inputs 336 and 1236 of the park low circuits 330 and 1230 are coupled to the third output 618 of the control circuit 610 in the example in FIG. 12, the control circuit 610 may instruct all of the park low circuits 330 and 1230 to park low by outputting a logic value at the third output 618 that causes all of the park low circuits 330 and 1230 to park low. In one example, the control circuit 610 may instruct the park high circuit 310 to park high at block 730 after determining that all of the park low circuits 330 and 1230 have parked low based on the first combined status signal or the second combined status signal, as discussed above.

In another example, the control circuit 610 may transition to the idle mode based on the exemplary sequence 900 shown in FIG. 9. In this example, at block 930, the control circuit 610 may instruct the first park low circuit 330 to park the output 334 low and instruct the second park low circuit 1230 to park the output 1234 low. Since the control inputs 336 and 1236 of the park low circuits 330 and 1230 are coupled to the third output 618 of the control circuit 610 in the example in FIG. 12, the control circuit 610 may instruct all of the park low circuits 330 and 1230 to park low by outputting a logic value at the third output 618 that causes all of the park low circuits 330 and 1230 to park low. In one example, the control circuit 610 may instruct the park high circuit 310 to park high at block 940 after determining that all of the park low circuits 330 and 1230 have parked low based on the first combined status signal or the second combined status signal, as discussed above.

In one example, the control circuit 610 may transition to the active mode based on the exemplary sequence 1000 shown in FIG. 10. In this example, at block 1030, the control circuit 610 may instruct the first park low circuit 330 to un-gate and instruct the second park low circuit 1230 to un-gate. Since the control inputs 336 and 1236 of the park low circuits 330 and 1230 are coupled to the third output 618 of the control circuit 610 in the example in FIG. 12, the control circuit 610 may instruct all of the park low circuits 330 and 1230 to un-gate by outputting a logic value at the third output 618 that causes all of the park low circuits 330 and 1230 to un-gate.

In one example, the control circuit 610 may transition to the active mode based on the exemplary sequence 1100 shown in FIG. 11. In this example, at block 1140, the control circuit 610 may instruct the first park low circuit 330 to un-gate and instruct the second park low circuit 1230 to un-gate. In the example in FIG. 12, the control circuit 610 may instruct all of the park low circuits 330 and 1230 to un-gate by outputting a logic value at the third output 618 that causes all of the park low circuits 330 and 1230 to un-gate, as discussed above.

It is to be appreciated that the exemplary sequences 700, 900, 1000, and 1100 are not limited two clock branches, and that the sequences 700, 900, 1000, and 1100 may be extended to a system including more than two clock branches.

Figure 13A:
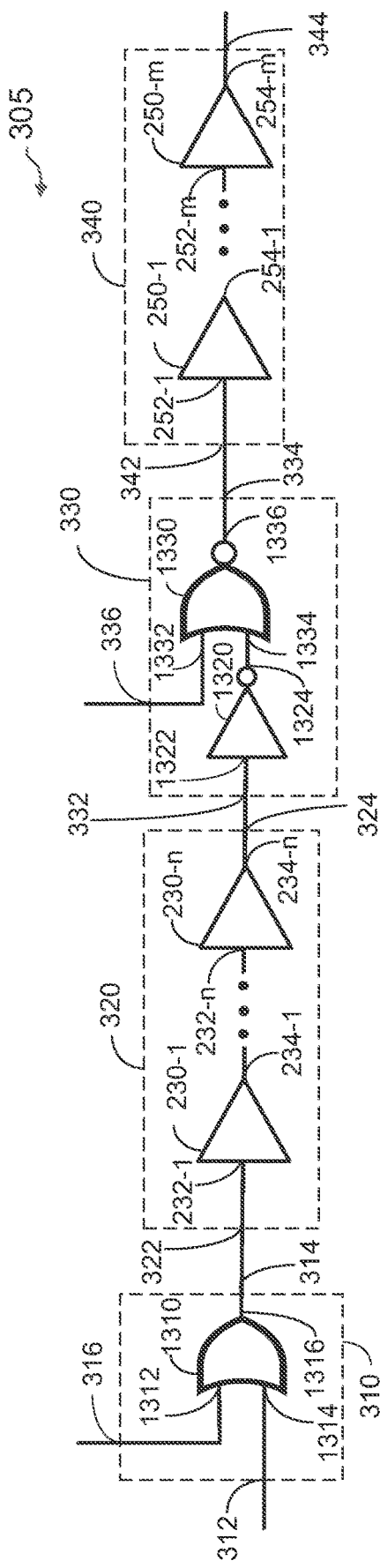
FIG. 13A shows an exemplary implementation of a park low circuit and a park high circuit according to certain aspects of the present disclosure.

FIG. 13A shows an exemplary implementation of the park high circuit 310 and the park low circuit 330 according to certain aspects. In one example, the signal input 312 of the park high circuit 310 may be coupled to the output 216 of the clock gating circuit 210 (not shown in FIG. 13A). In another example, the clock gating circuit 210 may be omitted with the park high circuit 310 performing the function of a clock gating circuit. The output 344 of the second signal path 340 may be coupled to the circuit 650 discussed above.

In this example, the park high circuit 310 includes an OR gate 1310 having a first input 1312 coupled to the control input 316, a second input 1314 coupled to the signal input 312, and an output 1316 coupled to the output 314. In this example, a logic value of zero is input to the control input 316 to un-gate the park high circuit 310. This is because the zero at the first input 1312 of the OR gate 1310 causes the OR gate 1310 to pass the clock signal at the second input 1314 of the OR gate 1310 to the output 1316 of the OR gate 1310. A logic value of one is input to the control input 316 to park the output 314 of the park high circuit 310 high. This is because the one at the first input 1312 of the OR gate 1310 causes the OR gate 1310 to output a one at the output 1316 of the OR gate 1310 regardless of the logic value at the second input 1314 of the OR gate 1310.

In this example, the park low circuit 330 includes an inverter 1320 and a NOR gate 1330.

The input 1322 of the inverter 1320 is coupled to the signal input 332. The NOR gate 1330 has a first input 1332 coupled to the control input 336, a second input 1334 coupled to the output 1324 of the inverter 1320, and an output 1336 coupled to the output 334. Thus, in this example, the second input 1334 of the NOR gate 1330 is coupled to the signal input 332 via the inverter 1320. In this example, a logic value of zero is input to the control input 336 to un-gate the park low circuit 330. This is because the zero at the first input 1332 of the NOR gate 1330 causes the NOR gate 1330 to function as an inverter coupled in series with the inverter 1320. As a result, the inverter 1320 and the NOR gate 1330 pass the clock signal at the 332 to the output 334. A logic value of one is input to the control input 336 to park the output 334 of the park low circuit 330 low. This is because the one at the first input 1332 of the NOR gate 1330 causes the NOR gate 1330 to output a zero at the output 1336 of the NOR gate 1330 regardless of the logic value at the second input 1334 of the NOR gate 1330, which effectively gates the park low circuit 330.

Figure 13B:
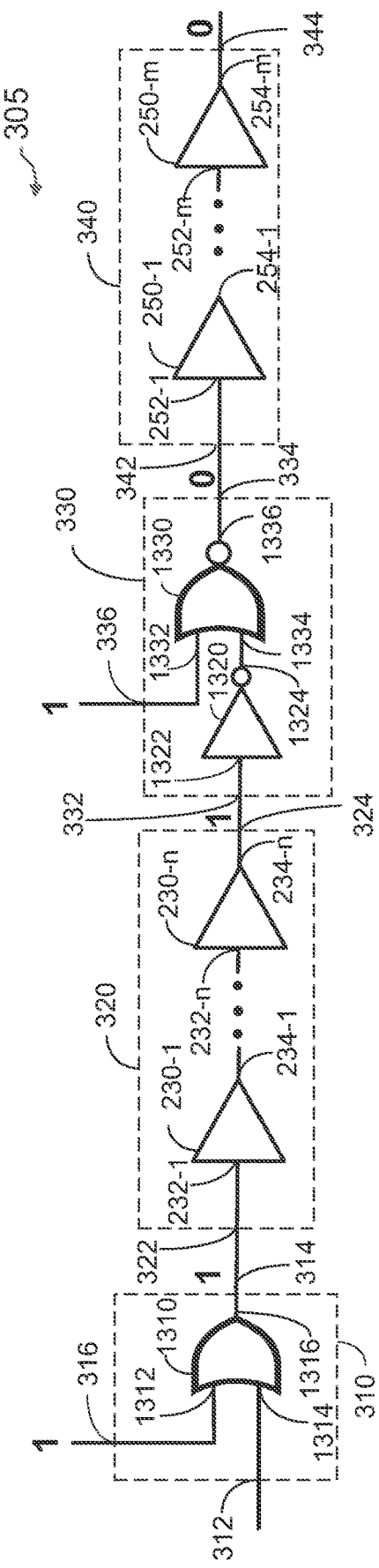
FIG. 13B shows an example of logic states in a system including the park low circuit and the park high circuit of FIG. 13A according to certain aspects of the present disclosure.

FIG. 13B shows an example of logic states at various locations of the system 305 in the idle mode according to certain aspects. In this example, a one is input to the control input 316 of the park high circuit 310 to park the output 314 of the park high circuit 310 high (i.e., one), and a one is input to the control input 336 of the park low circuit 330 to park the output 334 of the park low circuit 330 low (i.e., zero). In this example, the first signal path 320 has an even number of delay buffers 230-1 to 230-n and the second signal path 340 has an even number of delay buffers 250-1 to 250-m, in which the total number of delay buffers 230-1 to 230-n and 250-1 to 250-m is even. As a result, the logic state (i.e., logic value) at the output 324 of the first signal path 320 is one, and the logic state at the output 344 of the second signal path 340 is zero. However, it is to be appreciated that the present disclosure is not limited to this example.

Figure 14A:
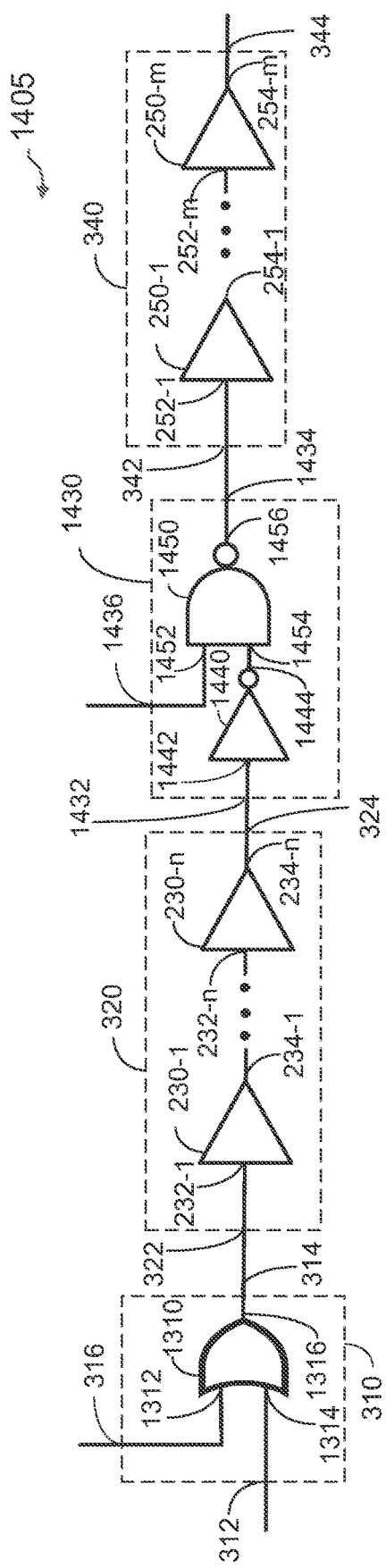
FIG. 14A shows an exemplary implementation of a first park high circuit and a second park high circuit according to certain aspects of the present disclosure.

It is to be appreciated that aspects of the present disclosure are not limited to an even number of delay buffers in the first signal path 320 and an even number of delay buffers in the second signal path 340. In this regard, FIG. 14A shows an exemplary implementation of a system 1405 that can be used for the case where the number of delay buffers 230-1 to 230-*n* in the first signal path 320 is odd and the number of delay buffers 250-1 to 250-*m* in the second delay path 240 is odd. The system 1405 may be used, for example, to distribute the clock signal from the clock source 690 to the circuit 650 (not shown in FIG. 14A) coupled to the output 344 of the second signal path 340. In this example, the system 1405 includes the park high circuit 310, the first signal path 320, and the second signal path 340 discussed above. The system 1405 also includes a second park high circuit 1430 in place of the park low circuit 330. In the discussion below, the park high circuit 310 is referred to as the first park high circuit 310.

In one example, the signal input 312 of the first park high circuit 310 may be coupled to the output 216 of the clock gating circuit 210 (not shown in FIG. 14A). In another example, the clock gating circuit 210 may be omitted with the first park high circuit 310 performing the function of a clock gating circuit.

In the example shown in FIG. 14A, the first park high circuit 310 includes the OR gate 1310 discussed above with reference to 13A. However, it is to be appreciated that the first park high circuit 310 is not limited to this example, and that the first park high circuit 310 may be implemented with a different type of logic gate or another one of the other exemplary implementations discussed above.

In this example, the second park high circuit 1430 includes an inverter 1440 and a NAND gate 1450. The input 1442 of the inverter 1440 is coupled to the signal input 1432 of the second park high circuit 1430. The NAND gate 1450 has a first input 1452 coupled to the control input 1436 of the second park high circuit 1430, a second input 1454 coupled to the output 1444 of the inverter 1440, and an output 1456 coupled to the output 1434 of the second park high circuit 1430. Thus, in this example, the second input 1454 of the NAND gate 1450 is coupled to the signal input 1432 via the inverter 1440. In this example, a logic value of one is input to the control input 1436 to un-gate the second park high circuit 1430. This is because the one at the first input 1452 of the NAND gate 1450 causes the NAND gate 1450 to function as an inverter coupled in series with the inverter 1440. As a result, the inverter 1440 and the NAND gate 1450 pass the clock signal at the signal input 1432 to the output 1434. A logic value of zero is input to the control input 1436 to park the output 1434 of the second park high circuit 1430 high. This is because the zero at the first input 1452 of the NAND gate 1450 causes the NAND gate 1450 to output a one at the output 1456 of the NAND gate 1450 regardless of the logic value at the second input 1454 of the NAND gate 1450, which effectively gates the second park high circuit 1430.

In certain aspects, the control input 1436 may be coupled to the control circuit 610 to allow the control circuit 610 to control the second park high circuit 1430. In these aspects, the control circuit 610 may un-gate the second park high circuit 1430 in the active mode and park the output 1434 of the second park high circuit 1430 high in the idle mode.

It is to be appreciated that the first park high circuit 310 and the second park high circuit 1430 are not limited to the exemplary implementations shown in FIG. 14A. For example, in another implementation, the second park high circuit 1430 may be implemented with an OR gate and/or the first park high circuit 310 may be implemented with an inverter and a NAND gate.

Figure 14B:
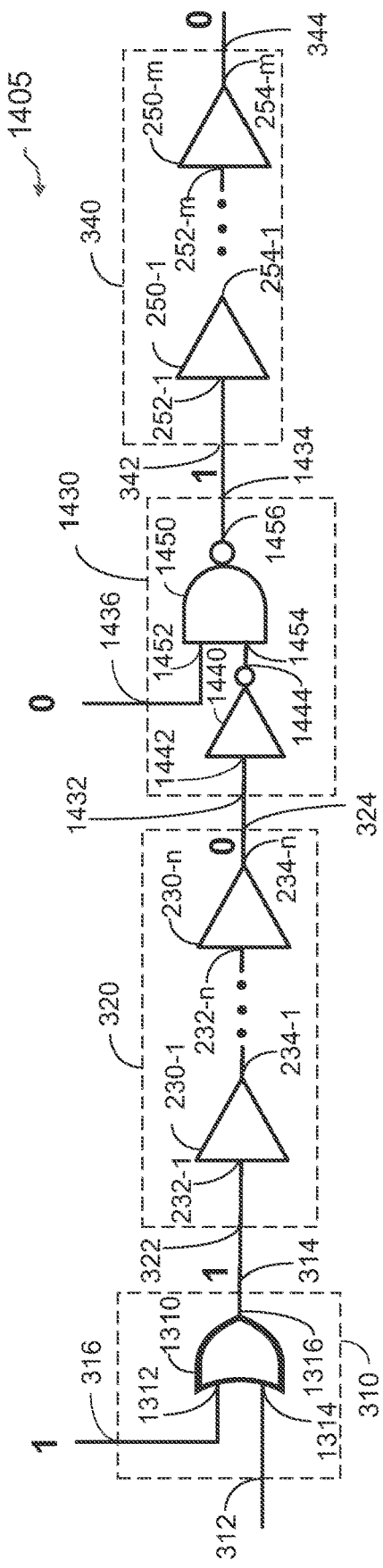
FIG. 14B shows an example of logic states in a system including the first park high circuit and the second park high circuit of FIG. 14A according to certain aspects of the present disclosure.

FIG. 14B shows an example of logic states at various locations of the system 1405 in the idle mode according to certain aspects. In this example, a one is input to the control input 316 of the first park high circuit 310 to park the output 314 of the first park high circuit 310 high (i.e., one), and a zero is input to the control input 1436 of the second park high circuit 1430 to park the output 1434 of the second park high circuit 1430 high (i.e., one). In this example, the first signal path 320 has an odd number of delay buffers 230-1 to 230-*n* and the second signal path 340 has an odd number of delay buffers 250-1 to 250-*m*, in which the total number of delay buffers 230-1 to 230-*n* and 250-1 to 250-*m* is even. As a result, the logic state (i.e., logic value) at the input 322 of the first signal path 320 is one and the logic state at the output 324 of the first signal path 320 is zero. Also, the logic state at the input 342 of the second signal path 340 is one and the logic state at the output 344 of the second signal path 340 is zero. However, it is to be appreciated that the present disclosure is not limited to this example.

In this example, the second park high circuit 1430 mitigates asymmetric aging by making the logic state at the input 342 of the second signal path 340 different from the logic state at the output 324 of the first signal path 320. In the example in FIG. 14B, the logic state at the input 342 of the second signal path 340 is one and the logic state at the output 324 of the first signal path 320 is zero. This inverts the aging path in the second signal path 340 with respect to the aging path in the first signal path 320, which causes the duty-cycle distortion in the second signal path 340 to move in the opposite direction as the duty-cycle distortion in the first signal path 320, thereby canceling at least a portion of the duty-cycle distortion in the first signal path 320.

It is to be appreciated that the second park high circuit 1430 is not limited to the exemplary implementation shown in FIGS. 14A and 14B, and that the second park high circuit 1430 may be implemented with a different type of logic gate or another one of the other exemplary implementations for a park high circuit discussed above.

Figure 15A:
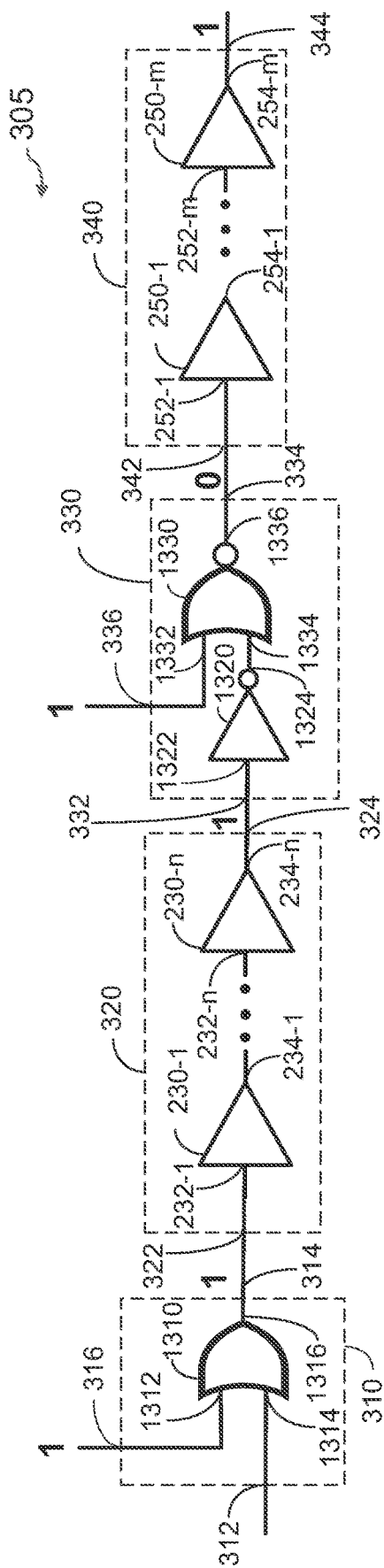
FIG. 15A shows an example of a system including a first signal path with an even number of delay buffers and a second signal path with an odd number of delay buffers according to certain aspects of the present disclosure.

Aspects of the present disclosure may also be used in cases where the number of delay buffers 230-1 to 230-*n* in the first signal path 320 is even, the number of delay buffers 250-1 to 250-*m* is odd (i.e., n is even and m is odd), and the total number of delay buffers 230-1 to 230-*n* and 250-1 to 250-*m* is odd. As example of this is illustrated in FIG. 15A using the exemplary implementation shown in FIG. 13A. FIG. 15A shows an example of logic states at various locations of the system 1305 in the idle mode for the case where the number of delay buffers 230-1 to 230-*n* in the first signal path 320 is even and the number of delay buffers 250-1 to 250-*m* is odd. In this example, a one is input to the control input 316 of the first park high circuit 310 to park the output 314 of the park high circuit 310 high (i.e., one), and a one in input to the control input 336 of the park low circuit 330 to park the output 334 of the park low circuit 330 low. In this example, the logic state at the input 322 of the first signal path 320 is one and the logic state at the output 324 of the first signal path 320 is also one. Also, the logic state at the input 342 of the second signal path 340 is zero and the logic state at the output 344 of the second signal path 340 is one. The logic state at the output 344 of the second signal path 340 is one because the number of delay buffers 250-1 to 250-*m* in the second signal path 340 is odd in this example.

In this example, the park low circuit 330 mitigates asymmetric aging by making the logic state at the input 342 of the second signal path 340 different from the logic state at the output 324 of the first signal path 320. This inverts the aging path in the second signal path 340 with respect to the aging path in the first signal path 320, which causes the duty-cycle distortion in the second signal path 340 to move in the opposite direction as the duty-cycle distortion in the first signal path 320, thereby canceling at least a portion of the duty-cycle distortion in the first signal path 320.

Figure 15B:
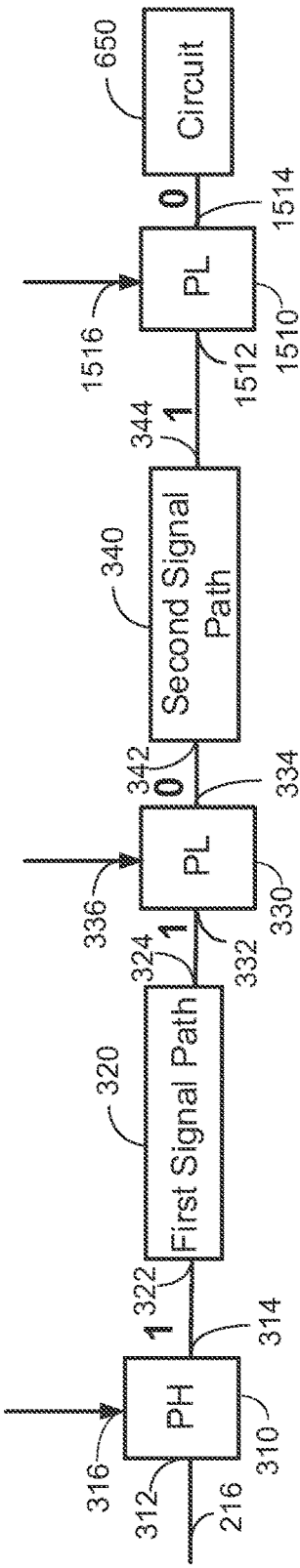
FIG. 15B shows an example of a park low circuit coupled between the output of the second signal path of FIG. 15A and a circuit according to certain aspects of the present disclosure.

In this example, the logic state at the output 344 of the second signal path 340 is one in the idle mode. In some cases, it is desirable for the clock input of the circuit 650 to be low (i.e., zero) in the idle mode. In these cases, a park low circuit 1510 may be inserted between the output 344 of the second signal path 340 and the circuit 650 to isolate the circuit 650 from the one at the output 344 of the second signal path 340 in the idle mode, an example of which is shown in FIG. 15B. The park low circuit 1510 has an input 1512 coupled to the output 344 of the second signal path 340, an output 1514 coupled to the circuit 650, and a control input 1516, which may be coupled to the control circuit 610 (not shown in FIG. 15B). In this example, the control circuit 610 may un-gate the park low circuit 1510 in the active mode and park the output 1514 of the park low circuit 1510 low in the idle mode. The park low circuit 1510 may be implemented with any one of the exemplary implementations for a park low circuit discussed above.

Figure 16:
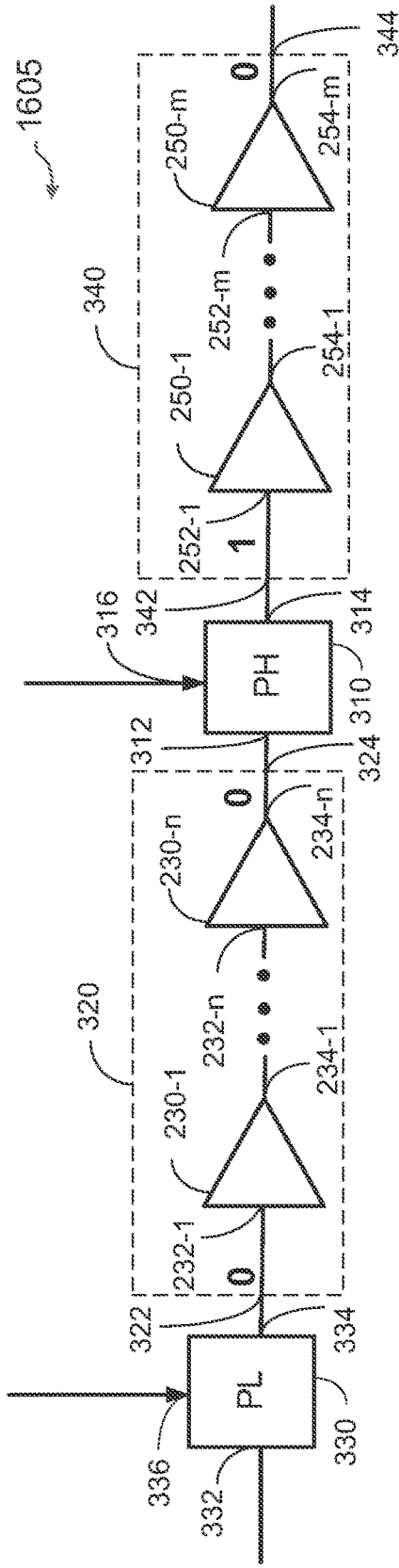
FIG. 16 shows another example of a system including a first signal path with an even number of delay buffers and a second signal path with an odd number of delay buffers according to certain aspects of the present disclosure.

FIG. 16 shows another example in which the number of delay buffers 230-1 to 230-n in the first signal path 320 is even and the number of delay buffers 250-1 to 250-m is odd (i.e., n is even and m is odd). In this example, the positions of the park low circuit 330 and the park high circuit 310 are switched, in which the output 334 of the park low circuit 330 is coupled to the input 322 of the first signal path 320, the signal input 312 of the park high circuit 310 is coupled to the output 324 of the first signal path 320, and the output 314 of the park high circuit 310 is coupled to the input 342 of the second signal path 340. Thus, in this example, the input 322 of the first signal path 320 is parked low in the idle mode, and the input 342 of the second signal path 340 is parked high in the idle mode.

The park low circuit 330 may be implemented with any one of the exemplary implementations discussed above and the park high circuit 310 may be implemented with any one of the exemplary implementations discussed above.

In one example, the signal input 332 of the park low circuit 330 may be coupled to the output 216 of the clock gating circuit 210 (not shown in FIG. 16). In another example, the clock gating circuit 210 may be omitted with the park low circuit 330 performing the function of a clock gating circuit. In this example, the signal input 332 of the park low circuit 330 may be coupled to the clock source 690 (shown in FIG. 6). The output 344 of the second signal path 340 may be coupled to the circuit 650 discussed above.

FIG. 16 shows an example of logic states at various locations of the system 1605 in the idle mode for the case where the number of delay buffers 230-1 to 230-n in the first signal path 320 is even and the number of delay buffers 250-1 to 250-m is odd. In this example, the logic state at the input 322 of the first signal path 320 is zero and the logic state at the output 324 of the first signal path 320 is also zero. Also, the logic state at the input 342 of the second signal path 340 is one and the logic state at the output 344 of the second signal path 340 is zero. The logic state at the output 344 of the second signal path 340 is zero because the number of delay buffers 250-1 to 250-m in the second signal path 340 is odd is in this example.

Figure 17:
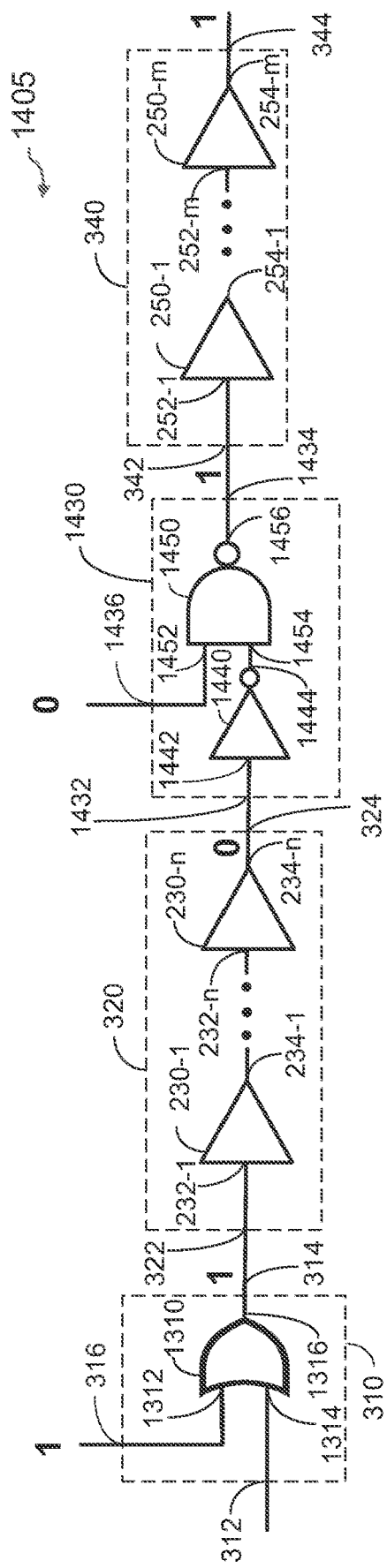
FIG. 17 shows an example of a system including a first signal path with an odd number of delay buffers and a second signal path with an even number of delay buffers according to certain aspects of the present disclosure.

Aspects of the present disclosure may also be used in cases where the number of delay buffers 230-1 to 230-n in the first signal path 320 is odd, the number of delay buffers 250-1 to 250-m is even (i.e., n is odd and m is even), and the total number of delay buffers 230-1 to 230-n and 250-1 to 250-m is odd. As example of this is illustrated in FIG. 17 using the exemplary implementation shown in FIG. 14A. FIG. 17 shows an example of logic states at various locations of the system 1405 in the idle mode for the case where the number of delay buffers 230-1 to 230-n in the first signal path 320 is odd and the number of delay buffers 250-1 to 250-m in the second signal path 340 is even. In this example, a one is input to the control input 316 of the first park high circuit 310 to park the output 314 of the park high circuit 310 high (i.e., one), and a zero is input to the control input 1436 of the second park high circuit 1430 to park the output 1434 of the park high circuit 1430 high (i.e., one). In this example, the logic state at the input 322 of the first signal path 320 is one and the logic state at the output 324 of the first signal path 320 is zero. This is because the number of delay buffers 230-1 to 230-n in the first signal path 320 is odd in this example. The logic state at the input 342 of the second signal path 340 is one and the logic state at the output 344 of the second signal path 340 is one. This is because the number of delay buffers 250-1 to 250-m in the second signal path 340 is even in this example.

In this example, the logic state at the output 344 of the second signal path 340 is one in the idle mode. For cases where it is desirable for the clock input of the circuit 650 to be low (i.e., zero) in the idle mode, the park low circuit 1510 shown in FIG. 15B may be inserted between the output 344 of the second signal path 340 and the circuit 650 to isolate the circuit 650 from the one at the output 344 of the second signal path 340 in the idle mode, as discussed above.

Thus, aspects of the present disclosure mitigate duty-cycle distortion due to asymmetric aging by inverting the aging path in the second signal path 340 with respect to the aging path in the first signal path 320. This causes the duty-cycle distortion in the second signal path 340 to move in the opposite direction as the duty-cycle distortion in the first signal path 320 such that the duty-cycle distortion in the second signal path 340 cancels at least a portion of the duty-cycle distortion in the first signal path 320. As discussed above, the aging path in the second signal path 340 may be inverted with respect to the aging path in the first signal path 320 using various combinations of park low circuit(s) and/or park high circuit(s).

Figure 18A:
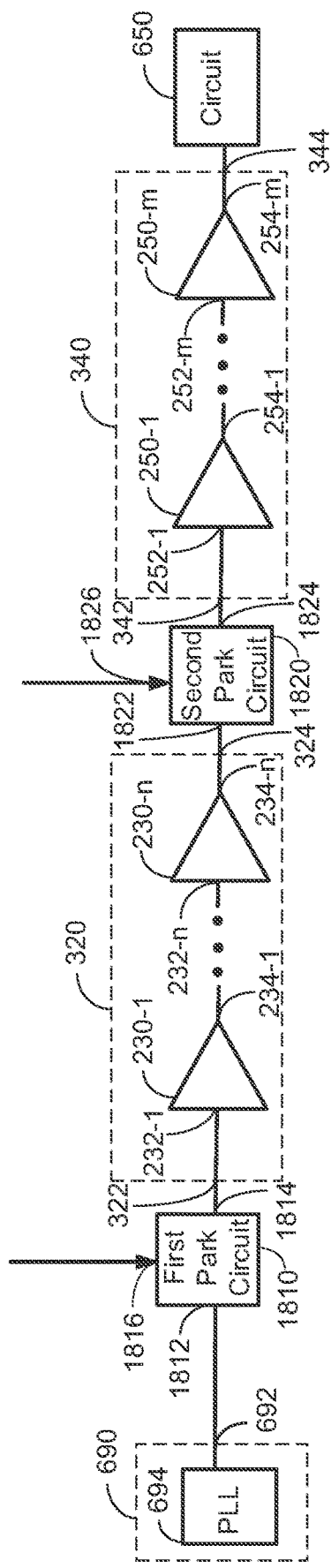
FIG. 18A shows an example of a system including a first park circuit and a second park circuit according to certain aspects of the present disclosure.

In this regard, FIG. 18A shows an exemplary system 1805 generalizing the exemplary systems discussed above according to various aspects of the present disclosure. The system 1805 includes the first signal path 320, the second signal path 340, the clock source 690, and the circuit 650 discussed above. The system 1805 also includes a first park circuit 1810 and a second park circuit 1820. As used herein, a "park circuit" is a circuit having a signal input, an output, and a control input, in which the circuit is configured to receive a control signal at the control input, un-gate (i.e., pass a signal between the signal input and the output) if the control signal has a first value (e.g., first logic value), and park the output low or high if the control signal has a second control value (e.g., second logic value), or vice versa. A "park low circuit" is a "park circuit" that is configured to park the output low and a "park high circuit" is a "park circuit" that is configured to park the output high. Each of the first value and the second value may include one or more bits.

Although not shown in FIG. 18A, it is to be appreciated that the system 1805 may include a park low circuit (e.g., park low circuit 1510) between the output 344 of the second signal path 340 and the circuit 650 in some implementations. For example, this may be done for cases where the output 344 of the second signal path 340 is one in the idle mode and it is desirable for the input of the circuit 650 to be zero in the idle mode.

The first park circuit 1810 has a signal input 1812 coupled to the output 692 of the clock source 690, an output 1814 coupled to the input 322 of the first signal path 320, and a control input 1816. Although not shown in FIG. 18A, it is to be appreciated that the system 1805 may include a clock gating circuit (e.g., clock gating circuit 210) between the clock source 690 and the first park circuit 1810 in some implementations. In certain aspects, the first park circuit 1810 is configured to un-gate (i.e., couple the signal input 1812 and the output 1814) if the control signal at the control input 1816 has the first value (e.g., the first logic value), and park the output 1814 low or high if the control signal at the control input 1816 has the second value (e.g., the second logic value).

The second park circuit 1820 has a signal input 1822 coupled to the output 324 of the first signal path 320, an output 1824 coupled to the input 342 of the second signal path 340, and a control input 1826. In certain aspects, the second park circuit 1820 is configured to un-gate (i.e., couple the input signal 1822 and the output 1824) if the control signal at the control input 1826 has the first value (e.g., the first logic value), and park the output 1824 low or high if the control signal at the control input 1826 has the second value (e.g., the second logic value), or vice versa.

In the examples shown in FIG. 3A, 3B, 4A, 4B, 4C, 6, 12, 13A, 13B, 15A, and 15B, the first park circuit 1810 includes the park high circuit 310 and the second park circuit 1820 includes the park low circuit 330. In the examples shown in FIGS. 14A, 14B and 17, the first park circuit 1810 includes the park high circuit 310 and the second park circuit includes the second park high circuit 1430. In the examples shown in FIG. 3C and FIG. 16, the first park circuit 1810 includes the park low circuit 330 and the second park circuit 1820 includes the park high circuit 310. A park high circuit may be implemented with any one of the exemplary implementations discussed above, and a park low circuit may be implemented with any one of the exemplary implementations discussed above.

As discussed above, the first signal path 320 may include an even number of delay buffers 230-1 to 230-n or an odd number of delay buffers 230-1 to 230-n, and the second signal path 340 may include an even number of delay buffers 250-1 to 250-m or an odd number of delay buffers 250-1 to 250-m.

As discussed above, the second park circuit 1820 mitigates asymmetric aging by inverting the aging path in the second signal path 340 with respect to the aging path in the first signal path 320. To do this, the second park circuit 1820 may be configured to park the output 1824 at a logic value (i.e., state) that is the opposite of the logic value at the output 324 of the first signal path 320. For instance, in the example in FIG. 3B, the second park circuit 1820 includes the park low circuit 330 which parks the input 342 of the second signal path 340 low, which is the inverse of the logic value (i.e., one) at the output 324 of the first signal path 320 in this example. In the example in FIG. 14B, the second park circuit 1820 includes the second park high circuit 1430 which parks the input 342 of the second signal path 340 high, which is the inverse of the logic value (i.e., zero) at the output 324 of the first signal path 320 in this example.

Figure 18B:
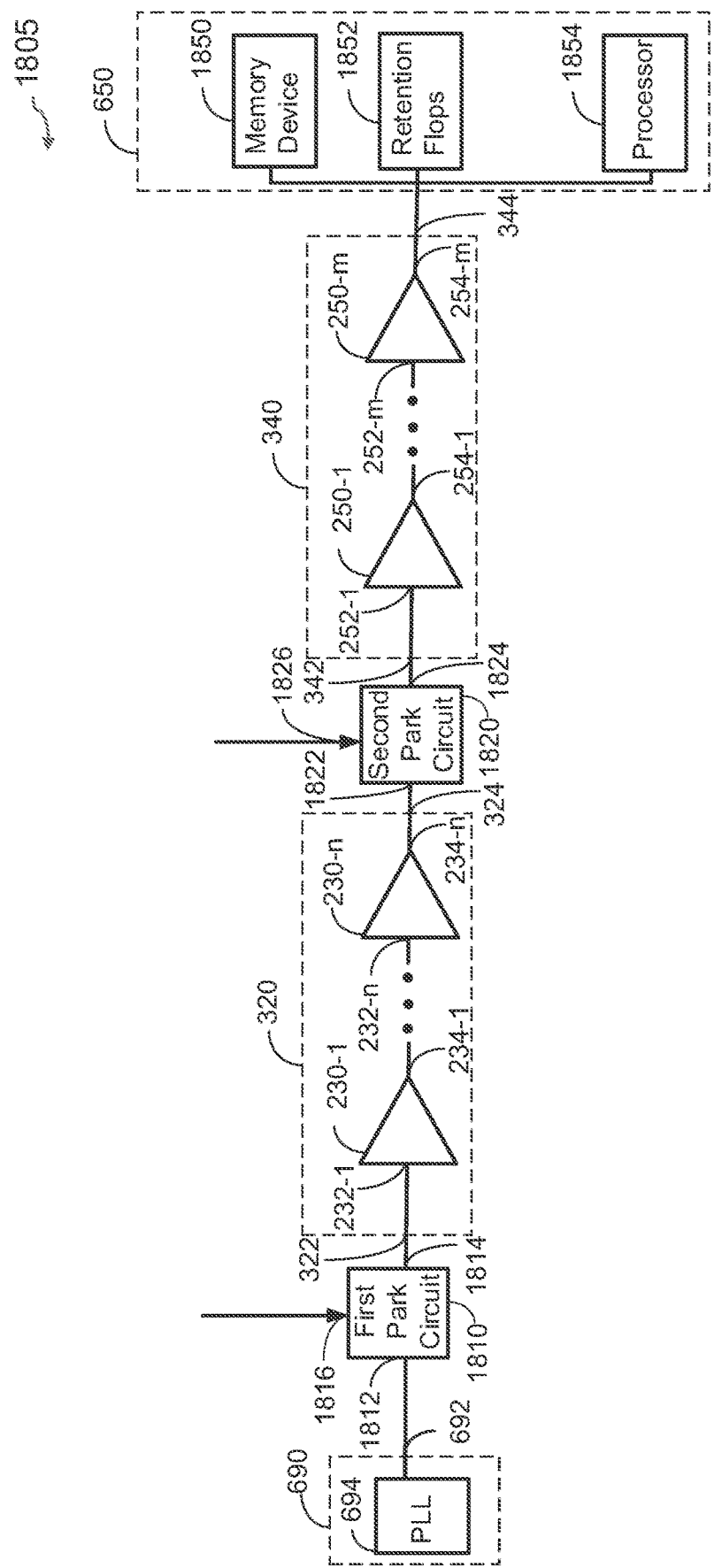
FIG. 18B shows an example of one of more circuits that may be included in the exemplary system 1805 shown in FIG. 18A according to certain aspects of the present disclosure.

FIG. 18B shows an example of one or more circuits that may be included in the circuit 650. In this example, the circuit 650 may include at least one of a memory device 1850, retention flops 1852, or a processor 1854. The memory device 1850 may include a dynamic random-access memory (DRAM), a static random-access memory (SRAM), flash memory, or another type of memory. The retention flops 1852 may include flip-flops configured to retain logic states in the circuit 650 when the clock signal is gated. The processor 1854 may include a central processing unit (CPU) core, a digital processor, or another type of processor.

Figure 19:
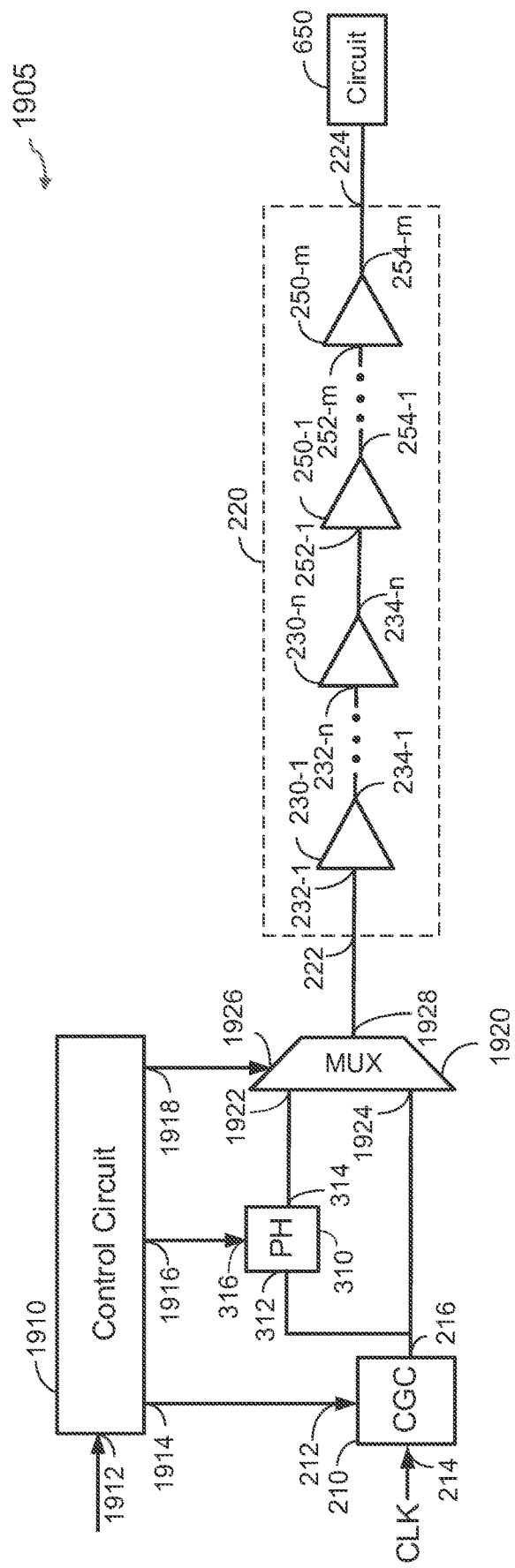
FIG. 19 shows an example of a system including a multiplexer for alternating an input of a signal path between low and high over multiple idle periods according to certain aspects of the present disclosure.

In certain aspects, the input of a signal path is alternately parked low and high over multiple idle periods to balance the aging of devices (e.g., transistors) in the signal path, and thus mitigate duty-cycle distortion due to asymmetric aging. In this regard, FIG. 19 shows an exemplary system 1905 in which asymmetric aging is mitigated by alternately parking the input of the signal path 220 low and high over multiple idle periods, as discussed further below.

The system 1905 includes the clock gating circuit 210, the park high circuit 310, and the signal path 220 discussed above. In this example, the park high circuit 310 may be implemented with a park-high gating circuit (e.g., park-high gating circuit 505), a multiplexer, or another type of circuit.

The system 1905 also includes a multiplexer 1920, and a control circuit 1910. The multiplexer 1920 has a first input 1922, a second input 1924, a select input 1926, and an output 1928. In this example, the signal input 312 of the park high circuit 310 is coupled to the output 216 of the clock gating circuit 210, and the output 314 of the park high circuit 310 is coupled to the first input 1922 of the multiplexer 1920. The second input 1924 of the multiplexer 1920 is coupled to the output 216 of the clock gating circuit 210, and the output 1928 of the multiplexer 1920 is coupled to the input 222 of the signal path 220. The output 224 of the signal path 220 may be coupled to the circuit 650. As discussed above, the circuit 650 may include a processor, logic gates, registers, retention flops, a memory, sequential logic, or any combination thereof.

The control circuit 1910 has an input 1912, a first output 1914, a second output 1916, and a third output 1918. The input 1912 may be configured to receive a signal indicating when the circuit 650 is in the idle mode. The signal may come from a controller (not shown) configured to manage a power state of the circuit 650. The first output 1914 is coupled to the control input 212 of the clock gating circuit 210, the second output 1916 is coupled to the park high circuit 310, and the third output 1918 is coupled to the select input 1926 of the multiplexer 1920.

The control circuit 1910 may be configured to gate the clock gating circuit 210 in the idle mode (e.g., when the signal at the input 1912 indicates idle mode). The control circuit 1910 may gate the clock gating circuit 210 by outputting a logic value at the first output 1914 that causes the clock gating circuit 210 to gate. When gated, the clock gating circuit 210 parks the output 216 low in this example. The control circuit 1910 may also be configured to un-gate the clock gating circuit 210 in the active mode (e.g., when the signal at the input 1912 does not indicate idle mode). The control circuit 1910 may un-gate the clock gating circuit 210 by outputting a logic value at the first output 1914 that causes the clock gating circuit 210 to un-gate.

The control circuit 1910 may be configured to park the output 314 of the park high circuit 310 high in the idle mode (e.g., when the signal at the input 1912 indicates idle mode). The control circuit 1910 may park the output 314 of the park high circuit 310 high by outputting a logic value at the second output 1916 that causes the park high circuit 310 to park high. The control circuit 1910 may also be configured to un-gate the park high circuit 310 in the active mode (e.g., when the signal at the input 1912 does not indicate idle mode). The control circuit 1910 may un-gate the park high circuit 310 by outputting a logic value at the second output 1916 that causes the park high circuit 310 to park high.

Figure 20:
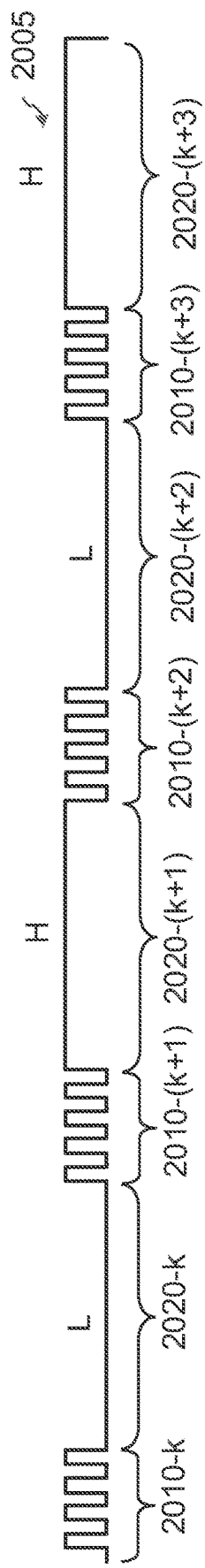
FIG. 20 is a timing diagram illustrating a logic state at an input of a signal path over multiple active periods and multiple idle periods according to certain aspects of the present disclosure.

In operation, the control circuit 1910 may be configured to alternately park the input 222 of the signal path 220 low and high using the multiplexer 1920 to mitigate asymmetric aging in the signal path 220. In this regard, FIG. 20 is a timing diagram illustrating an example in which the control circuit 1910 alternately parks the input 222 of the signal path 220 low and high over multiple idle periods (also referred to as idle windows) using the multiplexer 1920. FIG. 20 shows the logic value 2005 (i.e., logic state) at the input 222 of the signal path 220 over multiple active periods 2010-$k$ to 2020-($k$+3) and multiple idle periods 2020-$k$ to 2020-($k$+3). Note that the timing diagram begins at the kth active period 2010-$k$ in this example.

In the example shown in FIG. 20, the control circuit 1910 alternately parks the input 222 of the signal path 220 low and high over the idle periods 2020-$k$ to 320-($k$+3) to balance the aging of the transistors in the signal path 220. The control circuit 1910 may park the input 222 of the signal path 220 low by instructing the multiplexer 1920 to select the second input 1924 (which is coupled to the output 216 of clock gating circuit 210) and park the input 222 of the signal path 220 high by instructing the multiplexer 1920 to select the first input 1922 (which is coupled to the output 314 of the park high circuit 310). In one example, the control circuit 1910 instructs the multiplexer 1920 to select the first input 1922 by outputting a logic value via the third output 1918 that causes the multiplexer 1920 to select the first input 1922 and instructs the multiplexer 1920 to select the second input 1924 by outputting a logic value via the third output 1918 that causes the multiplexer 1920 to select the second input 1924.

In the example illustrated in FIG. 20, the control circuit 1910 parks the input 222 of the signal path 220 low during idle periods 2020-$k$ and 2020-($k$+2) and parks the input 222 of the signal path 220 high during idle periods 2020-($k$+1) and 2020-($k$+3). The idle periods 2020-$k$ and 2020-($k$+2) may be even idle periods and the idle periods 2020-($k$+1) and 2020-($k$+3) may be odd idle periods, or vice versa.

Assuming the accumulative duration of the idle periods in which the input 222 of the signal path 220 is parked low is approximately equal to the accumulative duration of the idle periods in which the input 222 of the signal path 220 is parked high over time, the control circuit 1910 parks the input 222 of the signal path 220 low and high for approximately equal durations in the idle mode over time. This helps balance the aging of the transistors in the signal path 220, thereby reducing duty-cycle distortion in the signal path 220 caused by asymmetric aging.

In the example in FIG. 19, the logic state at the output 224 of the signal path 220 toggles between high and low over multiple idle periods. This because the control circuit 1910 alternately parks the input 222 of the signal path 220 low and high to balance aging. In some cases, it is desirable for the clock input of the circuit 650 to be low (i.e., zero) in the idle mode. In these cases, a park low circuit 2110 may be inserted between the output 224 of the signal path 220 and the circuit 650 to isolate the circuit 650 from the toggling between low and high at the output 224 of the signal path 220 in the idle mode, an example of which is shown in FIG. 21.

Figure 21:
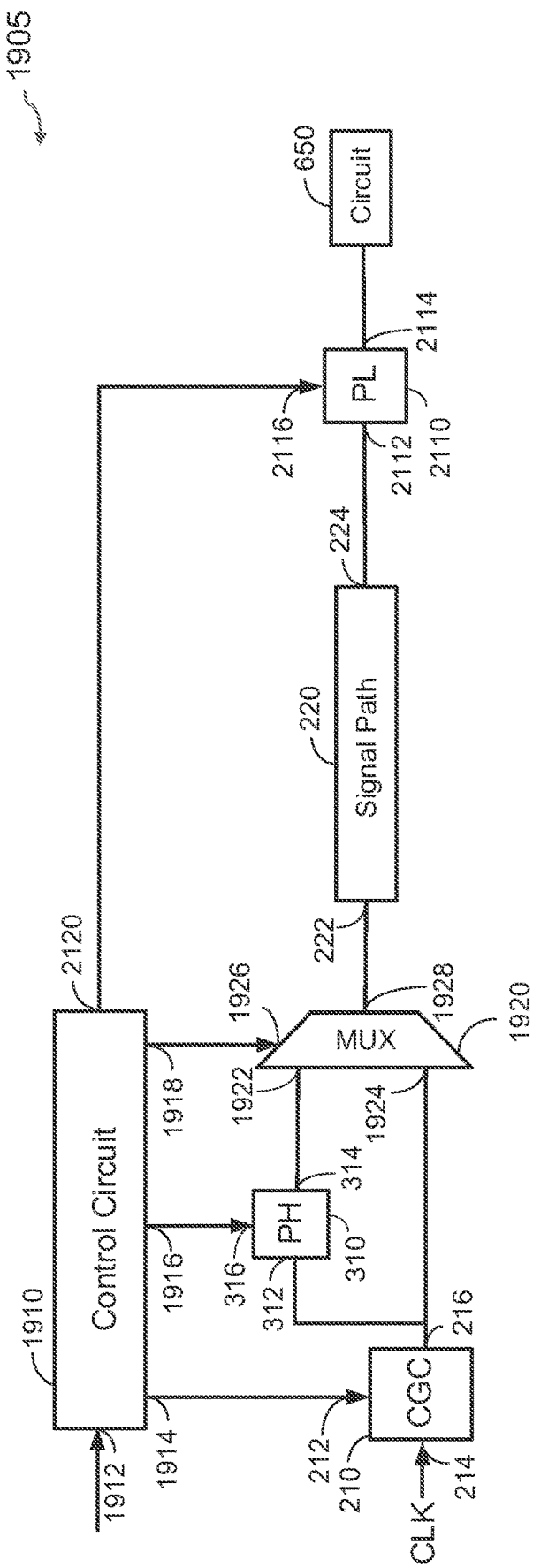
FIG. 21 shows an example of a park low circuit coupled between an output of a signal path and a circuit according to certain aspects of the present disclosure.

In the example shown in FIG. 21, the park low circuit 2110 has an input 2112 coupled to the output 224 of the signal path 220, an output 2114 coupled to the circuit 650, and a control input 2116 coupled to a fourth output 2120 of the control circuit 1910. The park low circuit 2110 may be implemented with any one of the exemplary implementations for a park low circuit discussed above.

In this example, the control circuit 1910 may be configured to un-gate the park low circuit 2110 in the active mode and park the output 2114 of the park low circuit 2110 low in the idle mode to isolate the circuit 650 from the toggling between low and high at the output 224 of the signal path 220 in the idle mode. For example, the control circuit 1910 may un-gate the park low circuit 2110 by outputting a logic value at the fourth output 2120 that causes the park low circuit 2110 to un-gate and park the output 2114 of the park low circuit 2110 low by outputting a logic value at the fourth output 2120 that causes the park low circuit 2110 to park low. In one example, the park low circuit 2110 is configured to un-gate when the logic value at the control input 2116 has a first logic value and park the output 2114 low when the logic value at the control input 2116 has a second logic value. In this example, the control circuit 1910 may un-gate the park low circuit 2110 by outputting the first logic value at the fourth output 2120 and park the output 2114 of the park low circuit 2110 low by outputting the second logic value at the fourth output 2120. The first logic value may be one and the second logic value may be zero, or vice versa.

Figure 22:
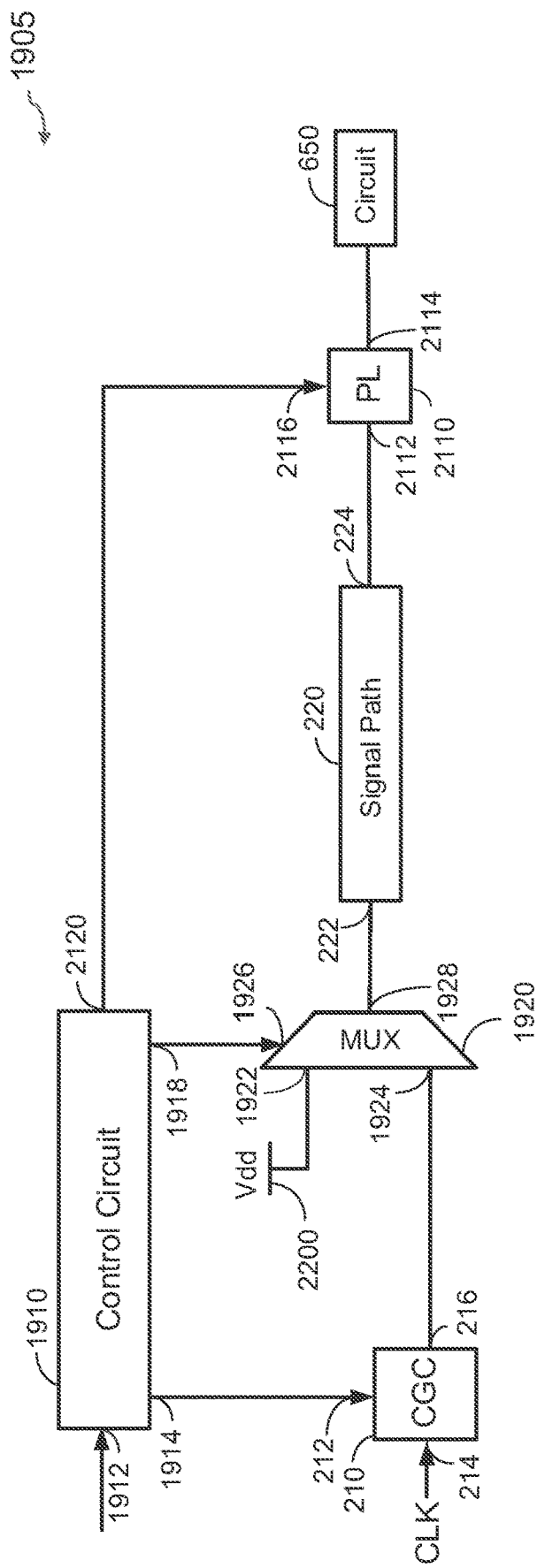
FIG. 22 shows another example of a system including a multiplexer for alternating an input of a signal path between low and high over multiple idle periods according to certain aspects of the present disclosure.

FIG. 22 shows an example of the system 1905 in which the park high circuit 310 is omitted and the first input 1922 of the multiplexer 1920 is configured to receive a logic one. In the example shown in FIG. 22, the first input 1922 receives the logic one by coupling the first input 1922 to a supply rail Vdd 2200.

In this example, the control circuit 1910 is configured to instruct the multiplexer 1920 to select the second input 1924 in the active mode in order to pass the clock signal from the clock gating circuit 210 to the signal path 220 in the active mode. In the idle mode, the control circuit 1910 is configured to instruct the multiplexer 1920 to alternately select the first input 1922 and the second input 1924 over multiple idle periods in order to alternately park the input 222 of the signal path 220 between high and low over the multiple idle periods. For example, the control circuit 1910 may instruct the multiplexer 1920 to select the second input 1924 during idle periods 2020-$k$ and 2020-($k$+2) to park low during idle periods 2020-$k$ and 2020-($k$+2) and select the first input 1922 during idle periods 2020-($k$+1) and 2020-($k$+3) to park high during idle periods 2020-($k$+1) and 2020-($k$+3). In this example, the output 216 of the clock gating circuit 210 is parked low in the idle mode.

Figure 23:
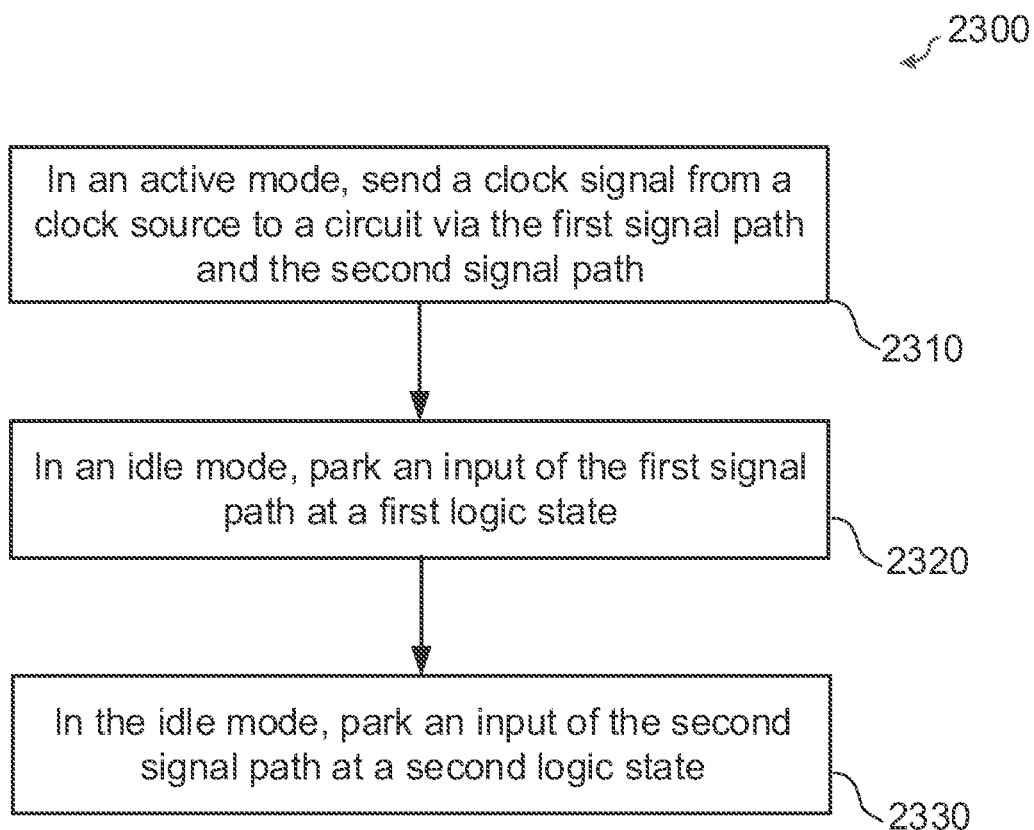
FIG. 23 is a flowchart illustrating a method for mitigating duty-cycle distortion according to certain aspects of the present disclosure.

FIG. 23 illustrates a method 2300 for mitigating duty-cycle distortion in a system according to certain aspects. The system includes a first signal path (e.g., the first signal path 320) and a second signal path (e.g., the second signal path 340).

At block 2310, in an active mode, a clock signal is sent from a clock source to a circuit via the first signal path and the second signal path. The clock source may correspond to the clock source 690 and the circuit may correspond to the circuit 650. The circuit may include at least one of a memory device (e.g., memory device 1850), retention flops (e.g., retention flops 1852), or a processor (e.g., processor 1854). The clock signal may be sent from the clock source to the circuit via the first signal path and the second signal path by the first park circuit 1810, the second park circuit 1820, and/or the control circuit 610.

At block 2320, in an idle mode, an input of the first signal path is parked at a first logic state (i.e., value). The first logic state may be high (i.e., logic one) or low (i.e., logic zero). The input of the first signal path may be parked at the first logic state by the first park circuit 1810 and/or the control circuit 610.

At block 2330, in the idle mode, an input of the second signal path is parked at a second logic state (i.e., value). The second logic state may be high (i.e., logic one) or low (i.e., logic zero). The input of the second signal path may be parked at the second logic state by the second park circuit 1820 and/or the control circuit 610.

In certain aspects, the second logic state is an inverse (i.e., opposite) of a logic state at an output of the first signal path (e.g., output 324 of the first signal path 320).

The method 2300 may also include, in the active mode, coupling an output of the first signal path to the input of the second signal path. For example, the output of the first signal path may be coupled to the input of the second signal path by un-gating the second park circuit 1820.

The method 2300 may also include, in the active mode, coupling the input of the first signal path to the clock source and coupling an output of the second signal path to the circuit. For example, the input of the first signal path may be coupled to the clock source by un-gating the first park circuit 1810.

In certain aspects, the first signal path includes a first plurality of delay buffers (e.g., delay buffers 230-1 to 230-n) coupled in series, and the second signal path includes a second plurality of delay buffers (e.g., 250-1 to 250-m) coupled in series.

In certain aspects, a number of delay buffers in the first plurality of delay buffers is odd. In these aspects, the first logic state may be high and the second logic state may be high.

In certain aspects, a number of delay buffers in the first plurality of delay buffers is even. In these aspects, the first logic state may be high and the second logic state may be low, or the first logic state may be high and the second logic state may be low.

Implementation examples are described in the following numbered clauses:

1. A system, comprising:
    a first park circuit having a signal input, an output, and a control input;
    a first signal path having an input and an output, wherein the input of the first signal path is coupled to the output of the first park circuit;
    a second park circuit having a signal input, an output, and a control input, wherein the signal input of the second park circuit is coupled to the output of the first signal path; and
    a second signal path having an input and an output, wherein the input of the second signal path is coupled to the output of the second park circuit.
2. The system of clause 1, wherein the second park circuit is configured to:
    receive a control signal at the control input of the second park circuit;
    couple the signal input of the second park circuit to the output of the second park circuit if the control signal has a first value; and
    park the output of the second park circuit at a logic value that is an inverse of a logic value at the output of the first signal path if the control signal has the second value.
3. The system of clause 2, wherein the first value includes a first logic value, the second value includes a second logic value, and the second logic value is an inverse of the first logic value.
4. The system of any one of clauses 1 to 3, wherein:
    the first park circuit is a park high circuit; and
    the second park circuit is a park low circuit.
5. The system of clause 4, further comprising:
    a clock gating circuit having a clock input, a control input, and an output, wherein the output of the clock gating circuit is coupled to the signal input of the first park circuit; and
    a control circuit having a first input and a plurality of outputs, wherein the plurality of outputs is coupled to the control input of the clock gating circuit, the control input of the first park circuit, and the control input of the second park circuit.
6. The system of clause 5, wherein the control circuit is configured to:
    receive a clock gating signal at the first input of the control circuit;
    in response to the clock gating signal, cause the second park circuit to park the output of the second park circuit low via a first one of the plurality of outputs;
    after the output of the second park circuit is parked low, cause the first park circuit to park the output of the first park circuit high via a second one of the plurality of outputs; and
    cause the clock gating circuit to gate a clock signal via a third one of the plurality of outputs.
7. The system of clause 6, wherein:
    the second park circuit has a status output;
    the control circuit has a second input coupled to the status output;
    the second park circuit is configured to output a park-low status signal via the status output when the output of the second park circuit is parked low; and
    the control circuit is configured to:
    receive the park-low status signal via the second input; and
    in response to the park-low status signal, cause the first park circuit to park the output of the first park circuit high via the second one of the plurality of outputs.
8. The system of clause 5, wherein the control circuit is configured to:
    receive a clock gating signal at the first input of the control circuit;
    in response to the clock gating signal, cause the clock gating circuit to gate a clock signal via a first one of the plurality of outputs;
    after the clock gating circuit gates the clock signal, cause the second park circuit to park the output of the second park circuit low via a second one of the plurality of outputs; and
    after the output of the second park circuit is parked low, cause the first park circuit to park the output of the first park circuit high via a third one of the plurality of outputs.
9. The system of clause 8, wherein:
    the second park circuit has a status output;
    the control circuit has a second input coupled to the status output;

the second park circuit is configured to output a park-low status signal via the status output when the output of the second park circuit is parked low; and the control circuit is configured to:
receive the park-low status signal via the second input; and in response to the park-low status signal, cause the first park circuit to park the output of the first park circuit high via the third one of the plurality of outputs.

10. The system of any one of clauses 5 to 9, wherein the control circuit is configured to:
receive a clock enable signal at the first input of the control circuit;
in response to the clock enable signal, cause the first park circuit to un-gate via a first one of the plurality of outputs;
after the first park circuit is un-gated, cause the second park circuit to un-gate via a second one of the plurality of outputs; and
after the second park circuit is un-gated, cause the clock gating circuit to un-gate via a third one of the plurality of outputs.

11. The system of any one of clauses 5 to 9, wherein the control circuit is configured to:
receive a clock enable signal at the input of the control circuit;
in response to the clock enable signal, cause the first park circuit to un-gate via a first one of the plurality of outputs;
after the first park circuit is un-gated, cause the clock gating circuit to un-gate via a second one of the plurality of outputs; and
cause the second park circuit to un-gate via a third one of the plurality of outputs.

12. The system of any one of clauses 5 to 11, wherein the clock input of the clock gating circuit is coupled to a clock source.

13. The system of clause 12, wherein the clock source comprises a phase locked loop.

14. The system of any one of clauses 4 to 13, wherein the first park circuit comprises:
a multiplexer having a first input, a second input, a select input, and an output, wherein the first input is coupled to the signal input of the first park circuit, the second input is configured to receive a logic one, the select input is coupled to the control input of the first park circuit, and the output of the multiplexer is coupled to the output of the first park circuit.

15. The system of any one of clauses 4 to 14, wherein the second park circuit comprises:
a multiplexer having a first input, a second input, a select input, and an output, wherein the first input is coupled to the signal input of the second park circuit, the second input is configured to receive a logic zero, the select input is coupled to the control input of the second park circuit, and the output of the multiplexer is coupled to the output of the second park circuit.

16. The system of any one of clauses 1 to 13, wherein the first park circuit comprises:
a logic gate having a first input, a second input, and an output, wherein the first input of the logic gate is coupled to the control input of the first park circuit, the second input of the logic gate is coupled to the signal input of the first park circuit, and the output of the logic gate is coupled to the output of the first park circuit.

17. The system of clause 16, wherein the logic gate comprises an OR gate or a NAND gate.

18. The system of clause 16, wherein the first park circuit further comprises:
a latch having a control input, a timing input, and an output, wherein the control input of the latch is coupled to the control input of the first park circuit, the timing input of the latch is coupled to the signal input of the first park circuit, and the output of the latch is coupled to the first input of the logic gate.

19. The system of any one of clauses 1 to 13, 15, and 16, wherein the second park circuit comprises:
a logic gate having a first input, a second input, and an output, wherein the first input of the logic gate is coupled to the control input of the second park circuit, the second input of the logic gate is coupled to the signal input of the second park circuit, and the output of the logic gate is coupled to the output of the second park circuit.

20. The system of clause 19, wherein the logic gate comprises an AND gate or a NOR gate.

21. The system of clause 19, wherein the second park circuit further comprises:
a latch having a control input, a timing input, and an output, wherein the control input of the latch is coupled to the control input of the second park circuit, the timing input of the latch is coupled to the signal input of the second park circuit, and the output of the latch is coupled to the first input of the logic gate.

22. The system of any one of clauses 1 to 21, wherein the output of the second signal path is coupled to at least one of a memory device, a plurality of retention flops, and a processor.

23. The system of any one of clauses 1 to 21, further comprising a park low circuit having a signal input, a control input, and an output, wherein the signal input of the park low circuit is coupled to the output of the second signal path, and the output of the park low circuit is coupled to at least one of a memory device, a plurality of retention flops, and a processor.

24. The system of any one of clauses 1 to 23, wherein:
the first signal path comprises a first plurality of delay buffers coupled in series; and
the second signal path comprises a second plurality of delay buffers coupled in series.

25. The system of clause 24, wherein a number of delay buffers in the first plurality of delay buffers is odd.

26. The system of clause 25, wherein:
the first park circuit is a first park high circuit; and
the second park circuit is a second park high circuit.

27. The system of clause 24, wherein a number of delay buffers in the first plurality of delay buffers is even.

28. The system of clause 27, wherein:
the first park circuit is a park high circuit; and
the second park circuit is a park low circuit.

29. The system of clause 27, wherein:
the first park circuit is a park low circuit; and
the second park circuit is a park high circuit.

30. A method for mitigating duty-cycle distortion in a system, the system including a first signal path and a second signal path, the method comprising:
in an active mode, sending a clock signal from a clock source to a circuit via the first signal path and the second signal path; and
in an idle mode,
parking an input of the first signal path at a first logic state; and
parking an input of the second signal path at a second logic state.

31. The method of clause 30, wherein the second logic state is an inverse of a logic state at an output of the first signal path.

32. The method of clause 30 or 31, further comprising:
in the active mode, coupling an output of the first signal path to the input of the second signal path.

33. The method of clause 32, further comprising:
in the active mode, coupling the input of the first signal path to the clock source and coupling an output of the second signal path to the circuit.

34. The method of any one of clauses 30 to 33, wherein:
the first signal path comprises a first plurality of delay buffers coupled in series; and
the second signal path comprises a second plurality of delay buffers coupled in series.

35. The method of clause 34, wherein a number of delay buffers in the first plurality of delay buffers is odd.

36. The method of clause 35, wherein:
the first logic state is high; and
the second logic state is high.

37. The method of clause 34, wherein a number of delay buffers in the first plurality of delay buffers is even.

38. The method of clause 37, wherein:
the first logic state is high; and
the second logic state is low.

39. The method of clause 37, wherein:
the first logic state is low; and
the second logic state is high.

It is to be appreciated that the present disclosure is not limited to the exemplary terminology used above to describe aspects of the present disclosure. For example, delay buffers (e.g., delay buffers 230-1 to 230-$n$ or 250-1 to 250-$m$) coupled in series may also be referred to as a delay line, a delay chain, a delay buffer chain, or another term. In another example, an aging path may also be referred to as an aging pattern, a propagation path, a stress pattern, a stress path, or another term.

The control circuit 610 and 1910 may each be implemented with a general-purpose processor, a digital signal processor (DSP), an application specific integrated circuit (ASIC), a field programmable gate array (FPGA) or other programmable logic device, discrete hardware components (e.g., logic gates), a state machine, or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a first park circuit having a signal input, an output, and a control input, wherein the first park circuit is configured to couple the signal input of the first park circuit to the output of the first park circuit or to park the output of the first park circuit at a first logic value in response to a first control signal;
a first signal path having an input and an output, wherein the input of the first signal path is coupled to the output of the first park circuit;
a second park circuit having a signal input, an output, and a control input, wherein the signal input of the second park circuit is coupled to the output of the first signal path, wherein the second park circuit is configured to couple the signal input of the second park circuit to the output of the second park circuit or to park the output of the second park circuit at a second logic value in response to a second control signal; and
a second signal path having an input and an output, wherein the input of the second signal path is coupled to the output of the second park circuit.

2. The system of claim 1, wherein the second park circuit is configured to:
receive the second control signal at the control input of the second park circuit;
couple the signal input of the second park circuit to the output of the second park circuit if the second control signal has a first value; and
park the output of the second park circuit at a logic value that is an inverse of a logic value at the output of the first signal path if the second control signal has the second value.

3. The system of claim 2, wherein the first value includes a first logic value, the second value includes a second logic value, and the second logic value is an inverse of the first logic value.

4. The system of claim 1, wherein:
the first park circuit is a park high circuit; and
the second park circuit is a park low circuit.

5. The system of claim 4, further comprising:
a clock gating circuit having a clock input, a control input, and an output, wherein the output of the clock gating circuit is coupled to the signal input of the first park circuit; and
a control circuit having a first input and a plurality of outputs, wherein the plurality of outputs is coupled to the control input of the clock gating circuit, the control input of the first park circuit, and the control input of the second park circuit.

6. The system of claim 5, wherein the control circuit is configured to:
receive a clock gating signal at the first input of the control circuit;
in response to the clock gating signal, cause the second park circuit to park the output of the second park circuit low via a first one of the plurality of outputs;
after the output of the second park circuit is parked low, cause the first park circuit to park the output of the first park circuit high via a second one of the plurality of outputs; and
cause the clock gating circuit to gate a clock signal via a third one of the plurality of outputs.

7. The system of claim 6, wherein:
the second park circuit has a status output;
the control circuit has a second input coupled to the status output;
the second park circuit is configured to output a park-low status signal via the status output when the output of the second park circuit is parked low; and
the control circuit is configured to:
receive the park-low status signal via the second input; and
in response to the park-low status signal, cause the first park circuit to park the output of the first park circuit high via the second one of the plurality of outputs.

8. The system of claim 5, wherein the control circuit is configured to:
receive a clock gating signal at the first input of the control circuit;
in response to the clock gating signal, cause the clock gating circuit to gate a clock signal via a first one of the plurality of outputs;
after the clock gating circuit gates the clock signal, cause the second park circuit to park the output of the second park circuit low via a second one of the plurality of outputs; and
after the output of the second park circuit is parked low, cause the first park circuit to park the output of the first park circuit high via a third one of the plurality of outputs.

9. The system of claim 8, wherein:
the second park circuit has a status output;
the control circuit has a second input coupled to the status output;
the second park circuit is configured to output a park-low status signal via the status output when the output of the second park circuit is parked low; and
the control circuit is configured to:
receive the park-low status signal via the second input; and
in response to the park-low status signal, cause the first park circuit to park the output of the first park circuit high via the third one of the plurality of outputs.

10. The system of claim 5, wherein the control circuit is configured to:
receive a clock enable signal at the first input of the control circuit;
in response to the clock enable signal, cause the first park circuit to un-gate via a first one of the plurality of outputs;
after the first park circuit is un-gated, cause the second park circuit to un-gate via a second one of the plurality of outputs; and
after the second park circuit is un-gated, cause the clock gating circuit to un-gate via a third one of the plurality of outputs.

11. The system of claim 5, wherein the control circuit is configured to:
receive a clock enable signal at the input of the control circuit;
in response to the clock enable signal, cause the first park circuit to un-gate via a first one of the plurality of outputs;
after the first park circuit is un-gated, cause the clock gating circuit to un-gate via a second one of the plurality of outputs; and
cause the second park circuit to un-gate via a third one of the plurality of outputs.

12. The system of claim 5, wherein the clock input of the clock gating circuit is coupled to a clock source.

13. The system of claim 12, wherein the clock source comprises a phase locked loop.

14. The system of claim 4, wherein the first park circuit comprises:
a multiplexer having a first input, a second input, a select input, and an output, wherein the first input is coupled to the signal input of the first park circuit, the second input is configured to receive a logic one, the select input is coupled to the control input of the first park circuit, and the output of the multiplexer is coupled to the output of the first park circuit.

15. The system of claim 4, wherein the second park circuit comprises:
a multiplexer having a first input, a second input, a select input, and an output, wherein the first input is coupled to the signal input of the second park circuit, the second input is configured to receive a logic zero, the select input is coupled to the control input of the second park circuit, and the output of the multiplexer is coupled to the output of the second park circuit.

16. The system of claim 1, wherein the first park circuit comprises:
a logic gate having a first input, a second input, and an output, wherein the first input of the logic gate is coupled to the control input of the first park circuit, the second input of the logic gate is coupled to the signal input of the first park circuit, and the output of the logic gate is coupled to the output of the first park circuit.

17. The system of claim 16, wherein the logic gate comprises an OR gate or a NAND gate.

18. The system of claim 16, wherein the first park circuit further comprises:
a latch having a control input, a timing input, and an output, wherein the control input of the latch is coupled to the control input of the first park circuit, the timing input of the latch is coupled to the signal input of the first park circuit, and the output of the latch is coupled to the first input of the logic gate.

19. The system of claim 1, wherein the second park circuit comprises:
a logic gate having a first input, a second input, and an output, wherein the first input of the logic gate is coupled to the control input of the second park circuit, the second input of the logic gate is coupled to the signal input of the second park circuit, and the output of the logic gate is coupled to the output of the second park circuit.

20. The system of claim 19, wherein the logic gate comprises an AND gate or a NOR gate.

21. The system of claim 19, wherein the second park circuit further comprises:
a latch having a control input, a timing input, and an output, wherein the control input of the latch is coupled to the control input of the second park circuit, the timing input of the latch is coupled to the signal input of the second park circuit, and the output of the latch is coupled to the first input of the logic gate.

22. The system of claim 1, wherein the output of the second signal path is coupled to at least one of a memory device, a plurality of retention flops, and a processor.

23. The system of claim 1, further comprising a park low circuit having a signal input, a control input, and an output, wherein the signal input of the park low circuit is coupled to the output of the second signal path, and the output of the park low circuit is coupled to at least one of a memory device, a plurality of retention flops, and a processor.

24. The system of claim 1, wherein:
the first signal path comprises a first plurality of delay buffers coupled in series; and
the second signal path comprises a second plurality of delay buffers coupled in series.

25. The system of claim 24, wherein a number of delay buffers in the first plurality of delay buffers is odd.

26. The system of claim 25, wherein:
the first park circuit is a first park high circuit; and
the second park circuit is a second park high circuit.

27. The system of claim 24, wherein a number of delay buffers in the first plurality of delay buffers is even.

28. The system of claim 27, wherein:
the first park circuit is a park high circuit; and
the second park circuit is a park low circuit.

29. The system of claim 27, wherein:
the first park circuit is a park low circuit; and
the second park circuit is a park high circuit.

30. A method for mitigating duty-cycle distortion in a system, the system including a first signal path and a second signal path, the method comprising:
in an active mode, sending a clock signal from a clock source to a circuit via the first signal path and the second signal path; and
in an idle mode,
parking an input of the first signal path at a first logic state; and
parking an input of the second signal path at a second logic state.

31. The method of claim 30, wherein the second logic state is an inverse of a logic state at an output of the first signal path.

32. The method of claim 30, further comprising:
in the active mode, coupling an output of the first signal path to the input of the second signal path.

33. The method of claim 32, further comprising:
in the active mode, coupling the input of the first signal path to the clock source and coupling an output of the second signal path to the circuit.

34. The method of claim 30, wherein:
the first signal path comprises a first plurality of delay buffers coupled in series; and
the second signal path comprises a second plurality of delay buffers coupled in series.

35. The method of claim 34, wherein a number of delay buffers in the first plurality of delay buffers is odd.

36. The method of claim 35, wherein:
the first logic state is high; and
the second logic state is high.

37. The method of claim 34, wherein a number of delay buffers in the first plurality of delay buffers is even.

38. The method of claim 37, wherein:
the first logic state is high; and
the second logic state is low.

39. The method of claim 37, wherein:
the first logic state is low; and
the second logic state is high.

* * * * *